US011686688B2

(12) United States Patent
Asano et al.

(10) Patent No.: US 11,686,688 B2
(45) Date of Patent: Jun. 27, 2023

(54) INSPECTION APPARATUS AND MANUFACTURING METHOD FOR SEMICONDUCTOR DEVICE

(71) Applicant: CANON KABUSHIKI KAISHA, Tokyo (JP)

(72) Inventors: Kosuke Asano, Kanagawa (JP); Hideki Ina, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/131,841

(22) Filed: Dec. 23, 2020

(65) Prior Publication Data

US 2021/0199596 A1 Jul. 1, 2021

(30) Foreign Application Priority Data

Dec. 27, 2019 (JP) .................. 2019-238518

(51) Int. Cl.
G01N 21/95 (2006.01)
G01N 21/956 (2006.01)
G01N 21/88 (2006.01)

(52) U.S. Cl.
CPC ....... *G01N 21/9501* (2013.01); *G01N 21/956* (2013.01); *G01N 2021/888* (2013.01)

(58) Field of Classification Search
CPC ............. G01N 21/9501; G01N 21/956; G01N 2021/888; G03F 7/70633; H01L 22/12
See application file for complete search history.

(56) References Cited

U.S. PATENT DOCUMENTS

| 4,843,563 A | 6/1989 | Takahashi |
| 5,313,115 A | 5/1994 | Matsuno |
| 6,965,435 B2 | 11/2005 | Ina |
| 7,190,455 B2 | 3/2007 | Matsumoto |
| 7,704,652 B2 | 4/2010 | Hatai |
| 8,885,164 B2 * | 11/2014 | Hayashi ................. G01B 11/14 356/399 |
| 9,530,664 B2 | 12/2016 | Kitamura et al. |
| 10,191,390 B2 * | 1/2019 | Aben ..................... G03F 9/708 |
| 10,217,785 B2 | 2/2019 | Izuhara |

(Continued)

FOREIGN PATENT DOCUMENTS

| JP | S61-219134 A | 9/1986 |
| JP | 2004-153115 A | 5/2004 |

(Continued)

*Primary Examiner* — Hung V Nguyen
(74) *Attorney, Agent, or Firm* — Venable LLP

(57) ABSTRACT

An inspection apparatus inspecting a wafer on which a plurality of patterns are formed by a plurality of exposure shots, the inspection apparatus comprising: acquisition unit configured to acquire first information representing a positional relation between an inspection mark included in a pattern formed by a first exposure shot and an inspection mark included in a pattern formed by a second exposure shot, and second information representing a positional relation between the inspection mark included in the pattern formed by the second exposure shot and an inspection mark included in a pattern formed by a third exposure shot; and derivation unit configured to derive a linear component of an error caused by a reticle, and a linear component of an error caused by a position of a wafer, on the basis of the first information and the second information.

10 Claims, 40 Drawing Sheets

(56) References Cited

U.S. PATENT DOCUMENTS

| | | |
|---|---|---|
| 10,811,454 B2 | 10/2020 | Izuhara |
| 2004/0150824 A1 | 8/2004 | Matsumoto |
| 2007/0064211 A1 | 3/2007 | Hatai |
| 2007/0081161 A1* | 4/2007 | Matsumoto ............ G03F 9/7046 356/401 |
| 2014/0370710 A1 | 12/2014 | Kitamura et al. |
| 2015/0074621 A1* | 3/2015 | Endo ..................... G03F 9/7046 716/54 |
| 2017/0040371 A1 | 2/2017 | Izuhara |
| 2019/0189666 A1 | 6/2019 | Izuhara |
| 2020/0403020 A1 | 12/2020 | Izuhara |

FOREIGN PATENT DOCUMENTS

| | | |
|---|---|---|
| JP | 2004-228327 A | 8/2004 |
| JP | 2007-067018 A | 3/2007 |
| JP | 2007-129056 A | 5/2007 |
| JP | 2015-002193 A | 1/2015 |
| JP | 2015-216334 A | 12/2015 |

* cited by examiner

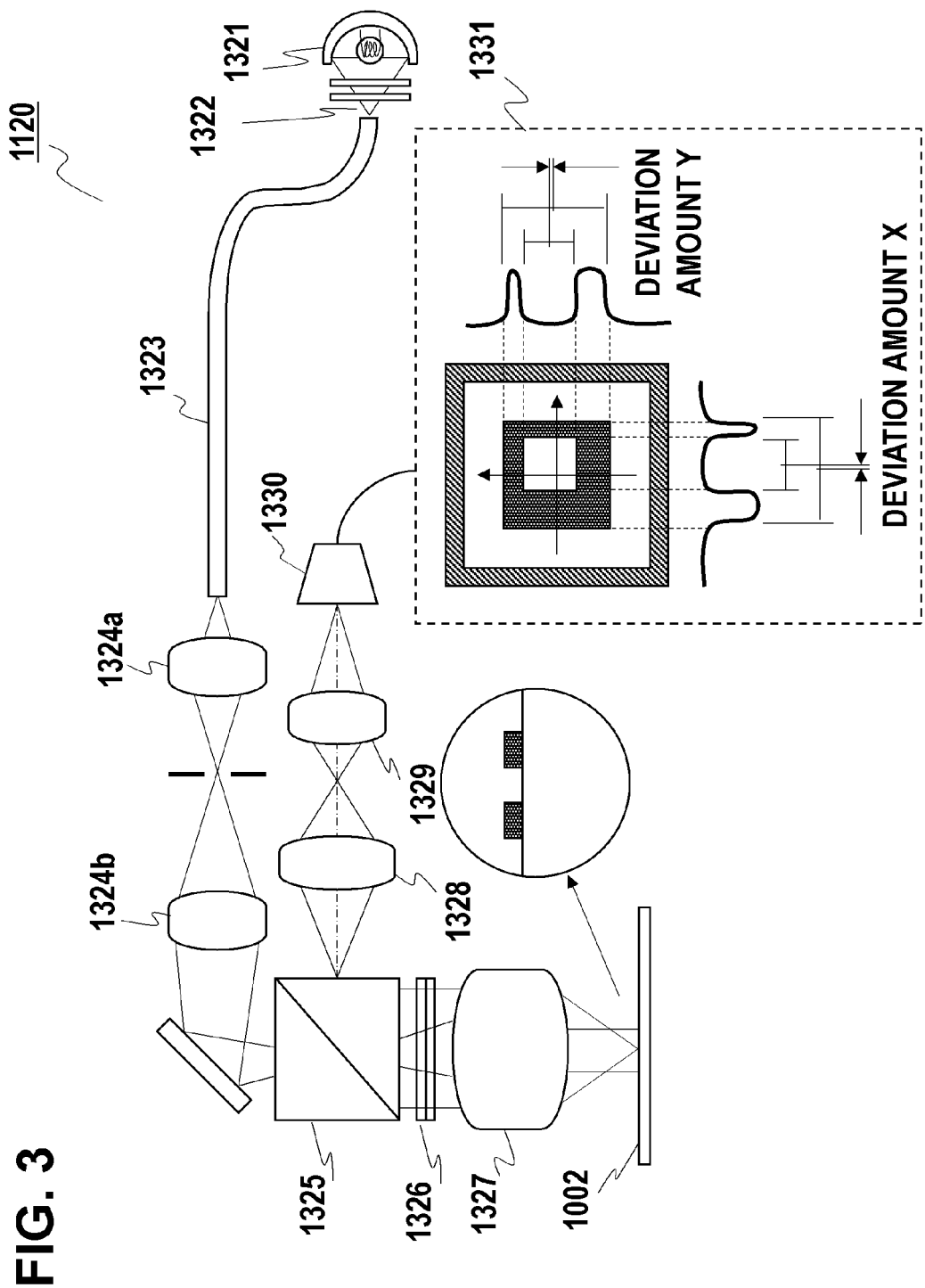

FIG. 6A  SCX
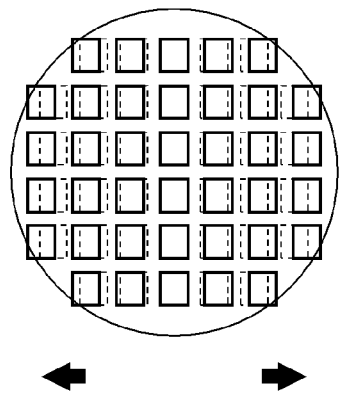
FIG. 6B  SCY
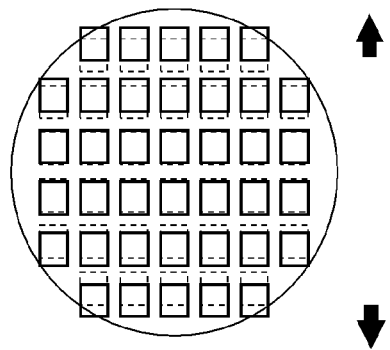
FIG. 6C  WROT
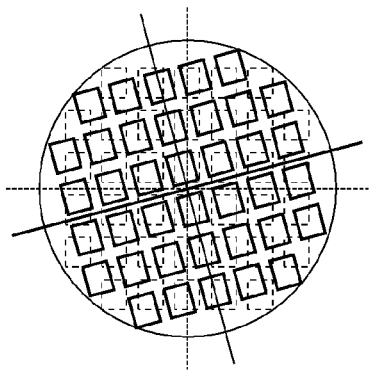
FIG. 6D  ORTH
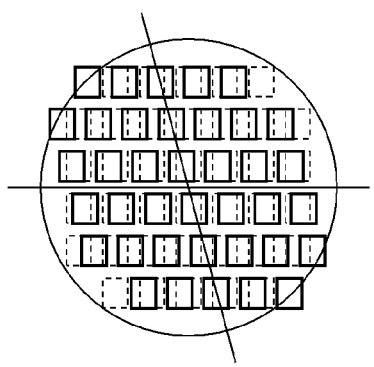
FIG. 6E  WROTX
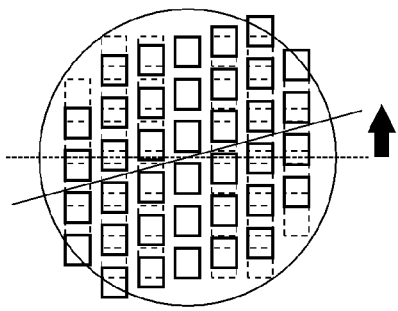
FIG. 6F  WROTY
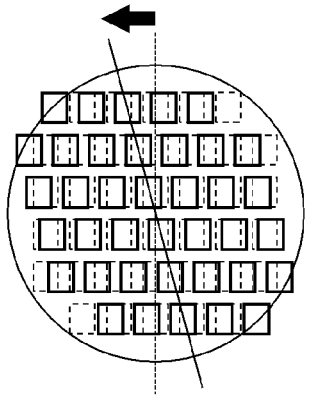

FIG. 7A
MAG
FIG. 7B
MAGX
FIG. 7C
MAGY
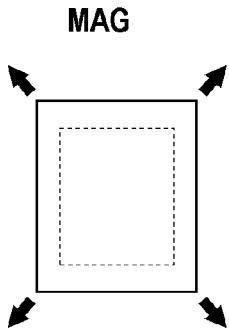
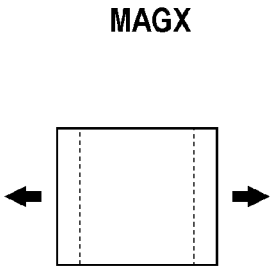
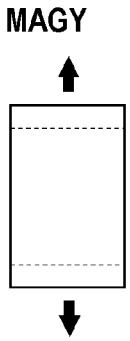
FIG. 7D
SROT
FIG. 7E
SKEW
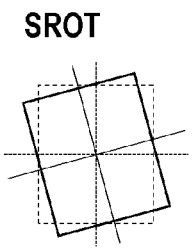
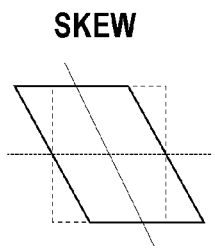
FIG. 7F
SROTX
FIG. 7G
SROTY
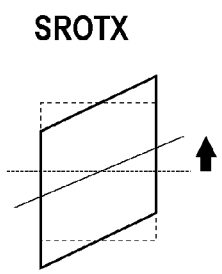
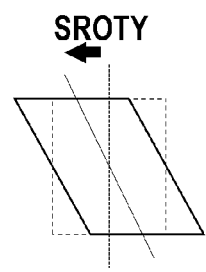
FIG. 7H
OFSX, OFSY
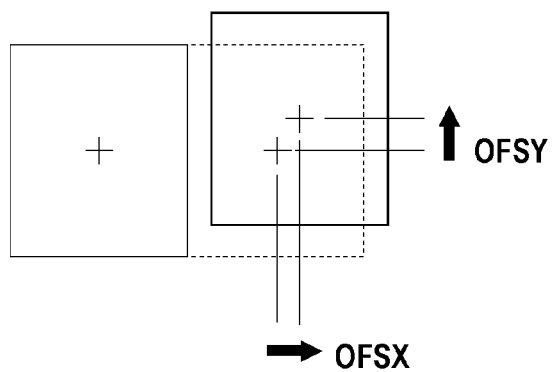

MARKS ARRANGED AT POSITIONS 2011 THROUGH 2014

MARKS ARRANGED AT POSITIONS 2015 THROUGH 2018

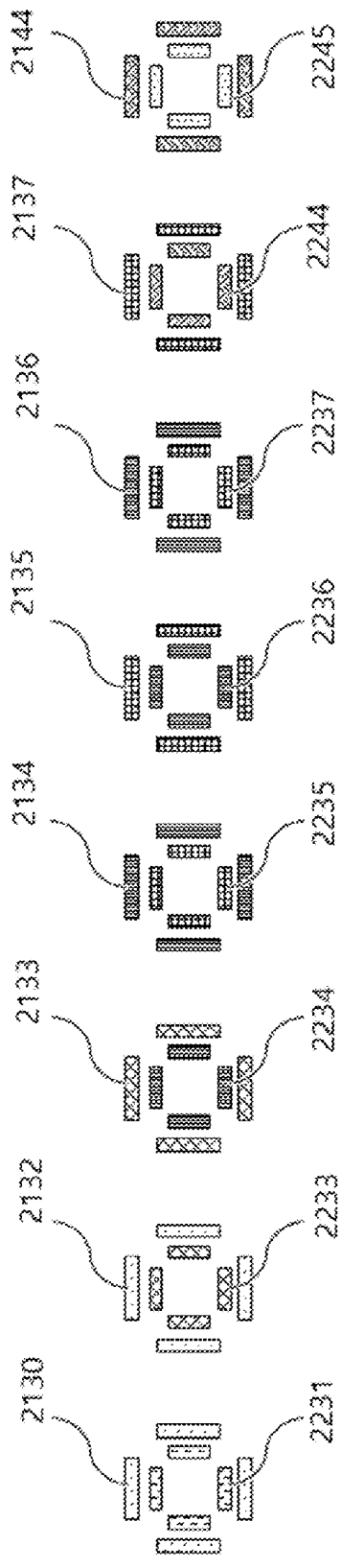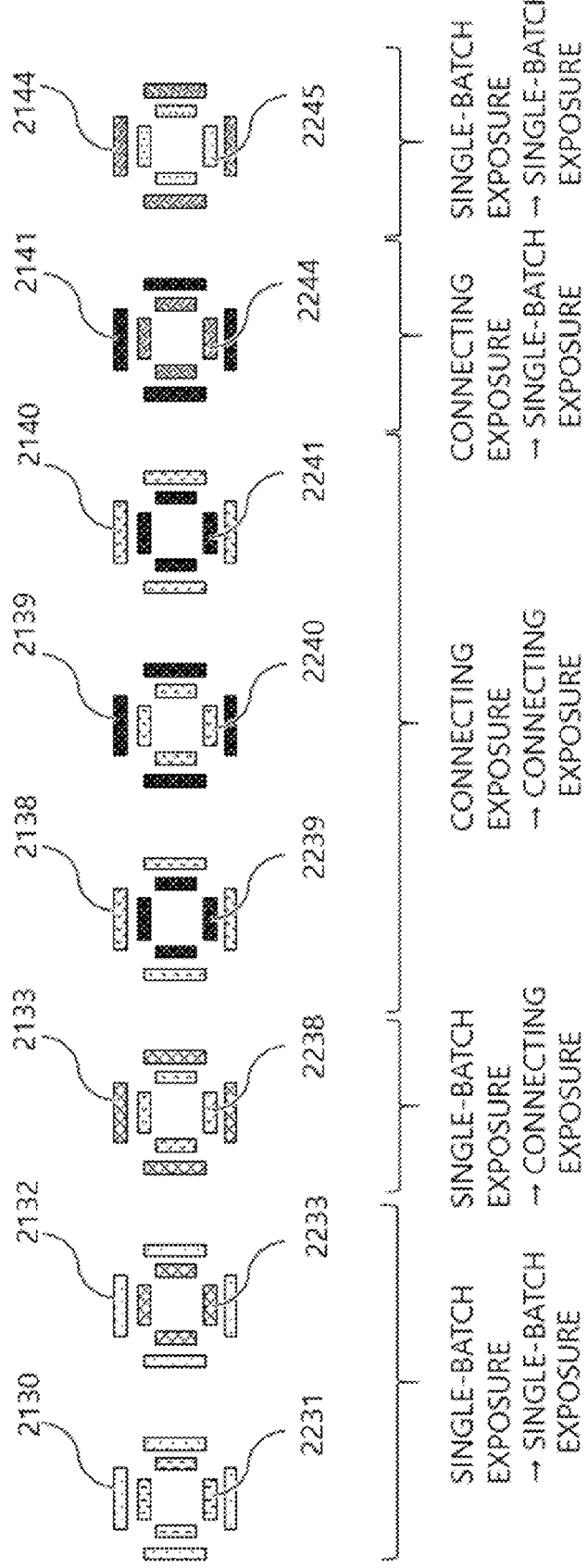

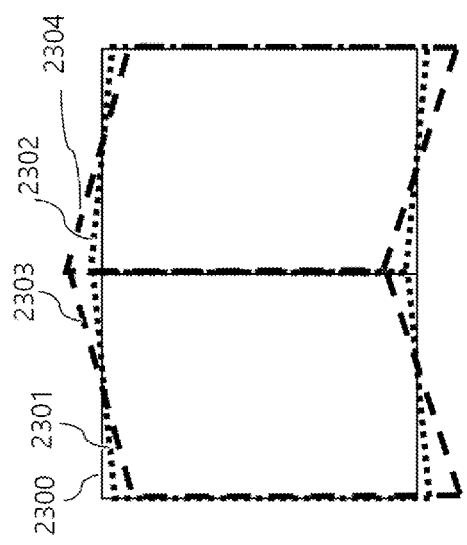
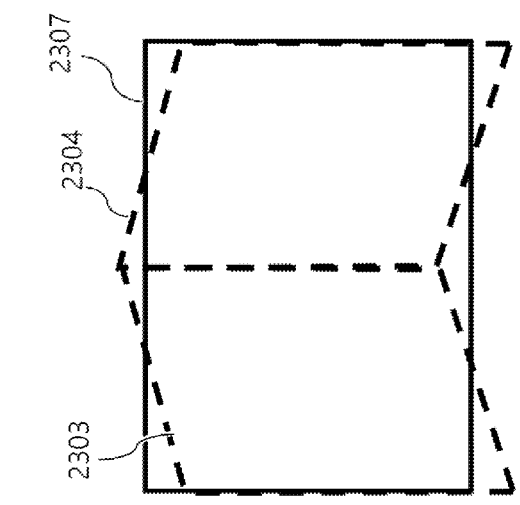
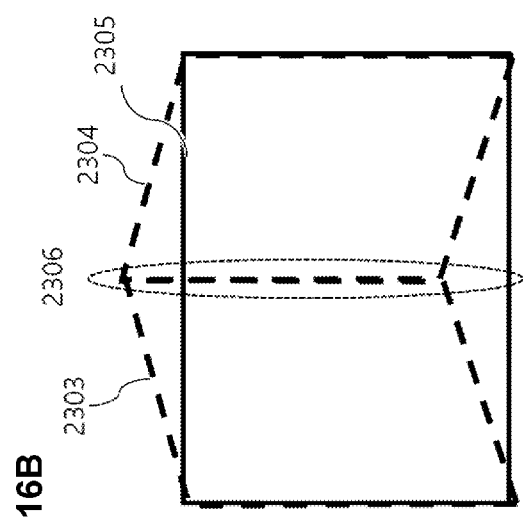
FIG. 16A
FIG. 16B
FIG. 16C

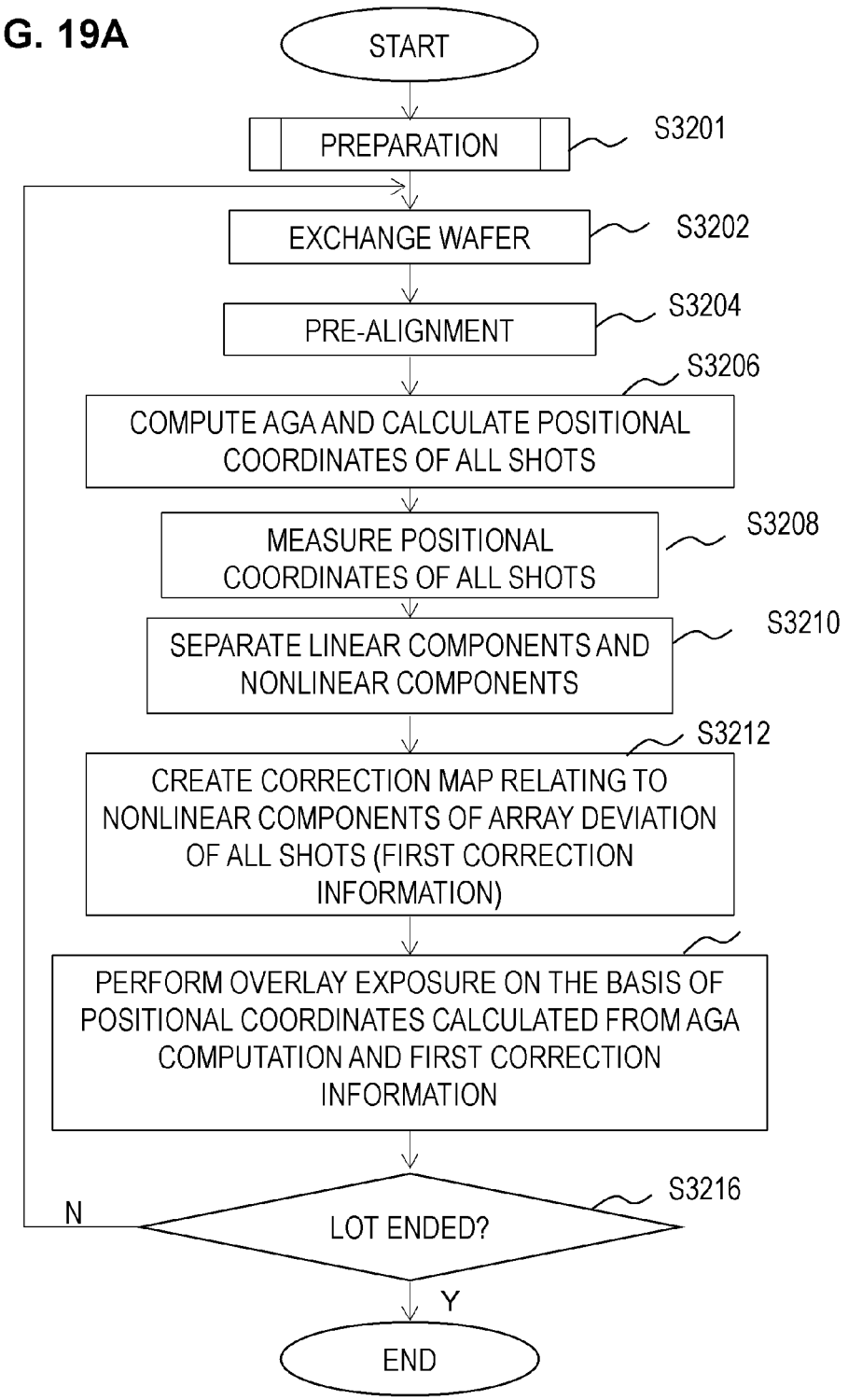

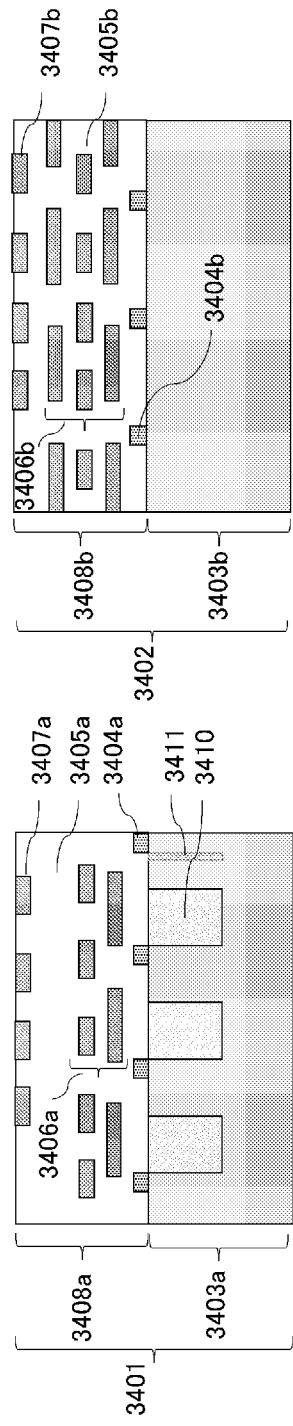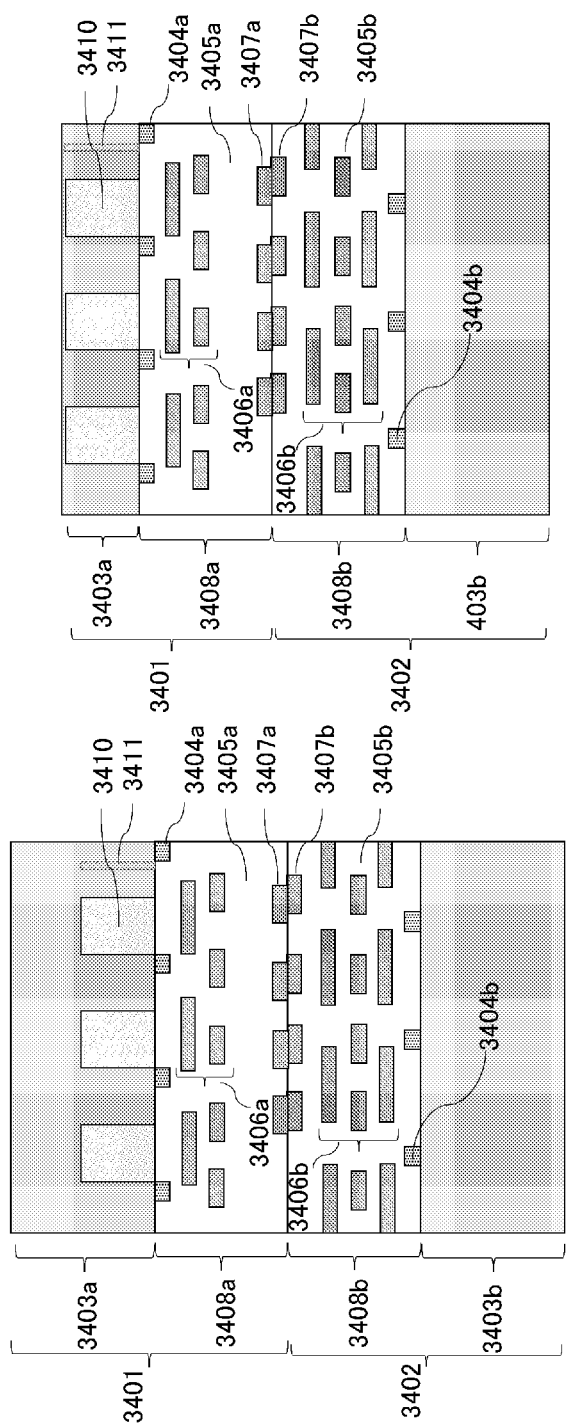

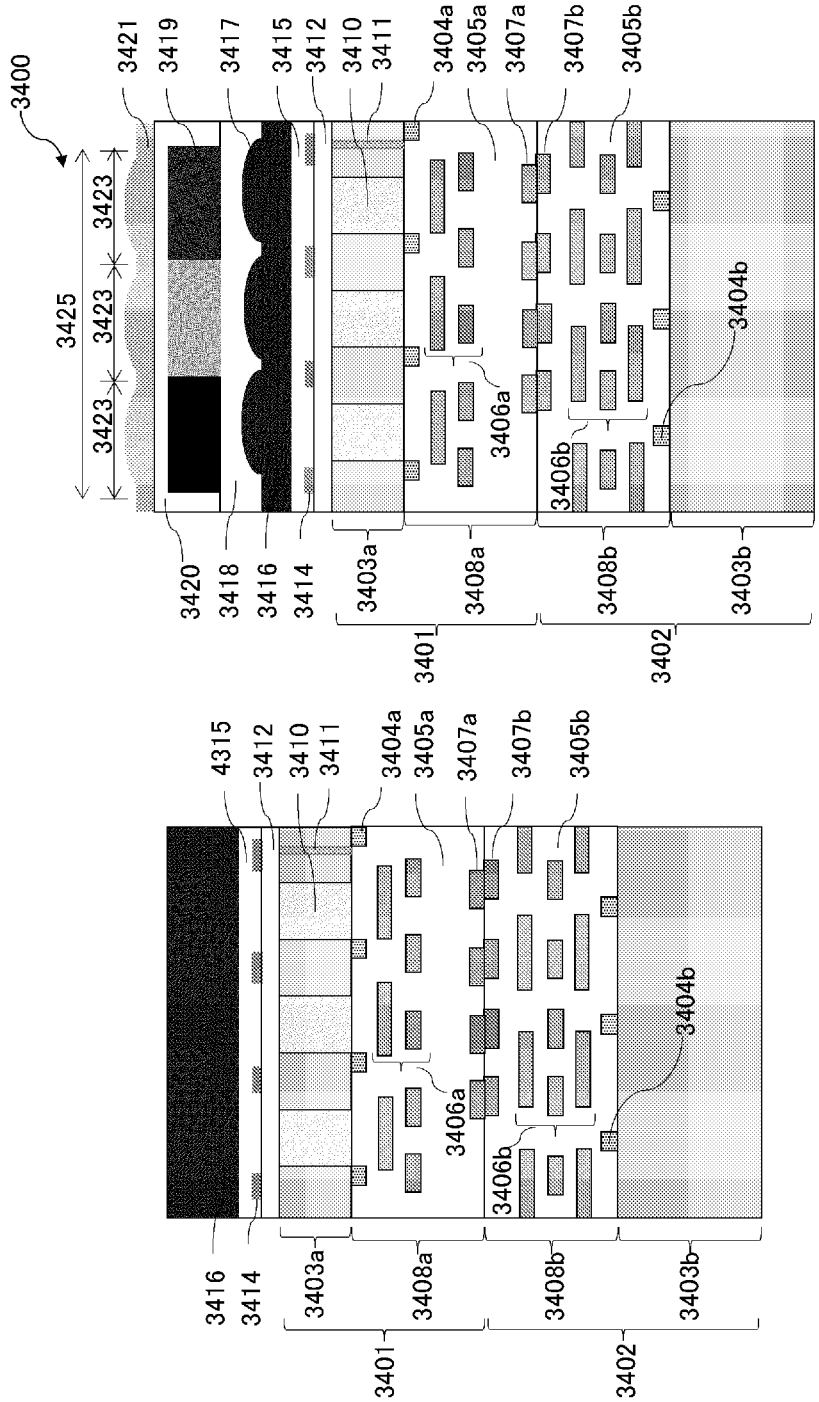

FIG. 27A
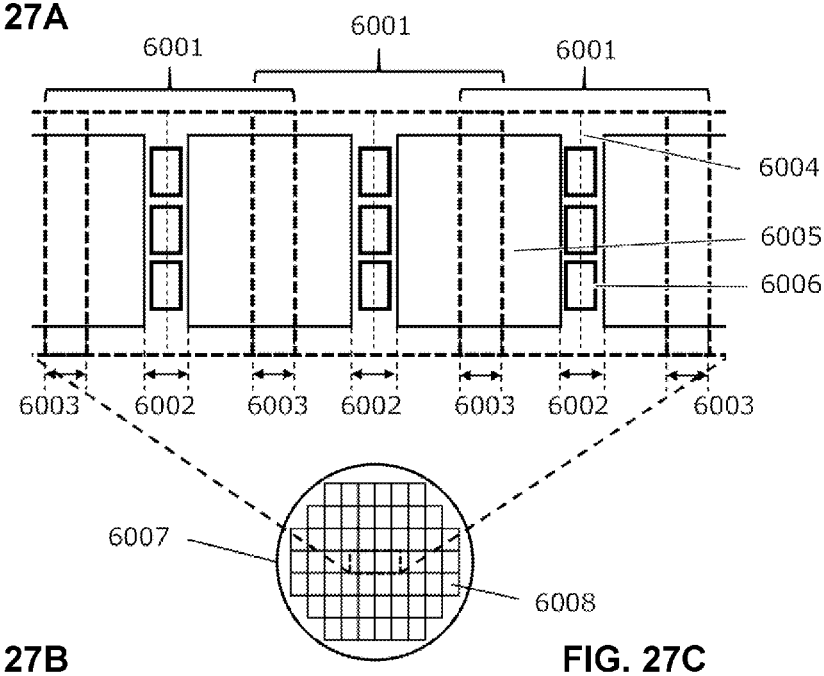
FIG. 27B
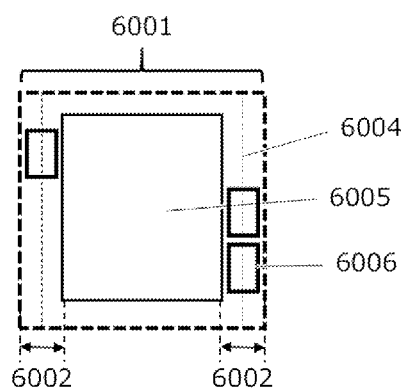
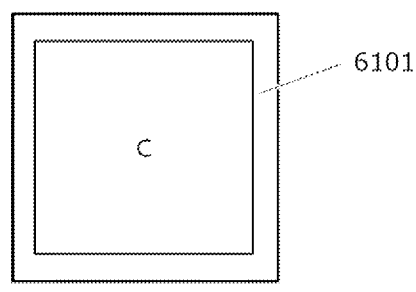
FIG. 27C
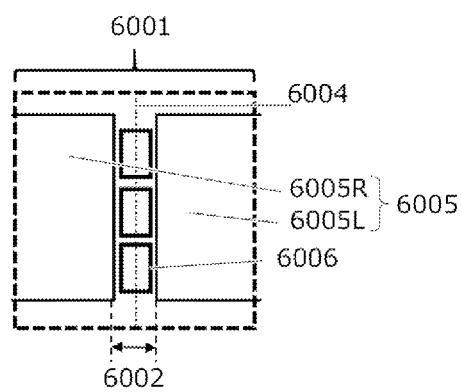
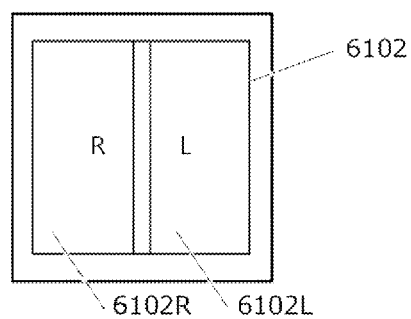

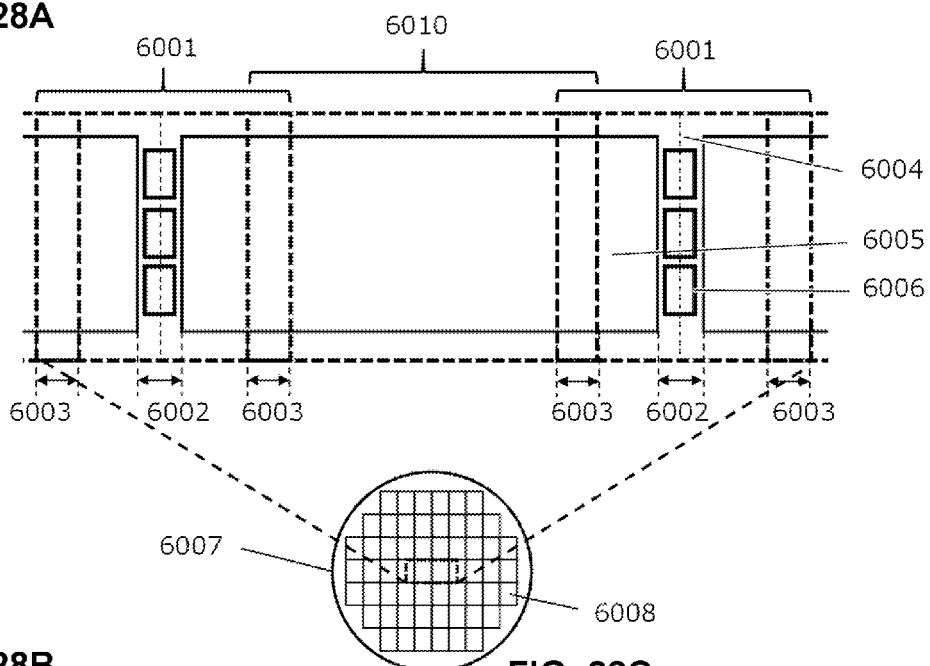
FIG. 28A
FIG. 28B
FIG. 28C
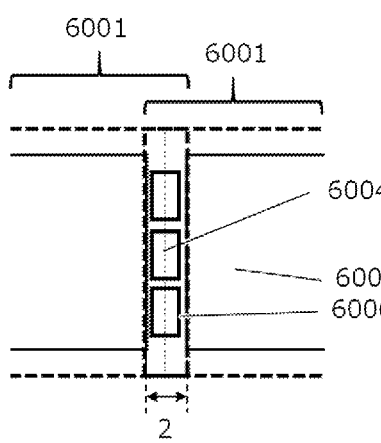
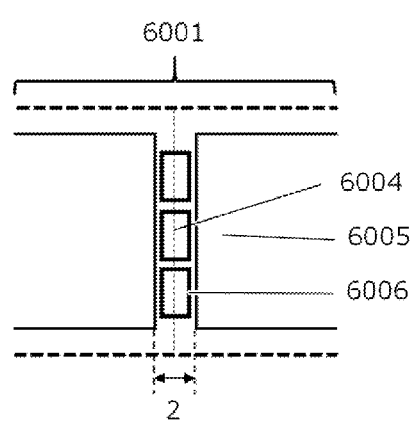
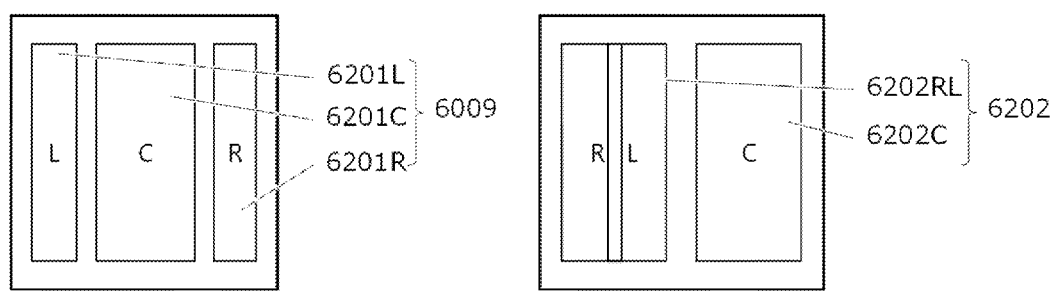

INSPECTION APPARATUS AND MANUFACTURING METHOD FOR SEMICONDUCTOR DEVICE

BACKGROUND OF THE INVENTION

Field of the Invention

The present invention relates to an inspection apparatus and a manufacturing method for a semiconductor device.

Description of the Related Art

In a case where a semiconductor device having a large chip size and a fine pattern is manufactured, split exposure is used in which patterns of each layer are split into a plurality of partial patterns, and exposure is performed, with these partial patterns being connected. In a case where split exposure is performed, positioning of the partial patterns relative to a base, and connecting of the partial patterns one to another have to be performed with high precision. Also, in a case where a pattern is formed by single-batch exposure on a layer, where a pattern has been formed by split exposure, positioning relative to the base has to be performed with high precision. Japanese Patent Application Publication No. 2015-216334 discloses using split exposure and single-batch exposure in a semiconductor device having a laminate structure in which the chip size is larger than an exposure range of the exposing apparatus.

SUMMARY OF THE INVENTION

It is an object of the present invention to provide a technology that is advantageous in manufacturing semiconductor devices using split exposure.

The first aspect of the disclosure is an inspection apparatus inspecting a wafer on which a plurality of patterns are formed by a plurality of exposure shots, the inspection apparatus comprising: acquisition unit configured to acquire first information representing a positional relation between an inspection mark included in a pattern formed by a first exposure shot and an inspection mark included in a pattern formed by a second exposure shot, and second information representing a positional relation between the inspection mark included in the pattern formed by the second exposure shot and an inspection mark included in a pattern formed by a third exposure shot; and derivation unit configured to derive a linear component of an error caused by a reticle, and a linear component of an error caused by a position of a wafer, on the basis of the first information and the second information.

The second aspect of the disclosure is a manufacturing method for a semiconductor device, the method comprising: a first forming step of forming a first pattern by connecting exposure processing in which a first partial pattern and a second partial pattern are connected to be exposed; a second forming step of forming a second pattern by single-batch exposure processing; and an acquiring step of acquiring information representing a positional relation between the first pattern and the second pattern, wherein the first pattern has a first inspection mark group including at least three inspection marks formed by exposure of the first partial pattern, and a second inspection mark group including at least three inspection marks formed by exposure of the second partial pattern, the first inspection mark group and the second inspection mark group are each arranged such that a straight line connecting a first inspection mark and a second inspection mark out of the three inspection marks, and a straight line connecting a third inspection mark and the first inspection mark out of the three inspection marks intersect, and the information is acquired using the three inspection marks of the first inspection mark group and the three inspection marks of the second inspection mark group, and an inspection mark included in the second pattern.

The third aspect of the disclosure is a manufacturing method for a semiconductor device, the method comprising: a step of preparing a wafer including a substrate and an insulator layer disposed on the substrate; a step of forming a wiring layer on the wafer by connecting exposure processing, wherein the connecting exposure processing is a processing in which a plurality of partial patterns are connected; and a step of processing the insulator layer by single-batch exposure processing after forming the wiring layer.

The fourth aspect of the disclosure is a manufacturing method for a semiconductor device, in which a plurality of chips are separated from a wafer, the method comprising: a step of exposing photoresist on the wafer; and a step of developing the photoresist, wherein the step of exposing includes a first exposure shot in which a first partial pattern of a first chip, a second partial pattern of a second chip, and a scribe region pattern between the first chip and the second chip, are exposed on the photoresist, and a second exposure shot in which a third partial pattern of the second chip is exposed on the photoresist.

The present disclosure provides a technology that is advantageous in manufacturing semiconductor devices using split exposure Further features of the present invention will become apparent from the following description of exemplary embodiments with reference to the attached drawings.

BRIEF DESCRIPTION OF THE DRAWINGS

FIG. 3 is a configuration diagram of an overlay inspection apparatus included in the lithography system;

FIGS. 6A through 6F are diagrams for describing linear components in overlay error caused by a wafer;

FIGS. 7A through 7H are diagrams describing linear components in overlay error caused by a shot;

FIGS. 13A and 13B are diagrams for describing inspection marks formed in the second embodiment;

FIGS. 16A through 16C are diagrams for describing advantageous effects of the second embodiment;

FIGS. 19A and 19B are flowcharts showing the flow of a first-type exposure step according to a third embodiment;

FIGS. 21A through 21D are diagrams for describing an example of applying the third embodiment to semiconductor device manufacturing;

FIGS. 23A and 23B are diagrams for describing an example of applying the third embodiment to semiconductor device manufacturing;

FIGS. 27A through 27C are diagrams illustrating exposure shots and reticle patterns according to a sixth embodiment;

FIGS. 28A through 28C are diagrams illustrating exposure shots and reticle patterns according to the sixth embodiment.

DESCRIPTION OF THE EMBODIMENTS

Figure 1:
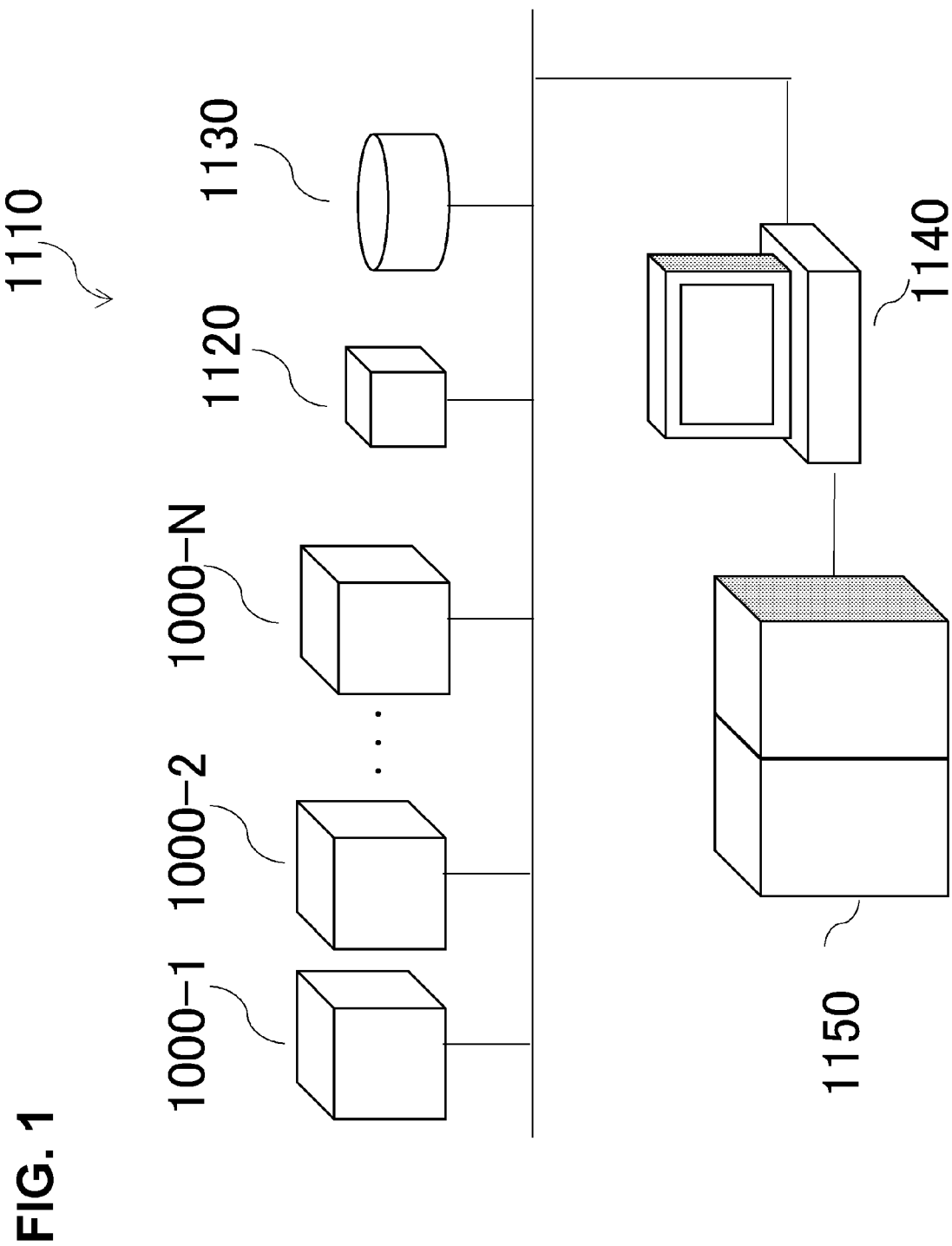
FIG. 1 is an overall configuration diagram of a lithography system according to an embodiment.

Embodiments of the present invention will be described below. The description below is intended to exemplarily describe embodiments of the present invention, and is not intended to limit the scope of the present invention just to the described embodiments. Also, the embodiments below may each be combined and carried out. Accordingly, regarding a matter that has been described in a certain embodiment, and that may be the same in other embodiments, description of the matter in other embodiments will be omitted. The present invention is not limited to the embodiments described in the specification, and various modifications may be made. For example, an example where part of configurations of one of the embodiments is added to another embodiment, and an example where part of configurations of one of the embodiments is replaced by part of configurations of another of the embodiments, are embodiments of the present invention. Note that the disclosed content of the present specification includes not only that described in the present specification, but all matters that are comprehensible from the present specification and the Figures attached to the present specification. Also, the disclosed content of the present specification includes complementary sets of concepts described in the present specification. That is to say, if there is a description in the present specification to the effect that "A is larger than B" for example, the present specification can be said to be disclosing to the effect that "A is not larger than B", even if description to the effect that "A is not larger than B" is omitted. This is because it is a premise that a description to the effect that "A is larger than B" takes into consideration a case in which "A is not larger than B".

First Embodiment

A technique called split exposure is used to manufacture semiconductor devices that are large in chip size and that have fine patterns. Split exposure is processing where a desired pattern (hereinafter referred to as "original pattern") in each of layers is split into a plurality of patterns (hereinafter referred to as "partial patterns" or "split patterns"), and exposure is performed with these partial patterns connected. In split exposure, a plurality of partial patterns are connected and exposed, and accordingly this can also be referred to as "connecting exposure". One layer of an original pattern is formed by split exposure, and these steps are repeated a plurality of times, thereby manufacturing a semiconductor device made up of a plurality of layers. In contrast with this, processing of exposing an original pattern in a single batch instead of splitting the pattern will be referred to as "single-batch exposure". Note that in patterns formed in connecting exposure or split exposure, a plurality of partial patterns typically are continuous at the connecting region. However, in patterns formed in connecting exposure or split exposure, a plurality of partial patterns being continuous through connecting exposure is not indispensable, and a plurality of partial patterns may be non-continuous with each other in the same chip. A resist pattern is formed from photoresist in manufacturing of a semiconductor device through an exposure step of exposing photoresist on a wafer and a developing step of developing the photoresist. The wafer is processed (etching and ion injection is performed with regard to the layers of the wafer) and so forth, using this resist pattern. The photoresist is exposed in accordance with reticle patterns formed in a reticle (photomask) in the exposure step. One reticle pattern is exposed in photoresist by one exposure shot. An exposure pattern (latent image) formed in the photoresist by the exposure shot is formed as a resist pattern through the developing step. Processing of the wafer is performed using the resist pattern, and processing patterns are formed in layers making up the wafer as a result of the processing. Note that in the following description, reticle patterns, resist patterns, and processing patterns will be handled as equivalent to each other, unless specifically stated otherwise.

In the manufacturing method using this split exposure, the partial patterns are positioned by alignment. However, alignment includes error (hereinafter referred to as "alignment error") to a certain extent. Alignment of partial patterns is performed as to the base, but there are cases where the seams of partial patterns in the same layer do not always match each other and there is deviation among the partial patterns due to alignment error and so forth. Using alignment information obtained by alignment regarding one of the partial patterns in split exposure regarding at least one layer for reticle positioning has been proposed (Japanese Patent Application Publication No. 2004-153115), to reduce deviation among the partial patterns.

Also, management of arrangement precision of grid positions formed by two-dimensional driving of a wafer stage of an exposing device in the X and Y directions is carried out by various methods. For example, a wafer for a tool, called a "reference wafer" is used to obtain information of a "correct grid position", by which arrangement precision of the wafer stage of the exposing device actually used is managed (Japanese Patent Application Publication No. S 61-219134).

Also, the arrangement precision of grid positions of exposing devices is also managed by a method called "adjacent shots overlay", in which exposure is performed with adjacent shots overlapping at the time of stepping and exposing one reticle. This method generally is performed using a particular reticle as a tool, but a method has also been proposed in which a reticle for an actual device is used for performing management (Japanese Patent Application Publication No. 2007-067018).

However, no proposal has been made heretofore regarding a management method of overlay regarding cases where rendering error differs among the reticles used for each split exposure. That is, in exposure using reticles with different rendering error for each partial patterns, even if alignment as to the base is performed with a certain level of precision, a problem occurs in that there is deviation among partial patterns in the same layer. This is because overlay error inevitably occurs since the error occurring due to using reticles with different rendering error is not taken into consideration.

However, in a case of performing split exposure without alignment as to the base, management of arrangement of the exposing device by "adjacent shots overlay" is conceivable. However, the current situation is that cases of using a plurality of reticles are not being studied.

Figure 9A:
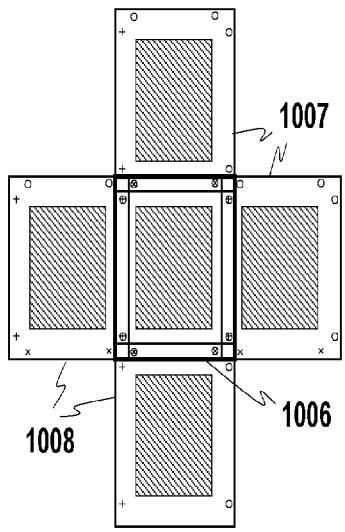
FIGS. 9A through 9D are diagrams for describing shots in single-batch exposure and split exposure.
Figure 9B:
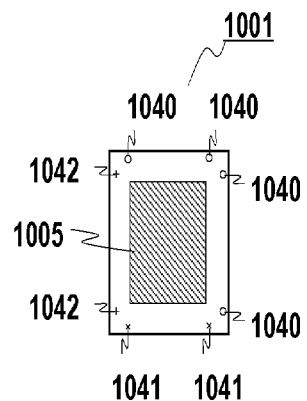

Now, arrangement position precision of the exposing device by "shot overlay" will be considered with reference to FIGS. 9A and 9B.

FIG. 9A is a diagram illustrating "chip overlay" in a case of single-batch exposure using one reticle 1001 illustrated in FIG. 9B. In the original reticle 1001 are formed a partial pattern 1005, and also inspection marks 1040, 1041, and 1042. Here, a predetermined number of the inspection marks 1040, 1041, and 1042 are formed at positions near to both end portions of each side of the reticle 1001. Exposure using the reticle 1001 transfers the partial pattern 1005 and the inspection marks 1040, 1041, and 1042 onto a wafer 1002 at the same time. The original pattern (desired pattern) of the reticle 1001 is sequentially transferred onto the entire face of the wafer 1002 by repeating this exposing operation. At the time of this transfer, the outer edge portions of an exposure shot 1006, in which inspection marks 1041 and 1042 are formed, are transferred overlaying the outer edge portions of adjacent shots 1007 and 1008 where the inspection marks 1040 are formed.

An overlay inspection apparatus 1120 measures the amount of deviation between overlaid inspection marks formed in a complex of the inspection mark 1040 and the inspection mark 1041. The overlay inspection apparatus 1120 is able to detect deviation among adjacent shots in upper and lower steps in planar view, between the exposure shot 1006 and the adjacent shot 1007, on the basis of the amount of deviation measured. In the same way, the overlay inspection apparatus 1120 is able to detect deviation among adjacent shots in left and right steps in planar view between the exposure shot 1006 and the adjacent shot 1008, by measuring the amount of deviation between overlaid inspection marks formed in a complex of the inspection mark 1040 and the inspection mark 1042. Also, linear components of shot magnification component, shot rotation component, and shot orthogonality can be calculated from the number and arrangement position of inspection marks.

Figure 9C:
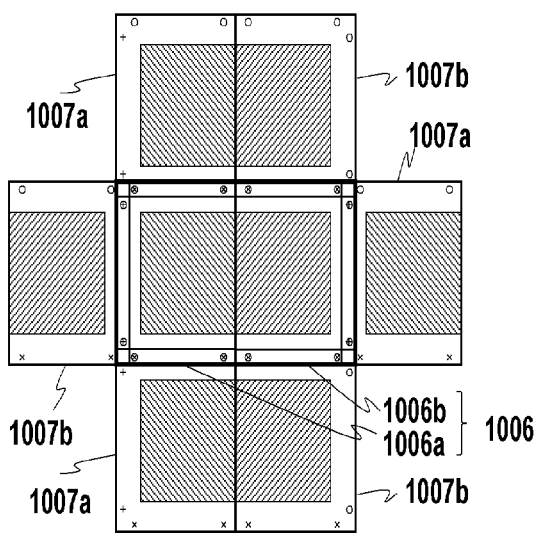
Figure 9D:
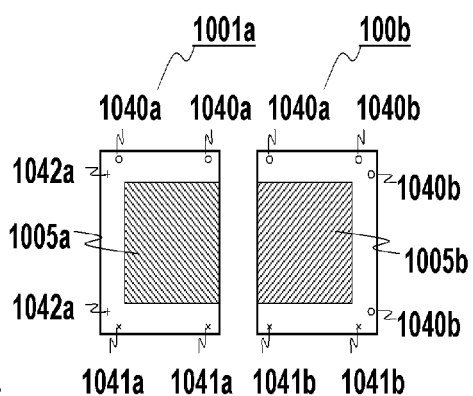

FIG. 9C is a diagram illustrating "split shots overlay" in a case of split exposure using the two reticles 1001a and 1001b illustrated in FIG. 9D. Formed in each of the original reticles 1001a and 1001b are partial patterns 1005a and 1005b, and also inspection marks 1040a, 1041a, 1042a, 1040b, 1041b, and 1042b. A predetermined number of the inspection marks are formed at positions near to the end portions of each side of the reticles 1001a and 1001b at this time. Exposure using the reticles 1001a and 1001b transfers the partial patterns 1005a and 1005b and the inspection marks 1040a, 1041a, 1042a, 1040b, 1041b, and 1042b onto the wafer 1002 at the same time. The original patterns (desired patterns) of the reticles 1001a and 1001b are sequentially transferred onto the entire face of the wafer 1002 by repeating this exposing operation. At the time of this transfer, the outer edge portions of exposure shots 1006a and 1006b (collectively referred to as "exposure shot 1006") are transferred overlaying the outer edge portions of adjacent shots 1007a, 1007b, 1008a, and 1008b in which the inspection marks 1040a and 1040b are formed.

The overlay inspection apparatus 1120 measures the amount of deviation of the overlay inspection marks formed in a complex of the inspection mark 1040a and the inspection mark 1041a. The overlay inspection apparatus 1120 is able to detect deviation among adjacent shots in upper and lower steps in planar view, between the exposure shot 1006a and the adjacent shot 1007a, on the basis of the amount of deviation measured. In the same way, the overlay inspection apparatus 1120 is able to detect deviation among adjacent shots in upper and lower steps in planar view between the exposure shot 1006b and the adjacent shot 1007b, by measuring the amount of deviation between overlaid inspection marks formed in a complex of the inspection marks 1040b and 1041b.

Deviation among adjacent shots can be detected regarding steps to the right and the left, on the basis of deviation amount of overlay inspection marks formed in the complex of the inspection mark 1040b and the inspection mark 1042a. However, whether the deviation amount of inspection marks is due to shot error component of shot magnification or shot rotation of the reticles 1001a and 1001b, or arrangement position offset error among the transfer patterns exposed by the reticles 1001a and 1001b, cannot be discerned. If this discernment cannot be made, connecting correction in the split exposure cannot be performed with high precision. Shot error is error caused by reticles. Also, arrangement position offset error is error caused by the position of the wafer, and includes error caused by the wafer and error caused by the stage.

In light of the above problem, the present embodiment provides an overlay inspection apparatus and a manufacturing method for a semiconductor device, whereby highly precise connection can be performed even if split exposure is performed using reticles having different rendering error for each of the partial patterns.

The present embodiment will be described in detail below with reference to Figures. The semiconductor device according to the present embodiment has a large chip size, and has fine patterns. One example thereof is an image-capturing device that captures images.

(Lithography System)

FIG. 1 schematically illustrates an overall configuration of a lithography system 1110 according to the present embodiment. The lithography system 1110 includes N exposing apparatuses 1000-1, 1000-2, and so on through 1000-N, the overlay inspection apparatus 1120, an information server 1130, a terminal server 1140, a host computer (host) 1150, and so forth. The exposing apparatuses 1000-1 through 1000-N, the overlay inspection apparatus 1120, the information server 1130, and the terminal server 1140 are connected to each other via a local area network (LAN) 1160. The host computer 1150 is also connected to the LAN 1160 via the terminal server 1140. That is to say, mutual communication paths among the exposing apparatus 1000-*i* (where i=1 through N), the overlay inspection apparatus 1120, the information server 1130, the terminal server 1140, and the host computer 1150 are secured in the hardware configuration.

<Configuration of Exposing Apparatus>

Each of the exposing apparatuses 1000-1 through 1000-N may be a step-and-repeat projection exposure apparatus (stepper), or may be a step-and-scan projection exposure apparatus (scanner). Hereinafter, the exposing apparatuses 1000-1 through 1000-N will be collectively referred to as "exposing apparatus 1000". The exposing apparatus 1000 here is a scanner having correction functions of nonlinear error among shots. Grid correction functions are functions of correcting a nonlinear parallel translation component included in positional error among a plurality of shots formed on a wafer.

Figure 2:
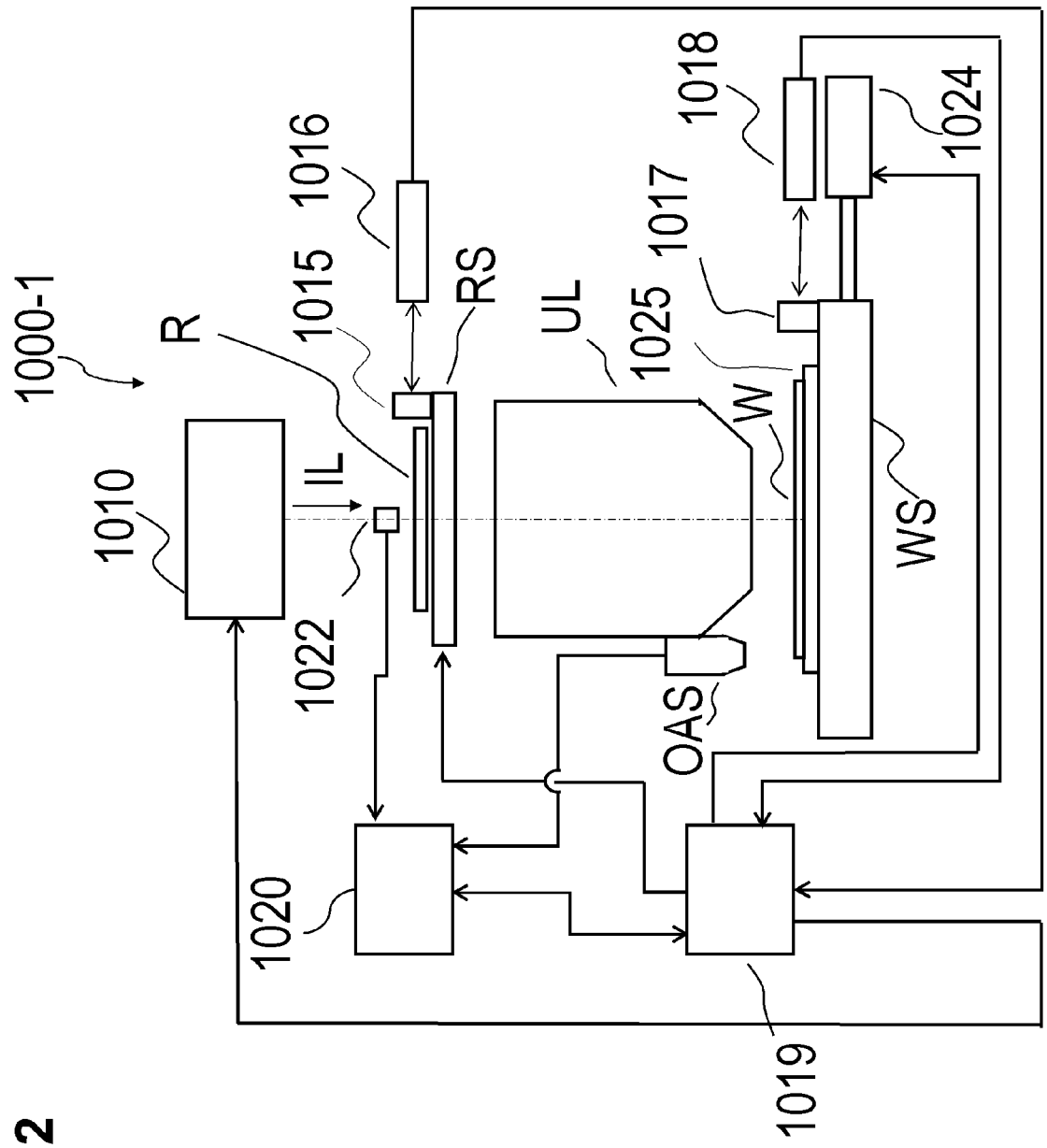
FIG. 2 is a configuration diagram of an exposing apparatus included in the lithography system.

FIG. 2 illustrates a schematic configuration of a scanner-type exposing apparatus 1000-1 that has grid correction functions. The exposing apparatus 1000-1 is provided with an illumination system 1010, a reticle stage RS that holds a reticle R, a projection optical system UL, a wafer stage WS on which a wafer W is loaded, a main control system 1020 that centrally controls the entire apparatus, and so forth.

The illumination system 1010 illuminates a slit-shaped illumination region portion defined by a reticle blind above the reticle R on which a circuit pattern or the like is drawn, by illumination light IL of an approximately uniform luminance. Examples of the illumination light IL that can be used here include far ultraviolet such as krypton fluoride (KrF) excimer laser light (wavelength 248 nm) and so forth, vacuum ultraviolet such as argon fluoride (ArF) excimer laser light (wavelength 193 nm) and so forth, and the like.

The reticle stage RS holds the reticle R by vacuum clamping or electrostatic attraction. The reticle stage RS is able to move in a predetermined scanning direction (Y axis direction) by a reticle stage drive unit that is omitted from illustration, at a specified scan velocity. The position of the reticle stage RS within the plane of stage movement is detected at all times by a reticle interferometer 1016, via a bar mirror 1015. Position information of the reticle stage RS from the reticle interferometer 1016 is supplied to a stage control system 1019, and to the main control system 1020 thereby. The stage control system 1019 performs driving control of the reticle stage RS on the basis of position information of the reticle stage RS, in accordance with instructions from the main control system 1020. A pair of reticle alignment systems 1022 is disposed above the reticle R, and reticle alignment results are supplied to the main control system 1020.

The projection optical magnification of the projection optical system UL is, for example, ½, 1/3.125, ¼, ⅕, or the like. Accordingly, when the illumination region of the reticle R is illuminated by the illumination light IL from the illumination system 1010, the wafer W is irradiated by the illumination light IL passing through the reticle R, via the projection optical system UL. A reduced image of the circuit pattern of the reticle R within the illumination region is formed on the resist on the wafer W.

A wafer chuck 1025 is loaded on the wafer stage WS. The wafer W is fixed by vacuum clamping, for example, on this wafer chuck 1025. The wafer stage WS is configured to be capable of movement not only in the scan direction (Y axis direction) but also in the non-scan direction (X axis direction) that is orthogonal to the scan direction. The exposing apparatus 1000-1 performs step-and-scan operations, in which operations of scanning exposure of the shots on the wafer W are performed, and operations of moving to an acceleration starting position for exposure of the next shot, are repeated.

The position within the X-Y plane of the wafer stage WS is detected at all times by a wafer interferometer 1018, via a bar mirror 1017. Now, in actual practice, a Y-direction bar mirror having a reflecting face orthogonal to the scan direction (Y axis direction) and an X-direction bar mirror orthogonal to the non-scan direction (X axis direction) are provided on the wafer stage WS. Corresponding to this, a Y-direction wafer interferometer that emits an interferometer beam perpendicular to the Y-direction bar mirror, and an X-direction wafer interferometer that emits an interferometer beam perpendicular to the X-direction bar mirror, are provided.

Position information (or velocity information) on a stage coordinates system of the wafer stage WS is supplied to the stage control system 1019, and to the main control system 1020 thereby. The stage control system 1019 controls the wafer stage WS via a wafer stage drive unit 1024 on the basis of the position information (or velocity information) of the wafer stage WS, in accordance with instructions from the main control system 1020.

An off-axis alignment system OAS is provided on a side face of the projection optical system UL. The alignment system OAS performs image capturing of images of alignment marks on a wafer, and images of index marks on an index plate disposed within a plane conjugate to the wafer. The image capturing is performed by irradiating the wafer by illumination light having a predetermined spectral bandwidth (light source is a white light-emitting diode (LED), for example), and imaging the reflected light at a light-receiving face of an image-capturing device by an object lens or the like. The alignment system OAS outputs the image-capturing results of alignment marks to the main control system 1020.

The main control system 1020 is configured including a processor such as a central processing unit (CPU) and memory, and centrally controls the components of the apparatus by the processor executing programs stored in the memory. The main control system 1020 is connected to the aforementioned LAN 1160. Also, in the present embodiment, a plurality of types of correction maps and so forth are stored as a database in a storage device such as a hard disk or the like, or memory such as random access memory (RAM) or the like, making up the main control system 1020.

The other exposing apparatuses 1000-2 through 1000-N are also configured in the same way as the exposing apparatus 1000-1, except for a point that part of an algorithm of the main control system 1020 is different. Part or all of the exposing apparatuses 1000-1 through 1000-N may not be provided with grid correction functions.

<Exposure Processing by Exposing Apparatus>

Next, operations of an exposure processing step of the exposing apparatus 1000-1 will be briefly described.

Prior to exposure, the main control system 1020 performs preparatory work. The preparatory work includes loading of the wafer W to the wafer chuck 1025 using a wafer conveyance system that is omitted from illustration, reticle alignment and baseline measurement of the alignment system OAS, and wafer alignment. Wafer alignment may be performed by Advanced Global Alignment (AGA) measurement regarding one mark within a shot, or in-shot multi-point AGA measurement. In-shot multi-point AGA is global alignment using position detection data of a plurality of wafer alignment marks (e.g., in the four corners of a shot) within a shot. Global alignment is a technique for obtaining array coordinates for all shots on the wafer W, and deformation amounts including magnification, rotation, and shift of each shot, using a statistical method using the method of least squares on position detection data.

The main control system 1020 sequentially transfers the pattern of the reticle R onto all shots on the wafer W by scanning exposure, on the basis of the results of the above reticle alignment and baseline measurement, and the results of wafer alignment.

In scanning exposure performed on each shot on the wafer W, the main control system 1020 moves the reticle stage RS and the wafer stage WS to their respective scan start positions (acceleration start positions) while monitoring position information from the reticle interferometer 1016 and the wafer interferometer 1018. The main control system 1020 then drives the stages RS and WS relative to each other, in opposite directions in the Y axis direction. When both stages RS and WS reach their respective target velocities, the pattern region of the reticle R begins to be illuminated by the illumination light IL, thereby staring scanning exposure.

The main control system 1020 synchronously controls the reticle stage RS and the wafer stage WS so that the velocities of movement of the reticle stage RS and the wafer stage WS in the Y axis direction during the above scanning exposure in particular are maintained at a velocity ratio corresponding to the projection magnification of the projection optical system UL. At this time, the main control system 1020 adjusts the synchronized driving of the stages RS and WS, or performs imaging characteristic correction by an internal mechanism of the projection optical system UL, thereby correcting distortion in the image from the pattern of the reticle R projected onto the wafer W. Adjustment of the synchronized driving of the stages RS and WS includes adjusting the velocity ratio in the scan direction between the reticle R (reticle stage RS) and the wafer W (wafer stage WS) at the time of scanning exposure, via the reticle stage drive unit that is omitted from illustration and the wafer stage drive unit 1024. Adjustment of the synchronized driving of the stages RS and WS also includes slightly adjusting the scanning direction of the stages RS and WS. Adjustment of the velocity ratio enables the magnification regarding the scan direction of the projected image to be corrected, and adjustment of the scan direction enables the projected image to be distorted.

When different regions of the pattern region of the reticle R are successively illuminated by the illumination light IL, and illumination of the entire pattern region is completed, this ends scanning exposure of a first shot on the wafer W. Thus, the circuit pattern of the reticle R is reduced and transferred onto the first shot via the projection optical system UL.

When scanning exposure of one shot ends, the main control system 1020 moves (steps) the wafer stage WS to the scan start position (acceleration start position) for the next second shot. Scanning exposure of the second shot is then performed in the same way as above. Thereafter, the same operations are performed regarding the third and subsequent shots. Thus, stepping operations among shots and scanning exposure operations of the shots are repeated, thereby transferring the pattern of the reticle R onto all shots on the wafer W by step-and-scan.

In the other exposing apparatuses 1000-2 through 1000-N, scanners are configured in the same way as the exposing apparatus (scanner) 1000-1. Steppers are basically configured in the same way as the exposing apparatus 1000-1. However, steppers are configured such that the reticle stage is only capable of slight driving in the X, Y, and θz directions in the X-Y plane. The steppers also differ with regard to the point of the region irradiated by the illumination light IL within the circular field of view of the projection optical system UL (corresponding to the above-described illumination region and exposure region) being larger in comparison with the scanner illustrated in FIG. 2, and having a size around the same as the scanning exposure region of the scanner, for example. This is because steppers perform exposure in a state where the wafer stage and the reticle stage are both stationary.

(Overlay Inspection Apparatus)

Next, the overlay inspection apparatus 1120 will be described with reference to FIG. 3. FIG. 3 is a schematic diagram illustrating an example of the overlay inspection apparatus 1120. A case where overlay inspection marks 1040*a* and 1041*a*, which are the object of overlay measurement, are formed on the wafer 1002 is illustrated in FIG. 3. A beam 1322 emitted from a halogen lamp 1321 passes through a fiber 1323, illumination optical systems 1324*a* and 1324*b*, a polarizing beam splitter 1325, and a quarter-wave (λ/4) plate 1326, and illuminates the inspection marks 1040*a* and 1041*a* via an objective lens 1327.

Reflected light from the two marks 1040*a* and 1041*a* passes through the objective lens 1327 and the λ/4 plate 1326, and is reflected at the polarizing beam splitter 1325. Light reflected at the polarizing beam splitter 1325 passes through a relay lens 1328 and an erector lens 1329, and forms an image on an image-capturing face of a charge-coupled device (CCD) camera 1330. The formed image is photoelectrically converted by the CCD camera 1330, and is input to a computer (computing means) 1331 via a line. The computer 1331 can detect the relative positional relation of the two marks 1040*a* and 1041*a* by performing image processing of the image signals from the CCD camera 1330. For example, the computer 1331 can perform averaging processing on the image signals supplied thereto, detect edges of the marks on the basis of signal waveforms obtained thereby, and find the overlay error (deviation amount) from the detected edge positions.

Thus, the overlay inspection apparatus 1120 calculates positional deviation among marks formed in different layers as overlay error. The results are supplied to the host computer 1150 via the LAN 1160 and the terminal server 1140 by performing predetermined computation and so forth.

<Terminal Server>

The terminal server 1140 is configured as a gateway processor to absorb difference in communication protocols between the LAN 1160 and the host computer 1150. The functions of the terminal server 1140 enable communication among the host computer 1150, and the exposing apparatuses 1000-1 through 1000-N and overlay inspection apparatus 1120 connected to the LAN 1160. The main control systems 1020 that the exposing apparatuses 1000-1 through 1000-N have and the overlay inspection apparatus 1120 are connected to the LAN 1160 and perform communication with the host computer 1150 via the LAN 1160 and the terminal server 1140.

<Information Server>

The information server 1130 is configured of a large-capacity storage device and a processor. The information server 1130 stores various types of information used in the lithography system 1110.

<Host Computer>

The host computer 1150 is a large-scale computer that centrally manages the lithography system 1110. The host computer 1150 stores exposure history (e.g., lot name of wafers processed by the exposing apparatuses, process program name, time of processing, and so forth) sent from the exposing apparatuses 1000-1 through 1000-N, and so forth, in the information server 1130. The host computer 1150 schedules running of all exposing apparatuses in the exposure step of all wafers (lots), or rather, the steps of processing all electronic devices including the exposure step, on the basis of exposure history.

The host computer 1150 uses the results of overlay error obtained as the result of wafer alignment (AGA) at the exposing apparatuses 1000-1 through 1000-N to create correction information, in order to resolve overlay error at the time of exposure. The created correction information is stored in the information server 1130. At the time of instructing an exposing apparatus 1000-i to expose a wafer, the host computer 1150 reads out necessary correction information from the information server 1130 and transmits the information to the exposing apparatus 1000-i.

(Inspection Marks)

The inspection marks used in the present embodiment will be described below in detail. The inspection marks are read by the overlay inspection apparatus 1120 and used to measure the deviation amount of exposure patterns. Inspection marks are also referred to as "test pattern", "evaluation pattern", "inspection pattern", and so forth.

Figure 4A:
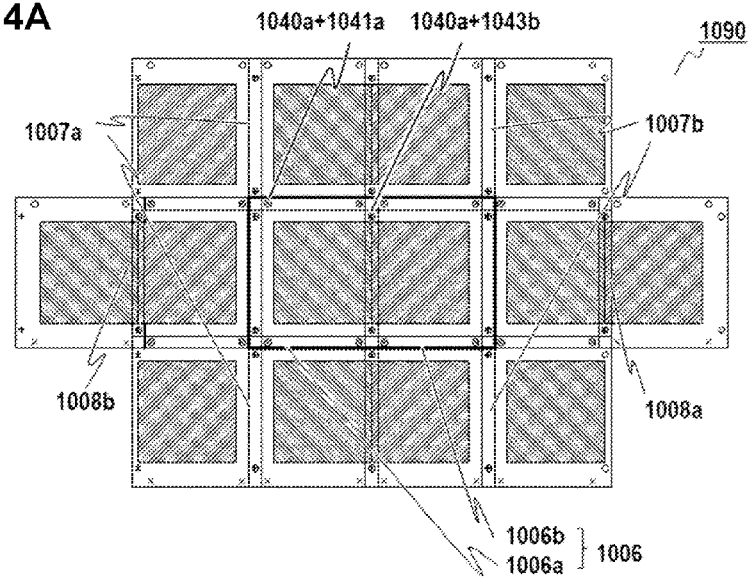
FIGS. 4A through 4C are diagrams for describing shots in split exposure according to a first embodiment.
Figure 4B:
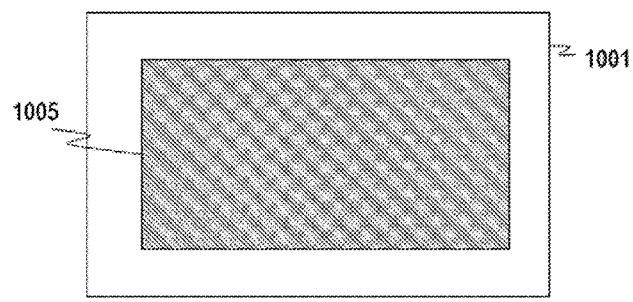
Figure 4C:
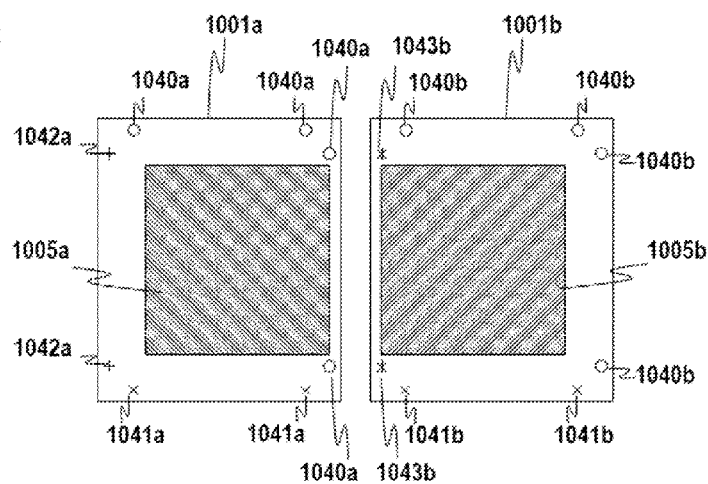

FIG. 4A is a planar view illustrating, in planar view, the relation between inspection mark positions within exposure shots and inspection mark positions of adjacent shots above and below, and to the right and the left, and inspection mark positions where connection deviation has occurred between partial patterns of exposure shots, in split exposure. FIG. 4B illustrates a pattern for an entire layer of a reticle used in split exposure. FIG. 4C illustrates partial patterns where a pattern for an entire layer is split. FIG. 4D illustrates a layout example of overlay inspection marks between chips, and connection deviation inspection marks between partial patterns.

FIG. 4A illustrates an example 1090 of a shot in a case where the exposure shot is rectangular. The exposure shots 1006a and 1006b are any shots out of a plurality of exposure regions (shots) transferred onto the wafer 1002, which are the object of overlay evaluation. FIG. 4A illustrates inspection marks of the exposure shots 1006a and 1006b, and inspection marks of adjacent shots 1007a and 1007b above and below, and of adjacent shots 1008a and 1008b to the right and the left.

The circuit pattern 1005 is the pattern of the reticle for the entire layer, as illustrated in FIG. 4B. The circuit pattern 1005 is the circuit pattern for one entire chip. In the present embodiment, the circuit pattern 1005 is split into two, and a reticle 1001a that has a partial pattern 1005a, and a reticle 1001b that has a partial pattern 1005b are used, as illustrated in FIG. 4C. Inspection marks 1040a, 1041a, and 1042a are provided in a peripheral region (evaluation region) of the reticle 1001a. Inspection marks 1040b, 1041b, and 1043b are provided in a peripheral edge (evaluation region) of the reticle 1001b.

The peripheral edge portions of the inspection marks of the adjacent shots 1007a, 1007b, 1008a, and 1008b are each disposed on the inner side of three sides of the exposure shots 1006a and 1006b, as illustrated in FIG. 4A. That is to say, the exposure shots 1006a and 1006b are disposed with the peripheral regions overlaying the peripheral regions of the shots 1007a, 1007b, 1008a, and 1008b of the adjacent chips. For example, an inspection mark 1060 illustrated in FIG. 4A is configured of the inspection mark 1040a provided at the upper end region of the exposure shot 1006a and the inspection mark 1041a provided at the lower end region of the adjacent shot 1007a adjacent on the upper side being overlaid.

Also, inspection marks of partial patterns are disposed overlaying in one side divided by splitting the exposure shot 1006 into the exposure shots 1006a and 1006b. For example, an inspection mark 1061 illustrated in FIG. 4A is configured of the inspection mark 1040a provided at the right end region of the exposure shot 1006a and an inspection mark 1043b provided at the left end region of the exposure shot 1006b overlaid, as illustrated in FIG. 4A.

Of the inspection marks provided to the reticles 1001a and 1001b (exposure shots 1006a and 1006b), inspection marks provided in regions where the circuit pattern 1005 is split are used for evaluating connecting deviation among the shots of the partial patterns. In the example in FIG. 4C, the inspection mark 1040a provided at the right end region of the reticle 1001a and an inspection mark 1043b provided at the left end region of the reticle 1001b are used for evaluation of connection deviation among the partial patterns. Also, inspection marks provided in the peripheral region of the circuit pattern 1005 are used for shot overlay evaluation between chips. In the example in FIG. 4C, inspection marks provided at the upper end region, left end region, and lower end region of the reticle 1001a and inspection marks provided at the upper end region, right end region, and lower end region of the reticle 1001b are used for shot overlay evaluation between chips.

FIG. 4A illustrates an ideal state of arrangement of inspection marks. In FIG. 4A, the inspection mark 1040a and inspection mark 1041a are overlaid between the exposure shot 1006a and the adjacent shot 1007a that is adjacent at the upper side thereof as described above, for example. Also, the inspection mark 1040a and the inspection mark 1043b are overlaid between the split exposure shot 1006a and the exposure shot 1006b. An ideal arrangement of inspection marks refers to a state where inspection marks overlaying each other in adjacent shots are overlaid without deviation. For example, a state where the inspection marks indicated by "x" marks and "+" marks in the evaluation region of the sides of the exposure shot are each within "circle" marks that are inspection marks within the peripheral region (evaluation region) of an adjacent shot, without deviation as to each other, is an ideal arrangement. Further, a state where there is no deviation between "circle" marks that are inspection marks and asterisk "*" marks that are inspection marks between partial patterns is an ideal arrangement.

The partial patterns 1005a and 1005b are provided on the inner side of the evaluation region of the exposure shots, as illustrated in FIG. 4C. Accordingly, the evaluation step of evaluating the exposure position from split exposure operations, and the manufacturing steps of the semiconductor device, can be performed at the same time.

Figure 5A:
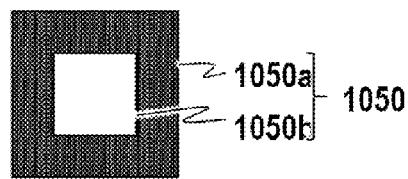
FIGS. 5A through 5D are diagrams illustrating examples of marks for overlay inspection.

FIGS. 5A through 5D are enlarged views illustrating examples of the inspection marks in FIGS. 4A through 4C. FIG. 5A illustrates an inspection mark 1050 according to the examples. This inspection mark may be used for inspecting either of overlay among chips, or deviation of connection among split shots. The inspection mark 1050 includes two parts 1050*a* and 1050*b*, which are provided on the peripheral region of adjacent shots overlaying each other. In the inspection mark 1050, the large rectangular part (shaded portion) 1050*a* on the outer side is indicated by the "circle" marks as a simplified symbol in FIG. 4A. Also, the small rectangular part (white portion) 1050*b* on the inner side is indicated by the "x" marks "+" marks, and asterisk "*" marks as simplified symbols in FIG. 4A. The overlay inspection apparatus 1120 detects the deviation amount between each of the center coordinates of the "circle" marks of this exposure shot and the center coordinates of the "x" marks "+" marks, and asterisk "*" marks.

Figure 5B:
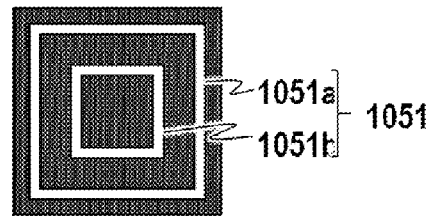
Figure 5C:
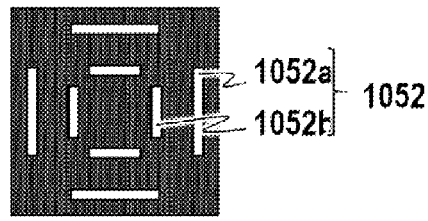
Figure 5D:
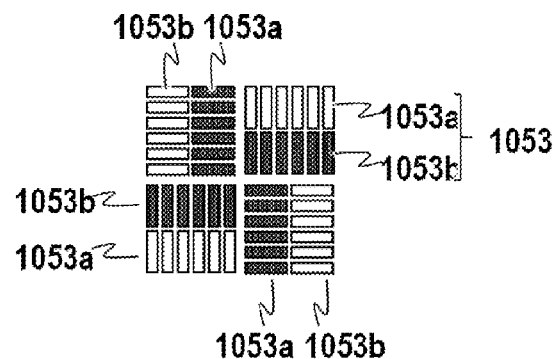

FIGS. 5B through 5D illustrate examples of inspection marks other than that in FIG. 5A. FIGS. 5B and 5C illustrate examples of groove-like inspection marks 1051 and 1052, and FIG. 5D illustrates an example of a lattice-like inspection mark 1053. In each of the inspection marks, shaded portions 1051*a*, 1052*a*, and 1053*a*, and outline portions 1051*b*, 1052*b*, and 1053*b*, are provided in the peripheral region of the adjacent shot. Note that the size of these inspection marks is related to precision of positional deviation, but is defined in a specification relating to inspection marks of the overlay inspection apparatus 1120 (inspection marks), and accordingly detailed description thereof will be omitted here.

The overlay inspection apparatus 1120 also has a software program that performs en bloc calculation of linear components of various types of error such as illustrated in FIGS. 6A through 6F, from measurement results of overlay deviation of the overlay inspection marks 1050*a* and 1050*b*, for example. The overlay inspection apparatus 1120 measures the deviation amount of the overlay inspection marks 1050*a* and 1050*b*, and gives feedback of the deviation amount of linear components calculated to the exposing apparatus 1010-*i*. That is to say, after the exposure step is completed, the overlay inspection apparatus 1120 at that point gives feedback of the calculated results to the exposing apparatus 1010-*i*. This feedback may be performed automatically, or may be performed manually by a manager.

(Linear Components of Overlay Error)

The linear components of the overlay error described above will be described below. Various types of linear components include the following.

FIGS. 6A and 6B are diagrams illustrating wafer magnification component SC. FIG. 6A represents wafer magnification X component SCX, and FIG. 6B represents wafer magnification Y component SCY.

FIG. 6C is a diagram illustrating wafer rotation component WROT, and FIG. 6D is a diagram illustrating wafer orthogonal component ORTH. The wafer rotation component WROT has wafer rotation X component WROTX illustrated in FIG. 6E and wafer rotation Y component WROTY illustrated in FIG. 6F. WROT=(WROTX+WROTY)/2 holds. Also, ORTH=WROTY−WROTX holds.

FIG. 7A is a diagram illustrating shot magnification component MAG. There also is another component, which is X direction and Y direction magnification difference DIFF (omitted from illustration). The shot magnification component MAG includes shot magnification X component MAGX illustrated in FIG. 7B and shot magnification Y component MAGY illustrated in FIG. 7C, and is expressed as MAG=(MAGX+MAGY)/2. Also, the magnification difference DIFF is expressed as DIFF=MAGY−MAGX.

FIG. 7D is a diagram illustrating shot rotation component SROT, and FIG. 7E is a diagram illustrating shot orthogonality component SKEW. The shot rotation component SROT includes shot rotation X component SROTX illustrated in FIG. 7F and shot rotation Y component SROTY component illustrated in FIG. 7G, and is expressed as SROT=(SROTX+SROTY)/2. Also, the shot orthogonality component SKEW is expressed as SKEW=SROTY−STROX.

FIG. 7H is a diagram illustrating arrangement offset error among transfer patterns exposed by the reticles. The arrangement offset error is expressed as arrangement offset error X component OFSX and arrangement offset error Y component OFSY.

Note that the above wafer magnification component, wafer rotation component, and wafer orthogonality component are also referred to as "substrate magnification component", "substrate rotation component", and "substrate orthogonality component". Also, shot magnification component, shot rotation component, shot orthogonality component, and arrangement offset error are also referred to as "chip magnification component", "chip rotation component", "chip orthogonality component", and "chip shift component".

Of the above-described linear components of overlay error, the linear components illustrated in FIGS. 6A through 6F are linear components of overlay error caused by wafer position. Overlay error caused by wafer position includes overlay error caused by the wafer itself, and overlay error caused by the stage. Also, the linear components illustrated in FIGS. 7A through 7H are linear components of overlay error caused by the reticle (shot).

The inspection marks 1040*a*, 1041*a*, 1042*a*, 1040*b*, and 1041*b* for chip overlay are disposed at predetermined positions in the three sides of the peripheral edge of the exposure shot in the present embodiment. Also, the inspection marks 1040*a* and 1043*b* for detection of connection deviation between partial patterns are disposed at predetermined positions in one side that has been divided, in the exposure shot. The overlay inspection apparatus 1120 optically detects these inspection marks, and calculates each type of linear component of the positional deviation described above from the deviation amounts. The linear components are found by subjecting the deviation amount to regression analysis. The method of calculation itself is known, and accordingly description will be omitted here.

(Overlay Inspection Method)

Figure 8:
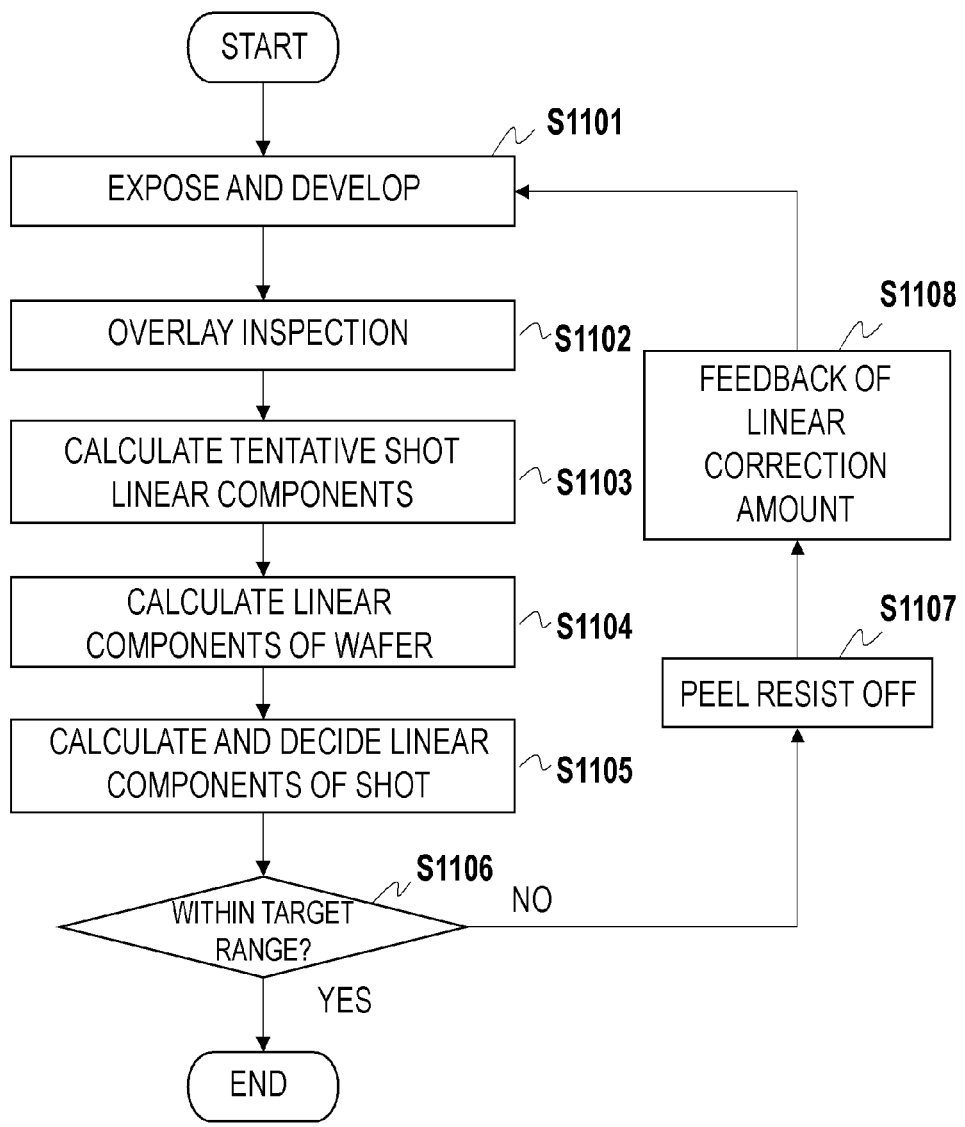
FIG. 8 is a flowchart illustrating a flow of overlay inspection according to the first embodiment.

Now, procedures of calculating the linear components from overlay error among chips and connecting error among partial patterns will be described with reference to FIG. 8. The following processing is performed by an exposing apparatus 1000 or overlay apparatus under commands from the host computer 1150. Part of the processing may be performed by the host computer 1150 or another computer.

In S1101, exposing and developing steps are performed, in which a pattern is formed in a resist layer on a wafer, using the exposing apparatus 1010-*i*. In the exposing and developing steps in S1101, split exposure is performed using reticles fabricated for each partial pattern. Specifically, first, the reticle 1001*a* is used to perform exposure of the partial pattern 1005*a*, and subsequently, the reticle 1001*b* is used to perform exposure of the partial pattern 1005*b*. The offset amount of the reticles at the shot center position is decided in advance when designing the reticle patterns, and is set such that the inspection marks for inspecting connecting deviation among the partial patterns are overlaid. The exposure stepping amount is decided in advance when designing the reticle patterns, and is set such that the adjacent shots overlay inspection marks are overlaid.

In S1102, connecting error among split shots (first information) and overlay error among chips (second information) are measured on the basis of the inspection marks on the wafer 1002, using the overlay inspection apparatus 1120. The connecting error among split shots is obtained on the basis of the positional relation of the inspection marks 1040a and 1043b provided in overlapping regions of the exposure shots 1006a and 1006b. The overlay error among chips is obtained on the basis of the positional relation of the inspection marks provided in overlapping regions of the exposure shots 1006a and 1006b and the adjacent shots 1007a, 1007b, 1008a, and 1008b.

In step S1102, a plurality of exposure shots are preferably set, and connecting error and overlay error is found for each of the exposure shots. Further, the exposure shots are preferably selected such that there is no imbalance of exposure shots in the wafer face, and more preferably, all shots are selected as exposure shots.

In S1103, regression analysis using the method of least squares is performed on the measurement values measured in S1102 (connecting error among split shots and overlay error among chips), thereby obtaining shot linear components. Note that the error measured in S1102 includes not only error caused by the reticle (shot components) but also error caused by wafer position (wafer components). Accordingly, the shot linear components obtained in S1103 are not accurate, and have tentative values. Hereinafter, the shot linear components obtained in S1103 may also be referred to as "tentative shot linear components".

In S1104, a value corresponding to the tentative shot linear components obtained in S1103 is subtracted from a value corresponding to the measurement values measured in S1102, and the resulting value is used to obtain wafer linear components.

In S1105, a value corresponding to the wafer linear components obtained in S1104 is subtracted from a value corresponding to the measurement values measured in S1102, and the resulting value is used to obtain shot linear components. Thus, shot linear components are obtained with high precision by excluding wafer linear components in this way.

In S1106, judgment is made whether or not the measurement values measured in S1102, the wafer linear components obtained in S1104, and the shot linear components obtained in S1105, are within a target range. The target range is a range where a tolerance margin is added to "0", which is the target value, for example. If within the target range, the step ends. If not within the target range, the flow advances to S1107.

In S1107, the resist on the wafer is peeled off by wet processing using a paint thinner, or ashing processing, to return the wafer to a state where the exposure step can be performed again.

In S1108, exposure operation offset amounts are set that correct the wafer linear components obtained in S1104 and the shot linear components obtained in S1105, and the flow advances to the exposure step S1101 again.

By repeating the above flow, the linear error components can be pinned down to "0", which is the target value.

The above flow will be described from a different perspective. In S1101, a circuit pattern is formed regarding one certain layer of a semiconductor device, by split exposure where a circuit pattern 1005 of the entire layer is divided into a plurality of partial patterns 1005a and 1005b. The entire wafer is exposed by a first exposure shot using the reticle 1001a (first reticle) having the partial pattern 1005a. Next, the entire wafer is exposed by a second exposure shot using the reticle 1001b (second reticle) having the partial pattern 1005b.

Assuming that the right-side adjacent shot 1008a is exposed following exposure of the exposure shot 1006a, the order of exposing is as follows. The right-side adjacent shot 1008a (third exposure shot) is exposed following exposure of the exposure shot 1006a (first exposure shot), and the exposure shot 1006b (second exposure shot) is exposed following exposure of the adjacent shot 1008a (third exposure shot).

In S1102, information representing the positional relation of inspection marks in a region where split shots are overlaid (first information) is acquired (measured). For example, the positional relation between the inspection mark 1040a in the right-side region of the exposure shot 1006a and the inspection mark 1043b in the left-side region of the exposure shot 1006b is measured as connecting error between the split shots. This error is equivalent to the first information representing the positional relation between inspection marks included in a pattern formed by the exposure shot 1006a (first exposure shot) and inspection marks included in a pattern formed by the exposure shot 1006b (second exposure shot).

In S1102, information representing the positional relation between inspection marks in a region where shots are overlaid among chips (second information) is also measured. For example, the positional relation between the inspection mark 1040b in the right-side region of the exposure shot 1006b and the inspection mark 1042a in the left-side region of the adjacent shot 1008a that is adjacent to the right side of the exposure shot 1006b is measured as overlay error among chips. This error is equivalent to the second information representing the position relation of inspection marks included in a pattern formed by the exposure shot 1006b (second exposure shot) and inspection marks included in a pattern formed by the exposure shot 1008a (third exposure shot). Although only the right side of the exposure shot 1006b has been described here, information representing the positional relation between inspection marks is measured in the same way for the upper side and lower side of the exposure shot 1006b, and the upper side, left side, and lower side of the exposure shot 1006a.

The measurement in S1102 is performed by the overlay inspection apparatus 1120. Specifically, the computer 1331 measures information representing the positional relation of inspection marks by performing image processing on the image signals from the CCD camera 1330.

In S1103, linear components of an error caused by the reticle are tentatively derived by applying regression analysis (method of least squares) on overlay error among split shots (first information) and overlay error among chips (second information). In S1104, linear components of an error caused by wafer position are derived by subtracting values corresponding to the tentatively-derived linear components of an error caused by the reticle from values corresponding to overlay error among split shots and overlay error among chips. In S1105, linear components of an error caused by the reticle are derived by subtracting values corresponding to the linear components of an error caused by the wafer from values corresponding to the overlay error among split shots (first information) and overlay error among chips (second information). The overlay error or linear components may be used without change as the values corresponding to the overlay error or linear components, or values obtained from the overlay error or linear components may be used.

The deriving in S1103 may be performed by the computer 1331 of the overlay inspection apparatus 1120, or may be performed by the host computer 1150. Although an example is illustrated here in which the linear components of an error are derived using regression analysis, this is not limiting, and may be derived by executing processing using a model that has been trained through machine learning. In a case of constructing a model that has been trained through machine learning, overlay error among split shots (first information) and overlay error among chips (second information) is used as input data. Known information relating to linear components of an error caused by the wafer, and known information relating to linear components of an error caused by the reticle, are used as training data. The correlative relation between a plurality of pieces of input data and training data corresponding to each of the plurality of pieces of input data is learned by machine learning. Thus, a trained model can be constructed. Information relating to linear components of an error caused by the wafer and information relating to linear components of an error caused by the reticle can be acquired as input data, by inputting overlay error among split shots (first information) and overlay error among chips (second information) to the trained model.

Specific examples of algorithms for machine learning include the nearest neighbor method, naive Bayesian method, decision trees, support-vector machines, and so forth. Also included is deep learning where neural networks are used to self-generate features and associated weighting coefficients for learning. Those of the above algorithms that are usable may be appropriately used and applied to the present embodiment. A graphics processing unit (GPU) is able to perform computation effectively by processing a greater amount of data in parallel, and accordingly performing processing using a GPU is effective in a case of performing learning a plurality of times using a learning model such as in deep learning. Accordingly, a GPU is used in addition to the CPU for processing by the computer 1331 or the host computer 1150. Specifically, in a case of executing a learning program including a learning mode, learning is performed by the CPU and the GPU collaboratively performing computation. Note that an arrangement may be made where computation is performed by just one of the CPU and GPU for processing by the computer 1331 or the host computer 1150.

Also, the deriving is not limited to machine learning, and rule-based processing such as a lookup table (LUT) or the like may be used. In this case, the relation between input data and output data is created as an LUT in advance, for example. The created LUT may be stored in memory of the computer 1331 or the host computer 1150. In a case of performing deriving processing, output data can be acquired by referencing the stored LUT. That is to say, the LUT performs the processing of the processing unit by collaboratively operating with a CPU, GPU, or the like, as a program for performing processing equivalent to that of the processing unit.

The above embodiment may also be realized by processing of supplying a program that realizes at least one function of the above embodiment to a system or a device via a network or a storage medium, and a computer of that system or device reading out and executing the program. The computer has one or a plurality of processors or circuits, and may include a network of a plurality of separate computers or a plurality of separate processors or circuits to read out and execute computer-executable commands. The processors or circuits may include a CPU, a microprocessor unit (MPU), a GPU, an application-specific integrated circuit (ASIC), or a field programmable gate array (FPGA). The processors or circuits may also include a digital signal processor (DSP), a data flow processor (DFP), or a neural processing unit (NPU).

Thus, according to the present embodiment, in a case of performing split exposure using a plurality of reticles without performing alignment as to the base, as in exposure of the first layer, linear components of each overlay error caused by shot and wafer positions can be obtained. By setting the error components thereof to "0", overlaying among partial patterns and among chips can be performed with precision over the entirety of shots.

Although not taken into consideration in the above, it is conceivable that nonlinear components will occur in the exposing apparatus due to distortion of the projection lens or the like. Nonlinear components cannot be corrected at the exposing apparatus, and if the target value of linear error components is set to zero, there are cases where the nonlinear error components will locally exacerbate chip overlay and connection deviation among partial patterns. Accordingly, in cases where the effects of an error of nonlinear components is great, the linear component error does not have to be pinned down to zero. Specifically, the target range in S1106 is set to a value where a tolerance margin range is added to a nonzero target value and correction is performed, so that linear components somewhat remain. There are cases where this will improve chip overlay and connection deviation among partial patterns for the overall shot. In this case, a selection will be made either to set correction target values for linear components and perform management and correction as described above, or to perform thorough maintenance management or renovation of the exposing apparatus.

Second Embodiment

In a case of manufacturing a semiconductor device over a range that is broader than a range that the exposing device is capable of rendering, there is a method of performing desired patterning by connecting exposure. Generally, inspection marks disposed at four corners of the exposure region (shot) are used to measure the amount of positioning deviation as to the base when performing exposure processing. Feedback is then performed of the shift component, rotation component, and magnification component based on the measured deviation amount, thereby improving precision of positioning as to the base (alignment precision) in the next exposure.

In single-batch exposure following connecting exposure, in a case of measuring the inspection marks disposed at the four corners of the single-batch exposure region and performing feedback, there is a problem that positioning precision in single-batch exposure following connecting exposure is poor in the proximity of the continuing portions.

The present embodiment realizes a manufacturing method for a semiconductor device in which high-precision position can be realized in a single-batch exposure step following a connection exposure step.

The semiconductor device manufacturing method according to the present embodiment will be described below, with reference to FIGS. 10A through 18D. Note that the semiconductor device according to the present embodiment is manufactured using the lithography system 1110 illustrated in FIG. 1.

(Measurement of Overlay Error)

Figure 10A:
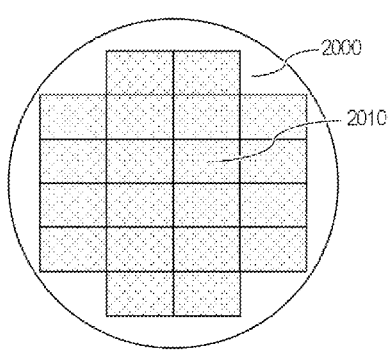
FIGS. 10A through 10E are diagrams illustrating chip layout and inspection marks according to a second embodiment.
Figure 10B:
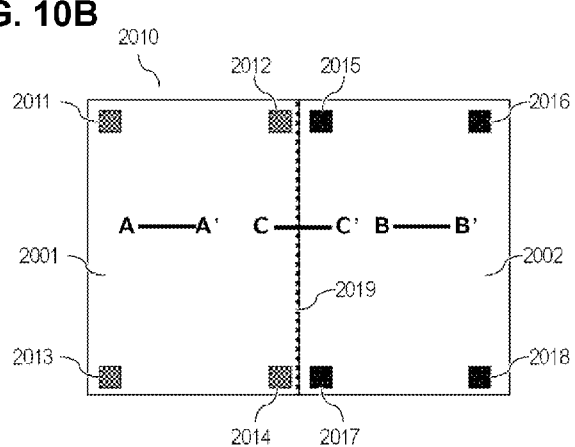

FIG. 10A is a diagram illustrating a chip layout of a semiconductor device according to the present embodiment. A plurality of chips 2010 are arrayed on a wafer 2000 and manufactured. FIG. 10B is an enlarged view of a chip 2010 illustrated in FIG. 10A. A great number of layers of circuit patterns, omitted from illustration, are arrayed in the chip 2010, having desired functions of a semiconductor device. The circuit patterns of this chip 2010 are patterned by the exposing apparatus. A wafer coated with resist is exposed by the exposing apparatus and developed, following which desired circuit patterns can be obtained by ion injection, etching, embedding, and so forth.

The chip 2010 has layers patterned by connecting exposure, and layers patterned by single-batch exposure. For example, fine patterns are patterned by an exposing apparatus such as a stepper that is capable of highly-precise patterning, and in a case where the chip 2010 is larger than the rendering range of the exposing apparatus, for example, exposure is performed by connecting exposure at this time. That is to say, one chip 2010 is manufactured by performing exposure processing twice, for an exposure region 2001 and an exposure region 2002. Hereinafter, splitting the entire exposure pattern of one chip into a plurality of regions, and forming one layer within one chip by a plurality of times of exposure processing in which the plurality of partial patterns are connected, will be described as "connecting exposure". Also, in a case where high-precision patterning is not necessary, for example, exposure processing of both regions of the exposure region 2001 and the exposure region 2002 can be performed en bloc by an exposing apparatus that has a broader rendering range, for example. Hereinafter, patterning of one layer on one chip by exposure processing being performed just one time will be described as "single-batch exposure".

In the present embodiment, inspection mark 2011 through inspection mark 2018 arranged within a peripheral region of each of the exposure region 2001 and the exposure region 2002 are inspection marks for overlay inspection. In particular, the inspection mark 2011 through inspection mark 2018 are arranged at the four corners of the exposure regions 2001 and 2002 in the present embodiment. Note that the inspection marks 2011, 2013, 2016, and 2018 are the four corners of a region where the exposure region 2001 and the exposure region 2002 are combined, i.e., of the original pattern (desired pattern). These inspection marks are used in overlay inspection as to the base, when manufacturing the chip 2010. In a case of performing single-batch exposure processing following performing connecting exposure processing, for example, the inspection marks are used for measuring positioning deviation (alignment deviation) between the circuit pattern formed in the preceding connecting exposure processing and the following single-batch exposure processing.

The inspection mark 2011 through the inspection mark 2014 are provided in the proximity of the four corners of the exposure region 2001, and the inspection mark 2015 through the inspection mark 2018 are provided in the proximity of the four corners of the exposure region 2002. Note that the inspection marks do not need to be in the corners of the exposure regions, and it is sufficient to be in each of regions where the exposure region is divided equally into four in the up-and-down and the right-and-left directions. It is sufficient for the inspection marks to be within the exposure region 2001 and the exposure region 2002, and may be arranged in the scribe lines, for example or may be arranged within the semiconductor device. In the following description, the inspection marks and positions where the inspection marks are provided may be denoted by the same reference signs. For example, a position where the inspection mark 2011 is provided is also referred to as "mark position 2011". A plurality of inspection marks formed in the same exposure shot as the inspection mark 2011 may be collectively referred to as an "inspection mark group". The inspection mark group including the inspection mark 2011 includes the inspection marks 2013 and 2014, the inspection mark 2012, the inspection marks used in inspection described in the first embodiment, and so forth. In the same way, a plurality of inspection marks formed by the same exposure shot by which the inspection mark 2015 is formed may be collectively referred to as an "inspection mark group". The inspection mark group including the inspection mark 2015 includes the inspection marks 2016 and 2018, the inspection mark 2017, the inspection marks used in inspection described in the first embodiment, and so forth.

The exposure region of single-batch exposure is the region of the exposure region 2001 and the exposure region 2002 combined. The exposure pattern of single-batch exposure has each of the inspection marks 2011 through 2018.

Figure 10C:
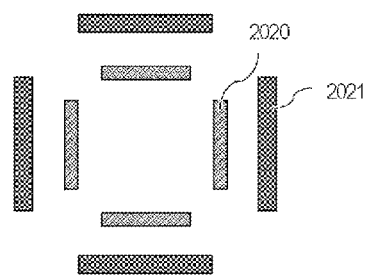
Figure 10D:
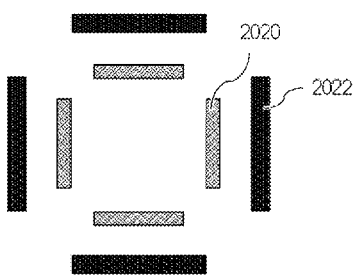

FIG. 10C illustrates each of the positions of the inspection mark 2011 through inspection mark 2014, and FIG. 10D the positions of the inspection mark 2015 through the inspection mark 2018. Mark 2021 and mark 2022 are marks patterned by connecting exposure, and are formed through exposing, developing, and etching processing. Mark 2020 is a mark patterned by single-batch exposure, and is pattered for all of the inspection mark 2011 through inspection mark 2018. The marks 2020 through 2022 are each rendered vertically and horizontally symmetrically. The mark 2020 is formed by patterning resist, for example.

Following patterning the resist, deviation between the center of gravity of the mark 2021 and the center of gravity of the mark 2020, i.e., the positional deviation (alignment deviation) is measured using the overlay inspection apparatus 1120 or the like. The overlay inspection apparatus 1120 measures the positional deviation for the inspection marks 2011 through 2018 regarding five chips, which are chip 2002 through chip 2006 illustrated in FIG. 10E, for example. Measurement of positional deviation may be performed on chips of other combinations as well, and may be performed on all chips. From the positional deviation of the total of 40 points of inspection marks 2011 through 2018 of the five chips of the chip 2002 through the chip 2006, various types of linear components of positioning error are obtained using known regression analysis. The linear components of positioning error have been described with reference to FIGS. 6A through 6F and 7A through 7H, and accordingly will be described in brief.

Figure 10E:
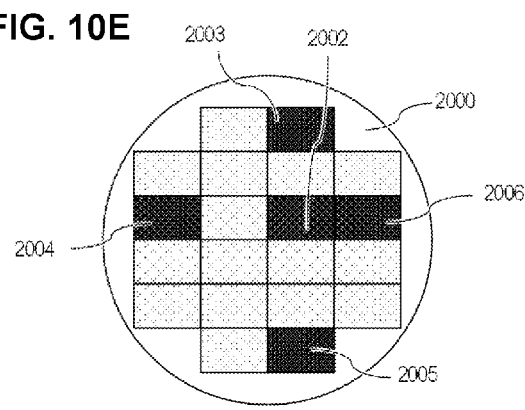

In order to more accurately calculate the wafer magnification component, wafer rotation component, and wafer shift component, alignment is preferably measured including chips further on the peripheral side. Chips on the outermost periphery in the up-and-down and the right-and-left directions are preferably measured, as illustrated in FIG. 10E, for example.

Figure 11A:
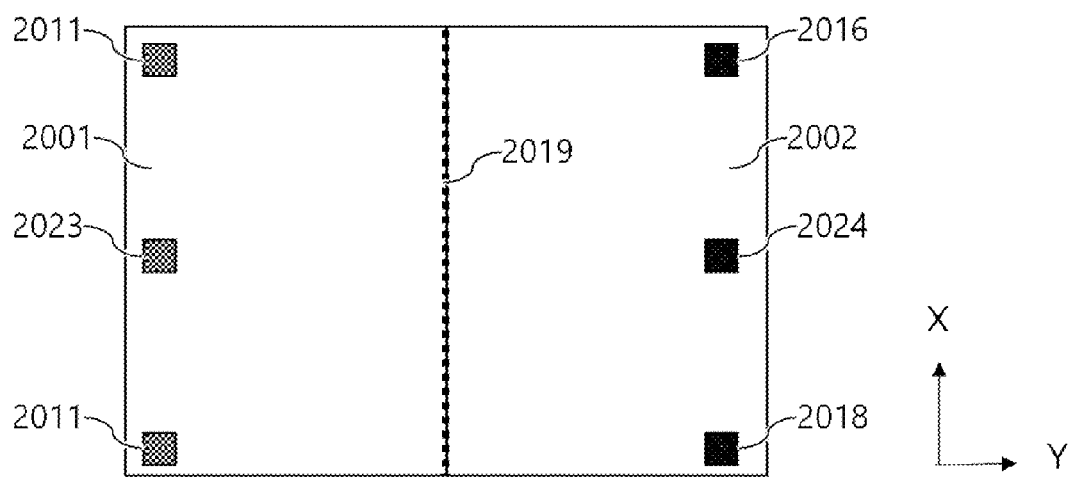
FIGS. 11A and 11B are diagrams for describing chip layout according to the second embodiment.

Also, if marks are arranged on a straight line with regard to one connecting exposure region as illustrated in FIG. 11A, the chip magnification component cannot be obtained regarding a direction perpendicular to this straight line. For example, a case will be considered where at least three marks are arranged on a straight line in each of the exposure regions 2001 and 2002, as with the inspection marks 2011, 2013, 2023, 2016, 2018, and 2024 illustrated in FIG. 11A. In this case, the chip magnification component in the straight line direction of the mark arrangement, i.e., the Y direction here, can be obtained by regression analysis, but the chip magnification component in the perpendicular direction to the mark arrangement, i.e., the X direction here, cannot be calculated by regression analysis.

Figure 11B:
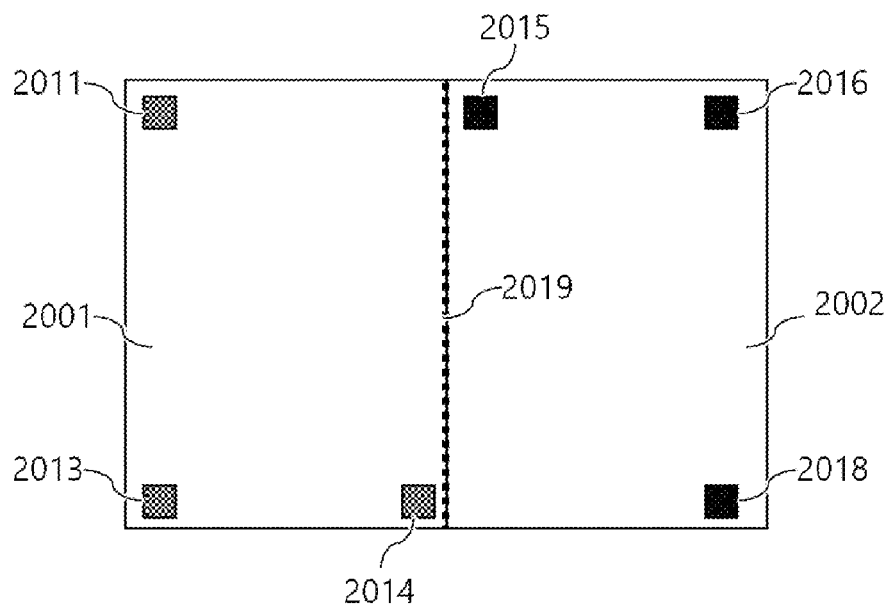

Accordingly, there is a need to provide at least three marks at positions not arrayed in a straight line, for each of the exposure regions 2001 and 2002 at least, as illustrated in FIG. 11B. In other words, the exposure regions 2001 and 2002 each have at least first through third inspection marks, with a straight line connecting the first inspection mark and the second inspection mark intersecting a straight line connecting the second inspection mark and the third inspection mark, i.e., these lines are not parallel. For example, in exposure region 2001, the inspection marks 2014, 2013, and 2011 respectively correspond to the first through third inspection marks, and in exposure region 2002, the inspection marks 2015, 2016, and 2018 respectively correspond to the first through third inspection marks. As long as this condition is satisfied, each exposure region may have at least four inspection marks, as illustrated in FIG. 10B. Also, as long as this condition is satisfied, at least three inspection marks may be disposed arrayed in a straight line in each exposure region. Note that in an exposure region for single-batch exposure, inspection marks may be disposed at the positions corresponding to the marks in split exposure regions. That is to say, three inspection marks corresponding to each of the three inspection marks 2014, 2013, and 2011, and three inspection marks corresponding to each of the three inspection marks 2015, 2016, and 2018 for a total of six inspection marks, may be disposed in the exposure region for single-batch exposure. Positional relation for calculating positional deviation can be measured among the corresponding inspection marks. Note however, that the number of inspection marks formed in the exposure region for single-batch exposure may be smaller than the number of inspection marks formed in the exposure regions for split exposure. For example, the number of inspection marks formed in the exposure region for single-batch exposure may be just one. For example, the singular inspection mark formed in the exposure region for single-batch exposure may be used as a point of origin to measure the relative positional relations as to the inspection marks 2014, 2013, and 2011 and the inspection marks 2015, 2016, and 2018 formed in split exposure.

By arranging at least three marks not arrayed in a straight line in each exposure region, chip magnification, chip rotation, and chip shift can be accurately corrected in the X direction and the Y direction. Also, in order to obtain the deviation amount of the chip magnification component and the chip rotation component more accurately, the marks are preferably provided as far at the outermost periphery region as reasonably possible in the exposure region, such as in the proximity of the four corners, for example.

In a case where the positional deviation amount measured using the above-described inspection marks is greater than the desired positioning precision, the patterned resist is removed, and resist coating, exposure, and developing are performed again. At this time, parameters for when performing exposure are adjusted at the exposing apparatus on the basis of the results regarding positional deviation measured earlier, such that the root mean square of positional deviation at each inspection mark measured is smallest. That is to say, the exposing apparatus such as a stepper or the like has a mechanism that is able to correct magnification component, rotation component, and shift component, and performs exposure processing with a coordinates system that is corrected by amounts corresponding to the various types of deviation amounts found earlier.

Also, in a case where the positional deviation amount is smaller than the desired value, the exposing apparatus performs exposure processing on a separate wafer to be processed next, with a coordinates system that is corrected by the various types of deviation amounts found earlier. Thus, deviation in alignment due to change in the exposing apparatus over time, and so forth, can be appropriately corrected, thereby enabling stable manufacturing of semiconductor devices.

(Structure of Semiconductor Device)

Figure 12A:
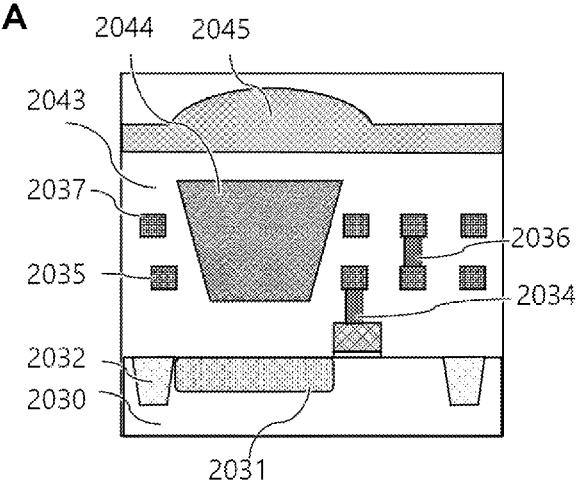
FIGS. 12A through 12C are diagrams illustrating a configuration of a semiconductor device according to the second embodiment.
Figure 12B:
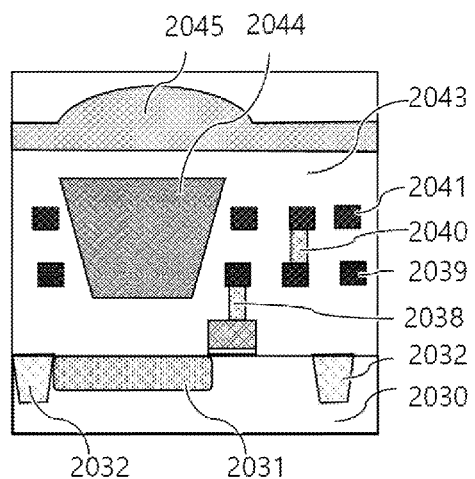
Figure 12C:
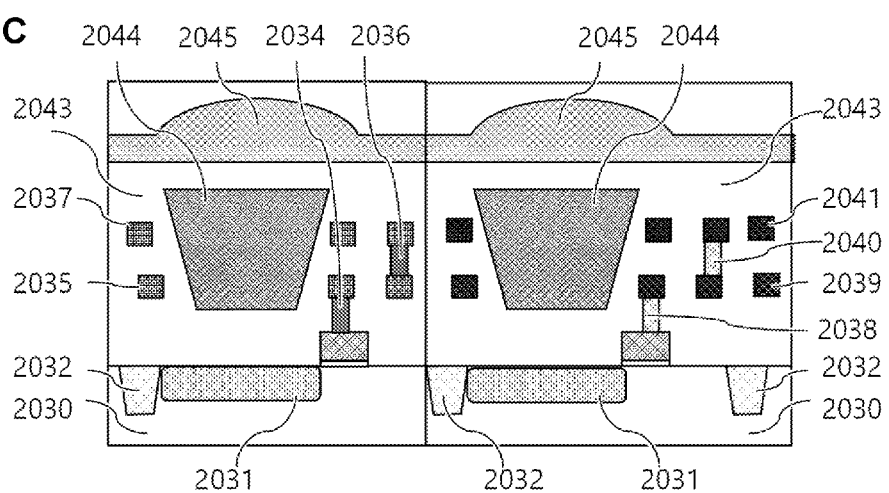

FIGS. 12A through 12C are diagram illustrating cross-sections of the semiconductor device manufactured according to the present embodiment. The semiconductor device may be an image-capturing device, for example. The materials, the forming methods, and so forth of the components are the same as those of known semiconductor devices, and accordingly detailed description will be omitted.

FIG. 12A is a cross-sectional view taken along A-A' in FIG. 10B, FIG. 12B is a cross-sectional view taken along B-B' in FIG. 10B, and FIG. 12C is a cross-sectional view taken along C-C' in FIG. 10B. This semiconductor device is manufactured by forming a photodiode portion 2031 that performs photoelectric conversion, an isolation structure 2032 where insulating material is embedded, and a transistor gate 2033 are formed on a substrate 2030 made of silicon, for example. Also, in an interlayer insulating film 2043 on the substrate 2030 are formed a contact via 2034, wiring 2035, a through-hole via 2036, and wiring 2037, patterned in the exposure region 2001 illustrated in FIG. 10B by connecting exposure. In the same way, a contact via 2038, wiring 2039, a through-hole via 2040, and wiring 2041 are formed, patterned in the exposure region 2002 illustrated in FIG. 10B by connecting exposure. The semiconductor device is also provided with inner lenses 2045 to collect light, light guides 2044 to prevent stray light from the collected light, color filters that are omitted from illustration, and microlenses that are omitted from illustration. The contact via 2034, the wiring 2035, the through-hole via 2036, the wiring 2037, the contact via 2038, the wiring 2039, the through-hole via 2040, and the wiring 2041 are formed on the basis of patterns exposed by connecting exposure. Layers other than these and the interlayer insulating film 2043 that are illustrated are formed on the basis of patterns exposed by single-batch exposure. Optical members such as the color filters, microlenses, and so forth, are preferably formed by single-batch exposure.

Connecting exposure is performed by an exposing apparatus that uses a KrF excimer laser or ArF excimer laser, for example, as the light source. Single-batch exposure is performed by an exposing apparatus that uses a KrF excimer laser or i-line emission from an ultra-high-pressure mercury lamp as the light source, and that has a larger rendering region than the exposing apparatus for connecting exposure.

(Manufacturing Method)

An example of manufacturing the semiconductor device illustrated in FIGS. 12A through 12C will be described below with reference to FIGS. 13A and 13B, and 14A and 14B. Points regarding improving overlay precision will be described here. In the following steps, a step of forming patterns using connecting exposure corresponds to a first formation step, and a step of forming patterns using single-batch exposure processing corresponds to a second formation step.

<1. Formation of Isolation Structure by Single-Batch Exposure>

First, following coating the substrate 2030 with resist, exposure by single-batch exposure, developing, etching, resist removal, and embedding of insulating material are performed, thereby forming the isolation structure 2032. At this time, marks 2130 and 2132 illustrated in FIG. 13A are formed arrayed at the same time, as the inspection marks 2011 and 2013 illustrated in FIG. 10B. Also, marks 2130 and 2132 illustrated in FIG. 13B are formed arrayed at the same time, as the inspection marks 2016 and 2018.

<2. Formation of Photodiode Portion by Single-Batch Exposure>

Next, the wafer including the substrate 2030 on which the isolation structure 2032 has been formed is coated with resist, exposure by single-batch exposure, developing, and ion injection are performed, thereby forming the photodiode portion 2031. Following developing, mark 2231 illustrated in FIG. 13A is formed as each of the inspection marks 2011 and 2013 illustrated in FIG. 10B. Also, mark 2231 illustrated in FIG. 13B is formed at the same time, as each of the inspection marks 2016 and 2018.

Thereafter, alignment deviation (overlay deviation) between the mark 2130 and the mark 2231 is measured by the overlay inspection apparatus 1120. In a case where the alignment deviation between the mark 2130 and the mark 2231 at each of the measurement points is not more than a desired value, ion injection is subsequently performed. Also, the deviation amounts of the various types of error components described above are corrected for the next wafer to be subjected to processing of the same step, on the basis of the measurement results of alignment deviation, and exposure processing is performed using a corrected coordinates system. Conversely, in a case where the alignment deviation is at least the desired value, ion injection is not performed. Instead, the resist is removed briefly, and coating with resist, exposing, developing, and measurement of alignment deviation are performed again. When performing exposing at this time, exposure processing is performed using the corrected coordinates system in which the amount of deviation of the various types of error components have been corrected, as described above. Coating with resist, exposing, developing, and measurement of alignment are repeated until the alignment deviation is not more than the desired value. After the alignment deviation has come to be not more than the desired value and ion injection ends, the mark 2231 illustrated in FIGS. 13A and 13B is removed at the same time due to performing resist removal.

<3. Formation of Transistor Gate by Single-Batch Exposure>

Figure 14A:
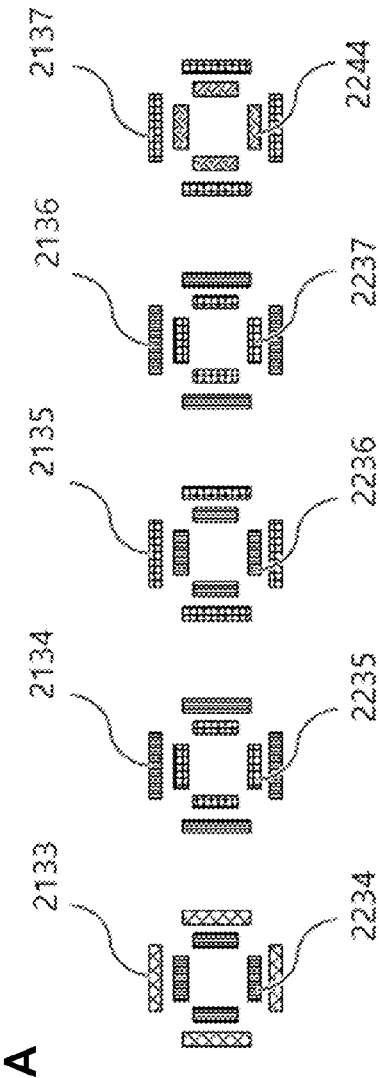
FIGS. 14A and 14B are diagrams for describing inspection marks formed in the second embodiment.
Figure 14B:
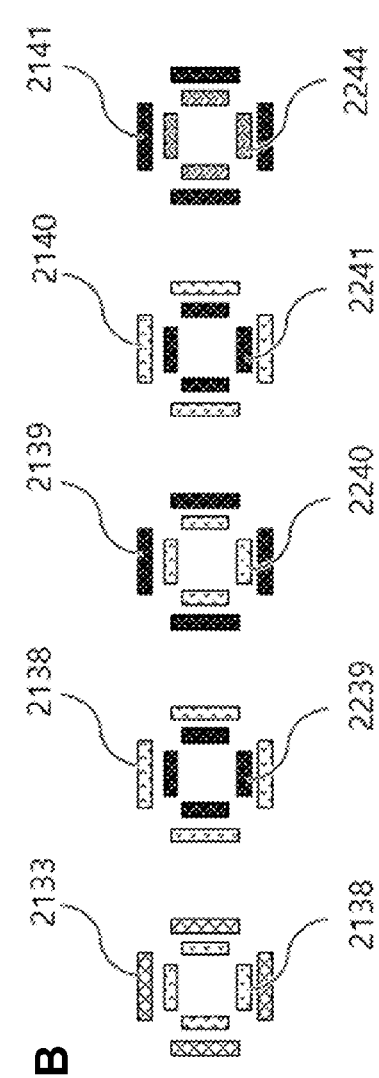

Next, a film that can serve as a gate insulating film and a film that can serve as a gate electrode are formed, coating with resist, exposing by single-batch exposure, developing, etching, and resist removal are performed, thereby forming the transistor gate 2033. Following developing, marks 2133 and 2233 illustrated in FIGS. 13A and 14A are each formed at the same time, as each of the inspection marks 2011 through 2014 illustrated in FIG. 10B. Also, the marks 2133 and 2233 illustrated in FIGS. 13B and 14B are each formed at the same time, as each of the inspection marks 2016 through 2018.

Thereafter, alignment deviation of the mark 2132 and the mark 2233 is measured by the overlay inspection apparatus 1120. The processing following measuring alignment deviation is the same as above. After the alignment deviation becomes not more than the desired value and the etching processing ends, resist removal is performed. At the time of etching processing, the mark 2133 and the mark 2233 illustrated in FIGS. 13A and 13B are also etch-processed at the same time, and accordingly the shapes of the mark 2133 and the mark 2233 remain even after resist removal is performed.

<4. Formation of Contact Via by Connecting Exposure>

Next, the interlayer insulating film 2043 is formed up to the lower faces of the wiring 2035 and the wiring 2039. Thereafter, coating with resist, exposing by connecting exposure, developing, etching, resist removal, and embedding of plugs are performed, thereby forming the contact via 2034 and the contact via 2038. Following developing, marks 2134 and 2234 illustrated in FIG. 13A are formed, as each of the inspection marks 2011 and 2013 illustrated in FIG. 10B, and the marks 2134 and 2234 illustrated in FIG. 14A are formed, as each of the inspection marks 2012 and 2014, at the same time. Also, marks 2138 and 2238 illustrated in FIG. 13B are formed, as each of the inspection marks 2016 and 2018, and the marks 2138 and 2238 illustrated in FIG. 14B are formed, as each of the inspection marks 2015 and 2017, at the same time.

Thereafter, the alignment deviation between the mark 2133 and the mark 2234, and the alignment deviation between the mark 2133 and the mark 2238 are each measured by the overlay inspection apparatus 1120.

In a case where the alignment deviation is not more than the desired value in both of the exposure region 2001 and the exposure region 2002, etching and embedding of plugs is then performed. Also, correction processing of adjusting the exposure position is performed so that the alignment deviation will be smaller in the same step for processing the next wafer, which is a different wafer, to be subjected to processing. Specifically, the coordinates system is corrected on the basis of the measurement results of alignment deviation between the mark 2133 and the mark 2234 illustrated in FIGS. 13A and 14A. Exposure processing of the next wafer is performed using the corrected coordinates system. In the same way, with regard to exposure of the exposure region 2002, exposure processing is performed using the coordinates system corrected on the basis of the measurement results of alignment deviation between the mark 2133 and the mark 2238 illustrated in FIGS. 13B and 14B.

Conversely, in a case where the alignment deviation is at least the desired value in one or both of the exposure region 2001 and the exposure region 2002, etching processing is not performed. Instead, the resist is removed briefly, and coating with resist, exposing, developing, and measurement of alignment deviation are performed again. When performing exposing again, exposure processing is performed using the corrected coordinates system on the basis of the measurement results of the alignment deviation described above. Coating with resist, exposing, developing, and measurement of alignment are repeated until the alignment deviation in both exposure regions 2001 and 2002 is not more than the desired value.

After the etching processing ends, resist removal is performed. At the time of etching processing, the marks 2134, 2234, 2138, and 2238 are also etch-processed at the same time, and accordingly the shapes of these marks 2134, 2234, 2138, and 2238 remain even after resist removal is performed.

<5. Formation of Wiring by Connecting Exposure>

Next, the interlayer insulating film 2043 is formed up to the upper faces of the wiring 2035 and the wiring 2039. Thereafter, coating with resist, exposing by connecting exposure, developing, etching, resist removal, and embedding of wiring are performed, thereby forming the wiring 2035 and the wiring 2039. Following developing, marks 2135 and 2235 illustrated in FIG. 13A are formed, as each of the inspection marks 2011 and 2013 illustrated in FIG. 10B, and marks 2135 and 2235 illustrated in FIG. 14A are formed, as each of the inspection marks 2012 and 2014, at the same time. Also, marks 2139 and 2239 illustrated in FIG. 13B are formed, as each of the inspection marks 2016 and 2018, and marks 2139 and 2239 illustrated in FIG. 14B are formed, as each of the inspection marks 2015 and 2017, at the same time.

Thereafter, alignment deviation between the mark 2134 and the mark 2235, and alignment deviation between the mark 2138 and the mark 2239, are each measured by the overlay inspection apparatus 1120. The processing following measuring alignment deviation is the same as above. After the etching processing ends, resist removal is performed. At the time of etching processing, the marks 2135, 2235, 2139, and 2239 are also etch-processed at the same time, and accordingly the shapes of the marks 2135, 2235, 2139, and 2239 remain even after resist removal is performed.

<6. Formation of Through-Hole Vias by Connecting Exposure>

Next, the interlayer insulating film 2043 is formed up to the lower faces of the wiring 2037 and the wiring 2041. Thereafter, coating with resist, exposing by connecting exposure, developing, etching, resist removal, and embedding of plugs are performed, thereby forming the through-hole via 2036 and the through-hole via 2040. Following developing, marks 2136 and 2236 illustrated in FIG. 13A are formed, as each of the inspection marks 2011 and 2013 illustrated in FIG. 10B, and the marks 2136 and 2236 illustrated in FIG. 14A are formed, as each of the inspection marks 2012 and 2014, at the same time. Also, marks 2140 and 2240 illustrated in FIG. 13B are formed, as each of the inspection marks 2016 and 2018, and the marks 2140 and 2240 illustrated in FIG. 14B are formed, as each of the inspection marks 2015 and 2017, at the same time. Subsequent processing is the same as that at the time of forming the wiring 2035 and 2039 earlier, and accordingly detailed description will be omitted.

<7. Formation of Wiring by Connecting Exposure>

Next, the interlayer insulating film 2043 is formed up to the upper faces of the wiring 2037 and the wiring 2041. Thereafter, coating with resist, exposing by connecting exposure, developing, etching, resist removal, and embedding of wiring are performed, thereby forming the wiring 2037 and the wiring 2041. Following developing, marks 2137 and 2237 illustrated in FIG. 13A are formed, as each of the inspection marks 2011 and 2013 illustrated in FIG. 10B, and marks 2137 and 2237 illustrated in FIG. 14A are formed, as each of the inspection marks 2012 and 2014, at the same time. Also, marks 2141 and 2241 illustrated in FIG. 13B are formed, as each of the inspection marks 2016 and 2018, and marks 2141 and 2241 illustrated in FIG. 14B are formed, as each of the inspection marks 2015 and 2017, at the same time. Subsequent processing is the same as that at the time of forming the wiring 2035 and 2039 earlier, and accordingly detailed description will be omitted.

<8. Formation of Light Guide by Single-Batch Exposure>

Next, the interlayer insulating film 2043 is formed up to the upper face of the light guide (waveguide) 2044. Thereafter, coating with resist, exposing by single-batch exposure, developing, etching, resist removal, and embedding of light guide are performed, thereby forming the light guide 2044. Following developing, marks 2144 and 2244 illustrated in FIG. 13A are formed, as each of the inspection marks 2011 and 2013 illustrated in FIG. 10B, and the marks 2144 and 2244 illustrated in FIG. 14A are formed, as each of the inspection marks 2012 and 2014, at the same time. Also, marks 2144 and 2244 illustrated in FIG. 13B are formed, as each of the inspection marks 2016 and 2018, and the marks 2144 and 2244 illustrated in FIG. 14B are formed, as each of the inspection marks 2015 and 2017, at the same time.

Thereafter, alignment deviation of the entire chip 2010 is measured by the overlay inspection apparatus 1120, using the mark 2137 and the mark 2244 illustrated in FIGS. 13A and 14A, and the mark 2141 and the mark 2244 illustrated in FIGS. 13B and 14B. The alignment deviation of the entire chip is alignment deviation in the exposure region of single-batch exposure, and corresponds to information representing the positional relation of patterns formed by connecting exposure and patterns formed by single-batch exposure.

In a case where the alignment deviation is not more than the desired value (case of satisfying the first condition), etching processing of the wafer is then performed, using the formed resist pattern. Also, correction processing of adjusting the exposure position so that the alignment deviation will be smaller in the same step for processing the next wafer, which is a different wafer, to be subjected to processing. Specifically, the coordinates system of the exposure apparatus is corrected on the basis of the measurement results of alignment deviation, and exposure processing is performed using the coordinates system after correction.

Conversely, in a case where the alignment deviation is at least the desired value (case of satisfying the second condition), etching processing of the wafer using the formed resist pattern is not performed. Instead, the resist pattern is removed briefly, and coating with resist, exposing, developing, and measurement of alignment deviation are performed again. When performing exposing at this time, exposure processing is performed using the corrected coordinates system, as described above. Coating with resist, exposing, developing, and measurement of alignment are repeated until the alignment deviation is not more than the desired value.

After the etching processing ends, resist removal is performed. At the time of etching processing, the marks 2144 and 2244 are also etched at the same time, and accordingly the shapes of the marks 2144 and 2244 remain even after resist removal is performed.

<9. Formation of Inner Lens by Single-Batch Exposure>

Next, the interlayer insulating film 2043 is formed up to the lower face of the inner lens 2045. Subsequently, a film that can serve as material of the inner lens is formed. Thereafter, coating with resist, single-batch exposure, developing, etching, and resist removal are performed, thereby forming the inner lens 2045. In order to obtain a spherical surface shape like that of an inner lens, gradient exposure may be performed at the time of exposure, or the patterned resist may be imparted a curvature by reflow or the like following developing. Following developing, mark 2245 illustrated in FIG. 13A is formed as each of the inspection marks 2011 and 2013 illustrated in FIG. 10B, and the mark 2245 illustrated in FIG. 13B is formed as each of the inspection marks 2012 and 2014, at the same time. Subsequent processing is the same as that at the time of forming the transistor gate 2033 earlier, and accordingly detailed description will be omitted.

Finally, color filters and microlenses are formed, thereby yielding the semiconductor device using the manufacturing method according to the present embodiment.

Advantageous Effects of Present Embodiment

Figure 15A:
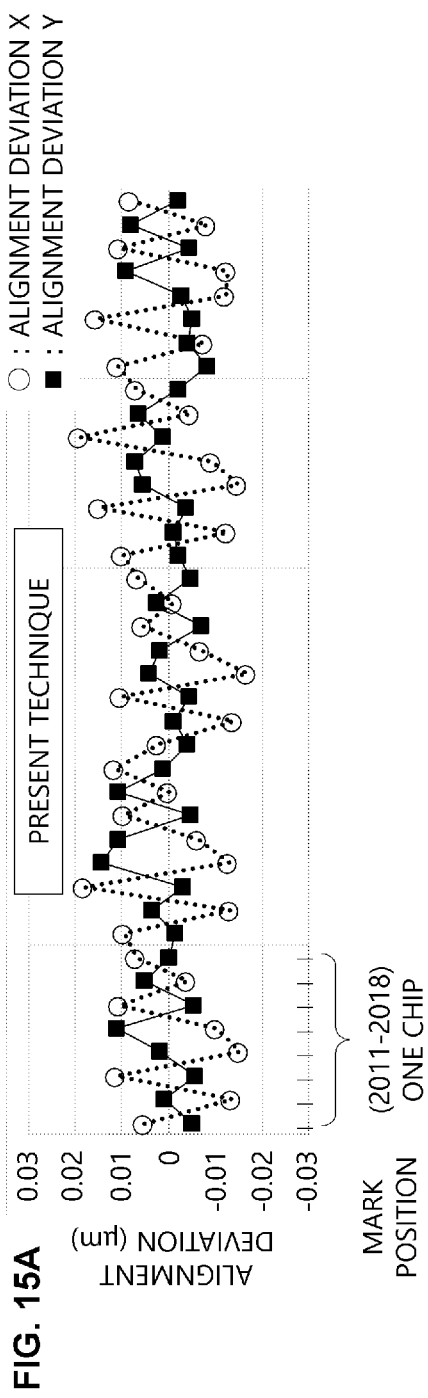
FIGS. 15A and 15B are diagrams for describing advantageous effects of the second embodiment.
Figure 15B:
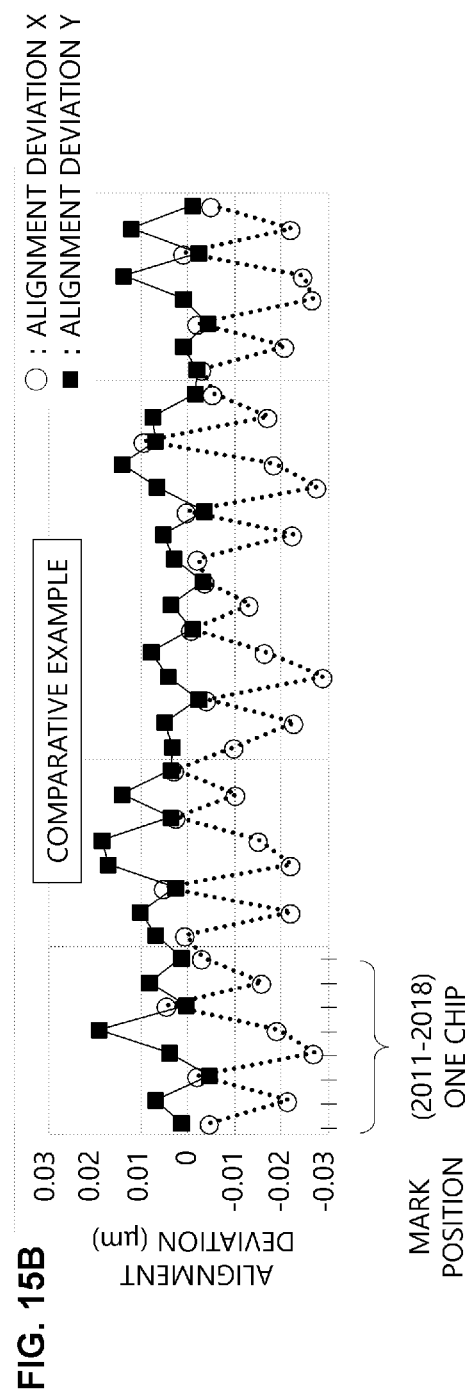

FIGS. 15A and 15B are diagrams illustrating the results of measuring alignment deviation when performing single-batch exposure, thereafter repeating connecting exposure a plurality of times, and then performing single-batch exposure again. Alignment measurement results of when forming the wiring 2037 and the wiring 2041 at the time of manufacturing the semiconductor device illustrated in FIGS. 12A through 12C, and thereafter performing single-batch exposure to form the light guide 2044, are illustrated, for example. FIG. 15A illustrates alignment deviation measurement results at the time of performing single-batch exposure by the method according to the present embodiment. That is to say, FIG. 15A illustrates the results of a case of measuring alignment deviation from the inspection marks 2011 through 2018 illustrated in FIG. 10B, and performing exposure processing on the wafer to be processed next using the coordinates system after correction. Conversely, FIG. 15B illustrates measurement results of a case of performing single-batch exposure by a method according to a reference example. In the reference example, alignment deviation is measured of the inspection marks 2011, 2013, 2016, and 2018 in FIG. 10B in the proximity of the four corners of the exposure region, and exposure processing is performed on the wafer to be processed next with correction made. Note however, that inspection marks 2012, 2014, 2015, and 2017 are arranged, and only measurement of alignment deviation is performed regarding these marks, in order to show the superiority of the present embodiment.

With the technique according to the present embodiment, alignment deviation is averaged overall, and is contained within ±0.02 micrometers, as illustrated in FIG. 15A. In contrast, with the technique in which marks are arranged only in the four corners of the entire region, the maximum value of alignment deviation is larger, as illustrated in FIG. 15B. Specifically, alignment deviation is small in the proximity of the four corners, i.e., at the inspection marks 2011, 2013, 2016, and 2018, but the alignment deviation is greater in the proximity of the connecting portions, i.e., at the inspection marks 2012, 2014, 2015, and 2017. In some places, the alignment deviation is around 0.03 micrometers.

In a case of performing single-batch exposure after connecting exposure has continued for a plurality of number of times, as with the semiconductor device illustrated in FIGS. 12A through 12C, the amount of deviation at the connecting portion 2019 illustrated in FIG. 10B increases. This is caused by error in matching precision inherent to the exposing apparatus itself, error that the reticle has, warping of the wafer over the steps, and so forth, at the time of connecting exposure.

FIG. 16A is a diagram illustrating an example of the way in which alignment deviation occurs in a case of connecting exposure continuing. A shot 2300 is a region that has been processed by single-batch exposure, and exposure regions 2301 and 2302 are processed by connecting exposure following this single-batch exposure. Thereafter, following connecting exposure steps being performed a plurality of times, deviation may occur as in the exposure regions 2303 and 2304 in the final connecting step. In such a case, performing measurement of alignment deviation using marks disposed in the proximity of the four corners of the single-batch exposure region (i.e., inspection marks 2011, 2013, 2016, and 2018), and performing correction at the time of single-batch exposure on the basis of the results thereof in the next single-batch exposure results in greater alignment deviation. Specifically, exposure is performed as in an exposure region 2305 in FIG. 16B, and it can be seen that alignment deviation is great at the proximity of a connecting portion 2306. For example, in the case of the semiconductor device illustrated in FIGS. 12A through 12C, interference occurs between the light guide 2044 and the wiring 2037, and between the light guide 2044 and the wiring 2041, at positions illustrated in FIG. 12C, which can lead to decrease in yield.

Conversely, by performing measurement of alignment deviation at the inspection marks 2011 through 2018 and performing correction at the time of single-batch exposure on the basis of the results thereof, exposure can be performed as in an exposure region 2307 in FIG. 16C. As a result, the alignment deviation is averaged out, and a semiconductor device can be manufactured that has high alignment precision over the entire chip.

Description has been made above regarding an example of performing highly-precise alignment between a pattern formed by the last connecting exposure step in a plurality of times of consecutive connecting exposure steps, and a pattern formed by a single-batch exposure step immediately thereafter. However, alignment may be performed between a pattern formed by an exposure step other than the last in a plurality of times of consecutive connecting exposure processes, and a pattern formed by a single-batch exposure step. For example, there are cases where higher precision is required for the alignment between the wiring 2035 and 2039 and the light guide 2044, as compared to alignment between the wiring 2037 and 2041 and the light guide 2044, illustrated in FIGS. 12A through 12C. In such a case, the marks of the layer of the wiring 2035 and the layer of the light guide 2044, and the layer of the wiring 2039, and the layer of the light guide 2044, are provided at the inspection marks 2011 through 2018 illustrated in FIG. 10B, and exposed overlaid. The overlay inspection apparatus 1120 may then perform a detecting step of measuring alignment deviation, and a correcting step of adjusting the exposure position in the single-batch exposure step, so that the alignment deviation in the single-batch exposure step performed on the wafer to be manufactured next is small.

That is to say, in a case where there is a single-batch exposure step immediately following a plurality of times of consecutive connecting exposure steps, the above-described technique can be used in alignment between any connecting exposure process out of the plurality of connecting exposure step and the single-batch exposure step. Note that consecutive connecting exposure steps mean connecting exposure steps that do not include a single-batch exposure step therebetween, and may include steps other than an exposure step therebetween. Also, a single-batch exposure step immediately following a particular connecting exposure process means the first single-batch exposure step performed following the particular connecting exposure step, and steps other than an exposure step may be included between the particular connecting exposure step and the immediately-following single-batch exposure step.

Figure 17A:
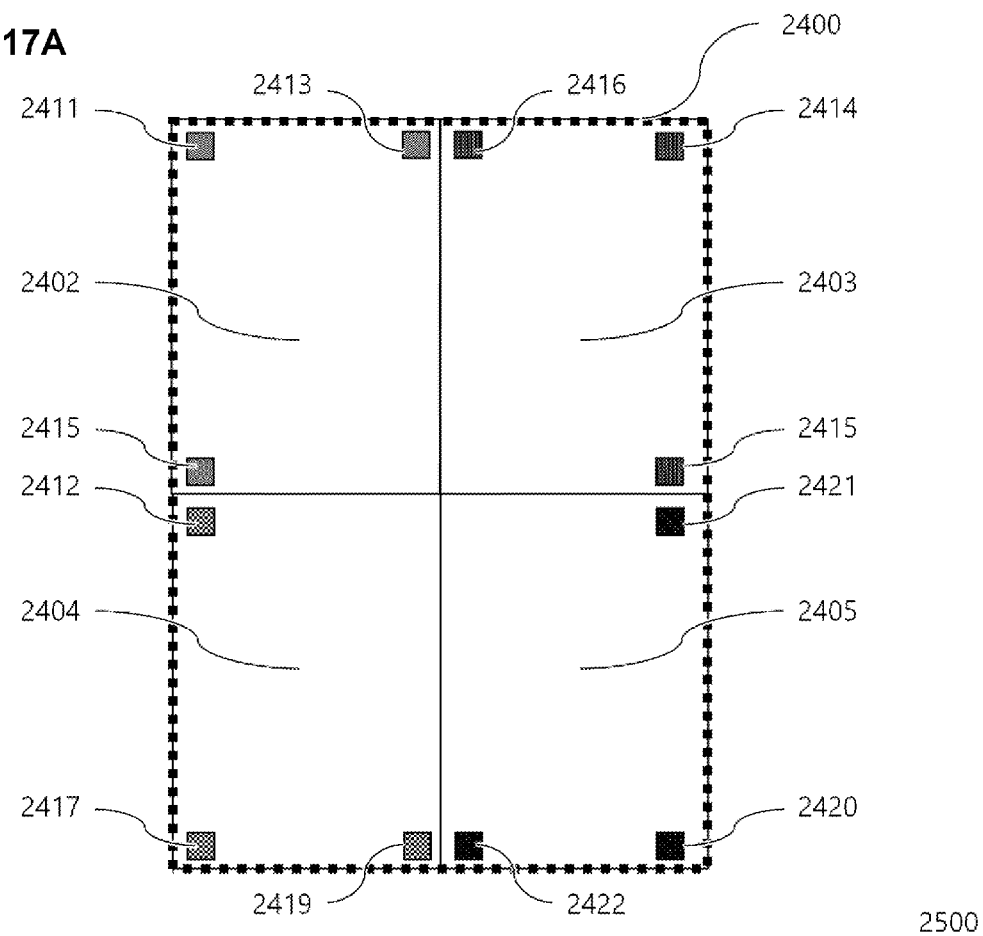
FIGS. 17A and 17B are diagrams illustrating modifications of the second embodiment.

Also, the technique according to the present embodiment may be applied to a manufacturing method for a semiconductor device in which one chip is made up of two rows by two columns, for four exposure regions 2402 through 2405, as illustrated in FIG. 17A. The four exposure regions 2402 through 2405 are patterned by performing connecting exposure thereupon, following which single-batch exposure is performed on an exposure region 2400. Inspection marks 2411 through 2422 for measuring alignment deviation in a subsequent single-batch exposure step are arranged in the exposure regions 2402 through 2405. At the time of single-batch exposure, the inspection marks 2411 through 2422 are measured using the overlay inspection apparatus 1120. A marks in a plurality of chips are measured, and various types of error components are obtained by using known regression analysis. Correction is performed regarding the next wafer regarding which exposure by single-batch exposure is to be performed in the same step, on the basis of the error components, and single-batch exposure is performed.

Figure 17B:
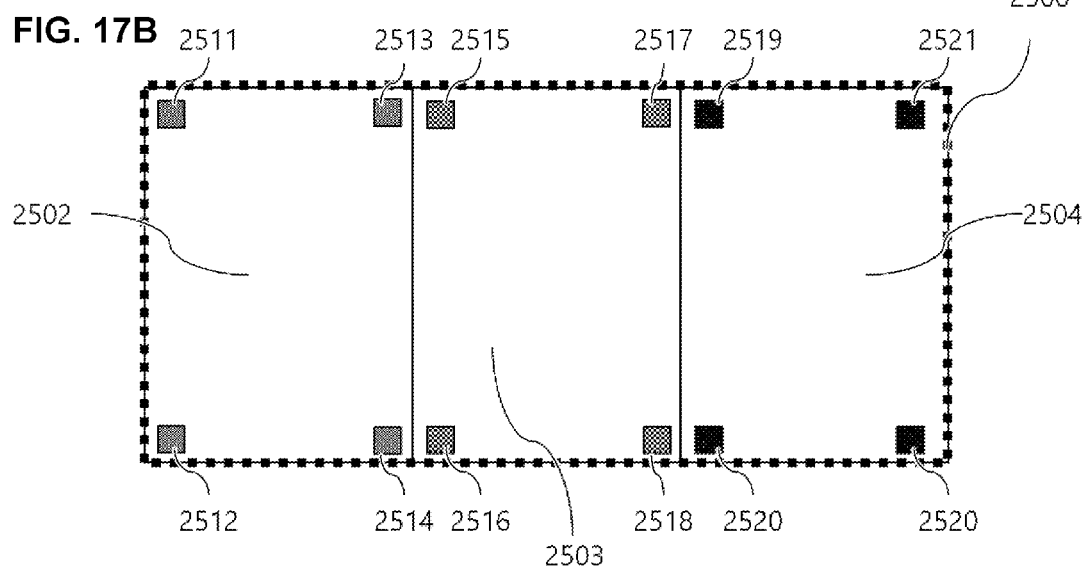

Also, the technique according to the present embodiment may be applied to a manufacturing method for a semiconductor device in which one chip is made up of one row by three columns, for three exposure regions 2502 through 2504, as illustrated in FIG. 17B. The three exposure regions 2502 through 2504 are patterned by performing connecting exposure thereupon, following which single-batch exposure is performed on an exposure region 2500. Inspection marks 2511 through 2522 for measuring alignment deviation in a subsequent single-batch exposure step are arranged in the exposure regions 2502 through 2504. At the time of single-batch exposure, the inspection marks 2511 through 2522 are measured using the overlay inspection apparatus 1120. Alignment marks of a plurality of chips are measured, and various types of error components are obtained by using known regression analysis. Correction is performed regarding the next wafer regarding which exposure by single-batch exposure is to be performed in the same step, on the basis of the error components, and single-batch exposure is performed.

Also, the form of the regions for connecting exposure are not limited to the above-described examples, and the number of exposure regions is not limited to two through four and may be at least five.

The manufacturing method for a semiconductor device according to the present embodiment may be carried out in combination with the first embodiment. That is to say, in split exposure of the first layer in the present embodiment, linear components of an error caused by the reticle and error caused by the wafer may be obtained by the technique described in the first embodiment. A correcting step may also be included, in which the exposure position at the first layer is adjusted so that the linear components are smaller. Note that in the split exposure of the first layer, error caused by the reticle and error caused by the wafer position are derived from information representing the positional relation between one inspection mark out of a first inspection mark group and one inspection mark out of a second inspection mark group (overlay deviation).

(Other Application Examples)

Another application example of the semiconductor device manufacturing method according to the present embodiment will be described with reference to FIGS. 18A through 18D. The semiconductor device manufactured in the present application example is a backside illumination type image-capturing device manufactured with two wafers bonded to each other.

Figure 18A:
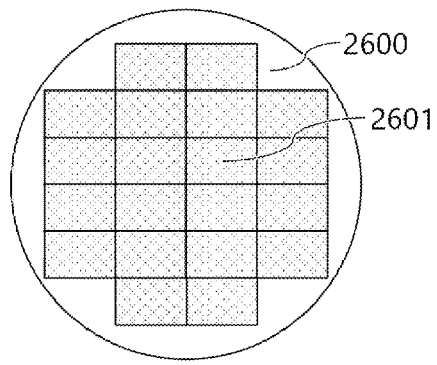
FIGS. 18A through 18D are diagrams illustrating another application example of the second embodiment.
Figure 18B:
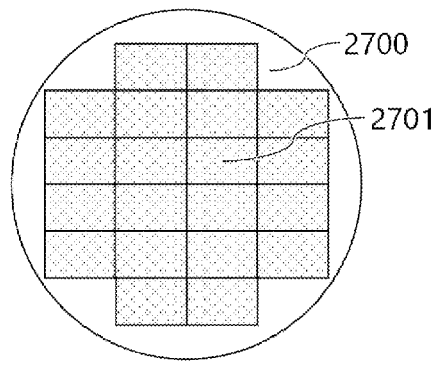

FIGS. 18A and 18B illustrate a chip layout diagram of semiconductor devices. A plurality of chips 2601 are arrayed on a wafer 2600, and a plurality of chips 2701 are array on a wafer 2700, as illustrated in FIGS. 18A and 18B.

Figure 18C:
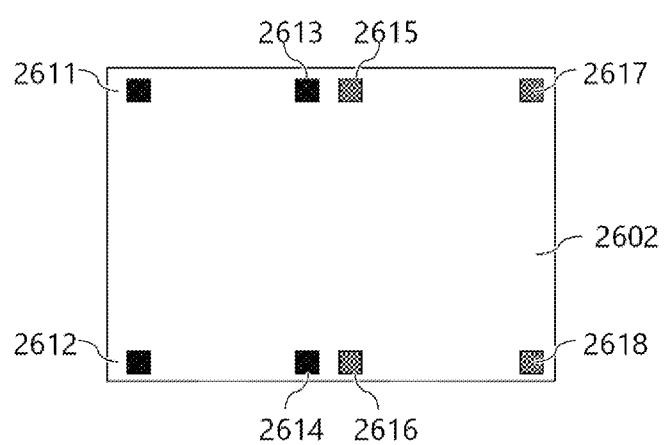
Figure 18D:
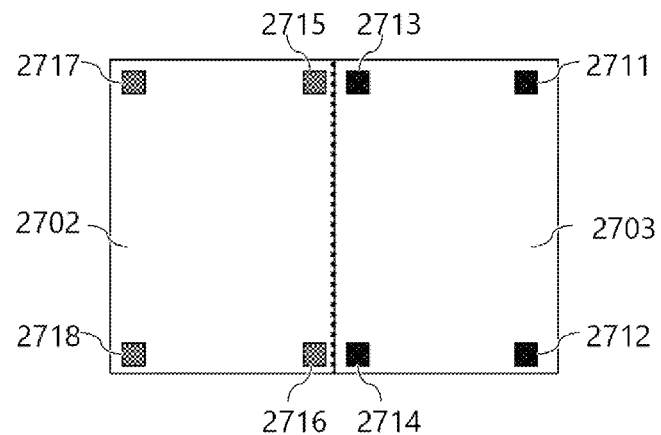

FIGS. 18C and 18D are enlarged views of the chips 2601 and 2701. Patterns are formed on the chip 2601 by single-batch exposure process including the exposure region 2601, and patterns are formed on the chip 2701 by connecting exposure process including the exposure region 2702 and the exposure region 2703. The chip 2601 may be a chip on which a pixel circuit has been formed, for example, and the chip 2701 may be a chip on which signal a processing circuit has been formed, for example. These chips are bonded to each other, thereby laminating the wafers. Scribing the wafer into chip increments following predetermined steps following laminating enables a desired semiconductor device to be obtained.

Inspection marks 2611 through 2618 for measuring alignment deviation following bonding are arranged in the chip 2601. Inspection marks 2711 through 2718 for measuring alignment deviation following bonding are arranged in the chip 2701.

In a step of bonding the wafers 2600 and 2700 together, a bonding apparatus that can correct wafer magnification component, wafer rotation component, and wafer shift component is used for the bonding. Following the bonding, an alignment measuring apparatus is used to detect the precision of bonding, using marks of corresponding positions. The positional deviation amounts between the inspection marks 2611 and 2711, the inspection marks 2612 and 2712, the inspection marks 2613 and 2713, and the inspection marks 2614 and 2714, are detected respectively. Also, the positional deviation amounts between the inspection marks 2615 and 2715, the inspection marks 2616 and 2716, the inspection marks 2617 and 2717, and the inspection marks 2618 and 2718, are detected respectively. The precision of bonding is detected at eight points each for a plurality of chips, and the deviation amounts of the wafer magnification component, the wafer rotation component, and the wafer shift component can be obtained using a regression analysis technique. Performing correction of an amount equivalent to the wafer magnification component, the wafer rotation component, and the wafer shift component for the wafers to be bonded to each other next enables deviation in bonding at the inspection marks 2613 through 2616 and the inspection marks 2713 through 2716 in the proximity of the connecting portion to be reduced. Accordingly, a semiconductor device with a high bonding precision can be manufactured. Materials of components other than the above, forming methods thereof, and so forth, are the same as with known semiconductor devices, and accordingly detailed description thereof will be omitted.

Third Embodiment

The present embodiment relates to a manufacturing technology in which nonlinear correction of positioning error in an exposure step can be precisely and efficiently carried out.

(Background)

In a case in which arrangement error of shots on a wafer, which is a cause of overlay error consists of linear components, this error can be removed by global alignment. AGA is known as one such method (Japanese Patent Application Publication No. 2004-228327). In AGA, position information of alignment marks of a plurality of sample shots selected from one wafer in advance is detected, statistical computation processing (method of least squares, etc.) is performed with regard to the measurement results, and the array of all shots is calculated.

However, in a case where the array error of shots includes nonlinear components, this cannot be removed by global alignment.

In the exposing steps performed consecutively or intermittently in an electronic device manufacturing steps, it is common to use different exposing apparatuses (serial numbers). Stage grid error (mutual error among stage coordinate systems defining wafer movement positions in each exposing apparatus) occurs among these exposing apparatuses. Also, wafer in-plane distortion occurs in process steps involving wafer processing such as etching, chemical vapor deposition (CVD), chemical-mechanical polishing (CMP), bonding to each other, and so forth. These can be nonlinear components of array error of shots. Further, nonlinear components of shot arrangement error may change during exposure processing, due to temperature change of the wafer while being conveyed to the exposing apparatus, difference in the clamping state of each wafer by the wafer chuck situated on the wafer stage, thermal expansion of the reticle, and so forth.

There is known an exposure method that has been developed taking note of grid correction functions in which nonlinear components of shot array error caused by process are corrected, and grid correction functions in which nonlinear components of stage grid error (shot array error caused by exposing apparatus) are corrected, in order to improve overlay precision (Japanese Patent Application Publication No. 2007-129056). First, with regard to wafer grid nonlinear components occurring due to difference in stage grid among exposing apparatuses, a reference wafer is used to perform measurement in advance, and a correction map is created for all shots. Then, in the actual exposure processing, alignment inspection mark measurement of a sample shot specified in an exposure recipe is performed, and a correction amount based on the correction map created in advance is added to the correction amount based on the measurement results. Further, shot shape correction is also performed, following which exposure is performed.

According to the above-described exposure method, correction of nonlinear components caused by the stage grid is accurate, due to the correction map for all shots. However, the nonlinearity of the shot array caused by process is still based on results of AGA measurement performed on alignment marks of a plurality of sample shots within the wafer. Unless a sample shot that appropriately expresses the wafer grid deformation caused by process is specified, correction of nonlinear components caused by process will be insufficient. In particular, in cases in which the tendency and degree of nonlinearity of shot array error for each wafer making up a lot greatly differ, specifying a suitable sample shot in the exposure recipe is difficult.

Overlay precision required of exposing apparatuses is gradually becoming stricter, and currently is at a level where nonlinearity of shot array error in a wafer is not tolerable. However, disposing a great number of alignment marks and performing alignment measurement for a great number of points in each shot for all shots, in order to improve precision of nonlinear correction of shot array error, leads to deterioration in throughput.

Once exposure is performed for nonlinear correction by the above-described alignment measurement for a great number of points in each shot for all shots in a certain exposure step, linear correction by AGA alone will not be able to handle the following and subsequent exposure steps. Consequently, alignment measurement for a great number of points in each shot for all shots becomes necessary for nonlinear correction, and the total processing time for exposure processing in the manufacturing of the electronic device becomes very long.

(Overview)

In light of the above problem, it is an object of the present embodiment to provide an exposure method and an exposure system that enables reduction in total exposure processing time in manufacturing electronic devices while performing nonlinear correction of shot array within an exposure object with high precision.

The manufacturing method for a semiconductor device according to the present embodiment takes note of the degree of variance occurring among wafers in a lot, with regard to nonlinearity in shot array error that wafers to be exposed have, and performs different processing for steps where inter-wafer variance is great and for steps where inter-wafer variance is small. Hereinafter, a step where inter-wafer variance of nonlinearity in shot array error is relatively great will be referred to as "first type of exposure step", and a step where this is relatively small will be referred to as "second type of exposure step".

More specifically, in the manufacturing method for a semiconductor device according to the present embodiment, correction is performed that involves nonlinearity correction by all-shot alignment measurement for N (where N is a natural number of at least 2) wafers within the lot in the first type of exposure step. As a result, nonlinear correction information is obtained regarding each of the N wafers (first correction information). N may be equal to the total number of wafers in the lot, or may be smaller. Description will be made below in which N is equal to the total number of wafers in the lot. Also, in the second type of exposure step following the first type of exposure step, M (where M is at least 1 and not more than N−1) wafers are subjected to correction that involves nonlinearity correction by all-shot alignment measurement, in the same way as in the first type of exposure step. As a result, nonlinear correction information is obtained regarding each of the M wafers (second correction information). As for the remaining wafers other than the M wafers, third correction information is generated by computation processing using the first correction information and the second correction information, and exposure involving nonlinear correction is performed using this third correction information.

Taking note of the variance among wafers regarding nonlinear error and differing the exposure processing in this way enables both precise alignment and improved throughput to be realized. Also, in the present embodiment, correction can be performed without giving particular consideration to whether the nonlinear components are caused by process or caused by stage grid error among exposing apparatuses. For example, even in a case where trouble suddenly occurs in an exposing apparatus and the stage grid varies during processing of a lot, the exposure processing can be correctly continued in the manufacturing method according to the present embodiment.

(First Type of Exposure Step)

In the present embodiment, an exposure step where inter-wafer variance in nonlinearity of short array error is relatively great with regard to exposure processing of a lot (one lot is 25 wafers, for example) in an electronic device manufacturing process is referred to as "first type of exposure step". For example, there are cases where tendencies of nonlinearity in shot array error among wafers greatly differs from one wafer to another, in an exposure step immediately following bonding wafers to each other and thinning, which will be described later. The same sort of cases may occur in an exposure step immediately following thermal processing in a batch furnace. This is because making the heat within the furnace completely uniform is difficult, and the way in which wafers are subjected to heat within the quartz boat differ depending on the position of the wafers placed therein.

(Second Type of Exposure Step)

Also, in the present embodiment, an exposure step where inter-wafer variance in nonlinearity of short array error is relatively small with regard to exposure processing of a lot (one lot is 25 wafers, for example) in an electronic device manufacturing process is referred to as "second type of exposure step". For example, the present inventor has found that in single-wafer processing of silicon nitride film by CVD (deposition), film stress increases as the film thickness of the silicon nitride film increases, and nonlinearity of shot array error in the exposure step immediately following film formation also increases, which will be described later. However, if the processing chamber of the CVD apparatus that deposits the silicon nitride film is the same, there will be no marked change in the tendency of nonlinearity of shot array error among the wafers. That is to say, the degree of inter-wafer variance in nonlinearity in the exposure step following the processing of depositing the silicon nitride film is smaller in comparison with that in the exposure step immediately following bonding wafers to each other and thinning, or the like.

(Details of Processing)

The exposure processing of the semiconductor device manufacturing method according to the present embodiment will be described with reference to the Figures. Note that the semiconductor device (electronic device) manufacturing method according to the present embodiment is carried out using the lithography system 1110 illustrated in FIG. 1.

FIG. 19A schematically shows a control algorithm of the CPU within the main control system 1020 of the scanner in the first type of exposure step. In the following description, in a case where the entity performing an action is the main control system 1020, the entity performing an action may not be expressly stated.

The exposure processing described here is processing on a second layer and subsequent layers of wafers W within the same lot (N=25 wafers, etc.). Also, an assumption will be made that all wafers within the lot are subjected to various types of processing in the same steps under the same conditions. Also, the exposure processing of the layers in the description below may be either connecting exposure processing or single-batch exposure processing.

Figure 19B:
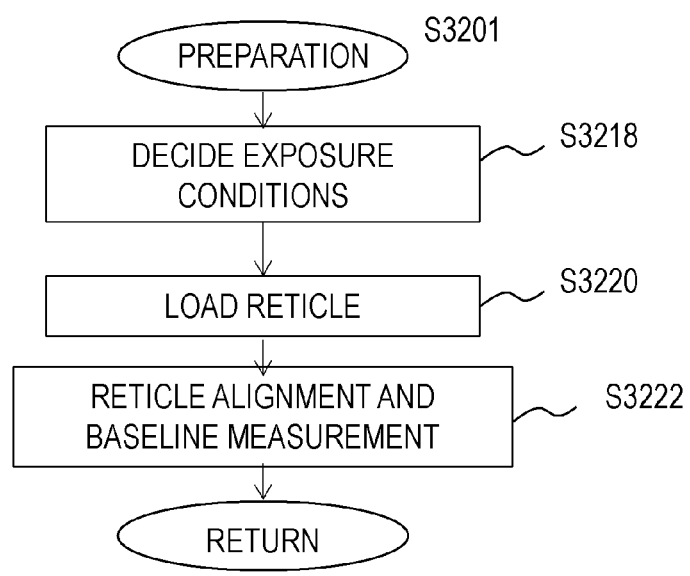

In subroutine S3201, the main control system 1020 performs predetermined preparatory work. Details of processing in the subroutine S3201 is shown in FIG. 19B. In step S3218, exposure conditions are set following a process program file (settings file for exposure conditions) corresponding to settings specification information of exposure conditions given from the host computer 1150 along with exposure instructions. In step S3220, a reticle R is loaded on the reticle stage RS by a reticle loader that is omitted from illustration. In step S3222, reticle alignment and baseline measurement of the alignment system OAS is performed. When the reticle alignment and baseline measurement of the alignment system OAS ends, the flow returns to step S3202 in FIG. 19A.

In step S3202, the wafer regarding which exposure processing has been completed, which is on the wafer chuck 1025 illustrated in FIG. 2, is exchanged with an unexposed wafer by a wafer loader that is omitted from illustration. Note that in a case where there is no wafer regarding which exposure processing has been completed on the wafer chuck 1025, an unexposed wafer is simply loaded on the wafer chuck 1025.

In step S3204, pre-alignment of this wafer W loaded on the wafer chuck 1025 is performed. Specifically, at least two TV pre-alignment marks situated at peripheral portions approximately symmetrical as to the center of the wafer W, for example, are detected using the alignment system OAS. Remaining rotation error of the wafer W is calculated from the positional coordinates of the two marks, and minute rotation of the wafer chuck 1025 is performed so that this remaining rotation error becomes approximately zero. Thus, pre-alignment of the wafer W ends.

In step S3206, positional coordinates measurement of the alignment marks is performed regarding a plurality of sample shots within the wafer. Statistical computation (AGA computation) using the method of least squares is performed, thereby calculating the error components of rotation, magnification, orthogonality, shift, and so forth, relating to the array of the shots on the wafer W. The positional coordinates (array coordinates) of all shots are calculated on the basis of the calculation results and the positional coordinates from shot design, and the positional coordinates of all shots on the wafer W are stored in a predetermined region in internal memory.

In step S3208, the positional coordinates in the stage coordinates system are measured for all shots on the wafer W. Specifically, the positional coordinates in the stage coordinates system for the wafer alignment marks on the wafer W, i.e., positional coordinates of the shots, are obtained, in the same way as measurement of the positional coordinates of the TV pre-alignment marks at the time of pre-alignment, described above. Note that the detection of wafer marks is performed with the magnification of the alignment system OAS set to a high magnification.

In step S3210, the linear components and nonlinear components of positional deviation amount are separated for all shots. Specifically, the difference between the positional coordinates of each shot calculated in the above step S3206 and the positional coordinates of each in design (reference position) are calculated as linear components of positional deviation amount. Also, the remainder of subtracting the linear components from the difference between the positional coordinates of all shots actually measured in step S3208 and the positional coordinates of each in design is calculated as the nonlinear components of positional deviation amount. Note that the nonlinear components of positional deviation amount may be calculated using an appropriate interpolation function.

In step S3212, a correction map is created with the nonlinear components calculated in the above step S3210 as array deviation correction information for each shot. This correction map in the first type of exposure step is first correction information. First correction information is created regarding all wafers regarding which overlay exposure will be performed in this exposure step.

In step S3214, overlay exposure is performed on the basis of array coordinates for all shots based on AGA measurement (step S3206) and the correction map of nonlinear components of positional deviation amount regarding all shots (first correction information). More specifically, overlay correction positions where positional deviation amount (linear components and nonlinear components) is corrected for all shots is calculated from the array coordinates based on AGA measurement and the correction map. Step-and-scan exposure operations are then performed using the calculated overlay correction position data. Stepping operations are operations of sequentially stepping the wafer stage WS (wafer W) to a scan start position (acceleration start position) for exposing each shot on the wafer W, on the basis of the calculated correction positions, and the baseline amount measured in advance. Scanning operations are operations of transferring the reticle pattern onto the wafer while synchronously moving the reticle stage RS and the wafer stage WS in the scan direction. These operations are repeated, and the exposure processing on the beginning wafer W in the lot (first wafer in the lot) ends.

In step S3216, determination is made regarding whether or not exposure of the planned number of wafers has ended. In a case where the determination is negative, the processing returns to step S3202, and the above processing and determination are repeated thereafter.

Thus, when exposure of all N wafers W ends, the determination in step S3216 is positive, and exposure processing according to the first type of exposure step ends.

The first correction information stored in the internal memory of the main control system 1020 during the exposure processing is stored and saved as it is, in a storage device such as a hard disk or the like making up the main control system 1020. The first correction information may be stored in the information server 1130 via the LAN 1160 connected to the main control system 1020.

Figure 20:
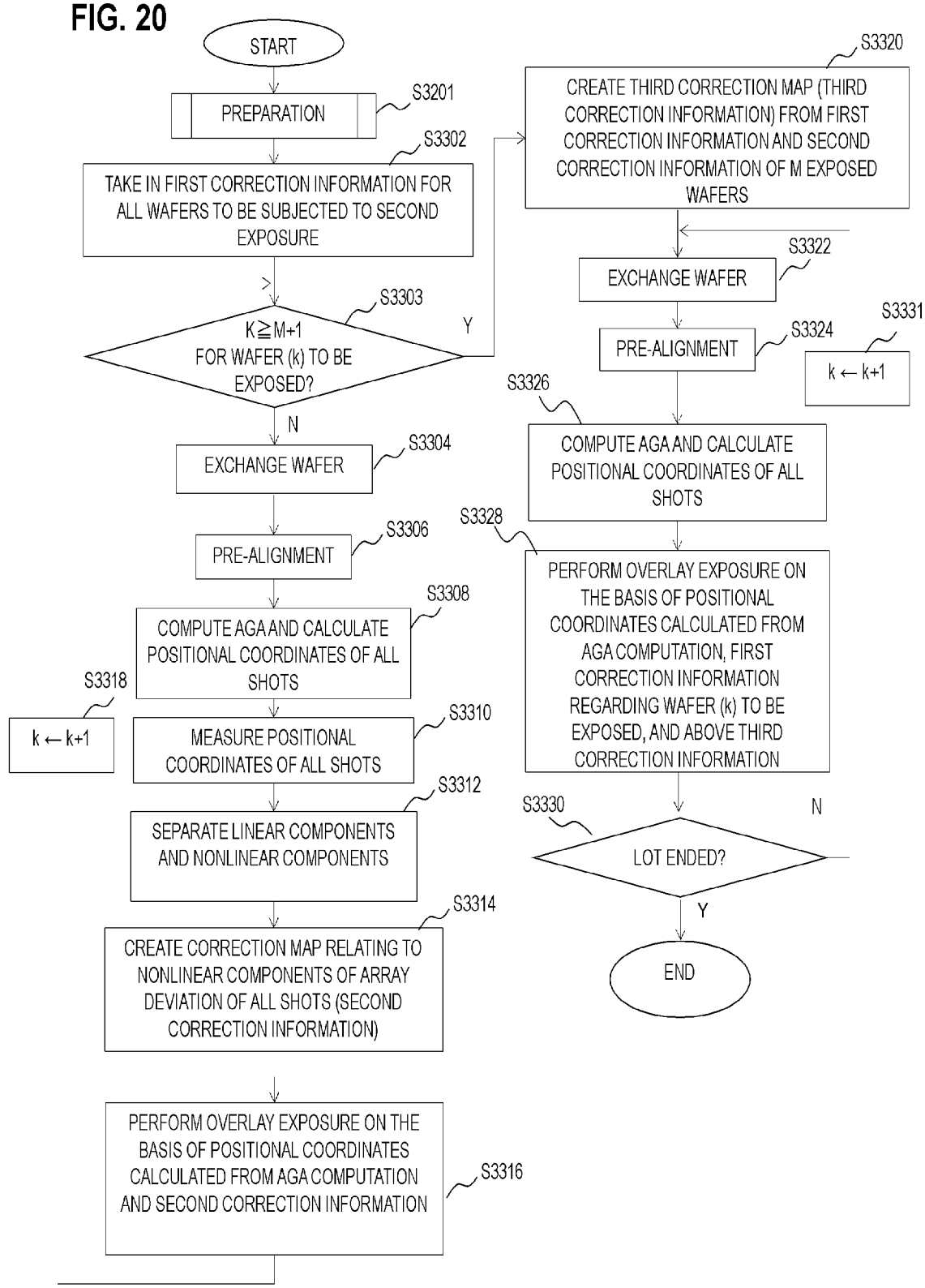
FIG. 20 is a flowchart showing the flow of a second-type exposure step according to the third embodiment.

FIG. 20 schematically illustrates a control algorithm of the CPU within the main control system 1020 of the scanner in the second type of exposure step. The processing illustrated in FIG. 20 may be carried out in a consecutive exposure step immediately following the first type of exposure step, or may be an exposure step after several exposure steps have been performed in between. Here, overlay exposure is performed regarding all N wafers (e.g., 25 wafers) in the same lot processed by the first type of exposure step.

As a premise, the initial setting of a value of an unshown counter indicating the wafer No. (k) in the lot, which will be described later, is "1" (k←1).

First, the subroutine S3201, which is preparatory work, is executed. Details of the subroutine S3201 have been described with reference to FIG. 19B, and accordingly redundant description will be omitted here.

In step S3202, the main control system 1020 of the exposing apparatus carrying out the second type of exposure step reads out the first correction information acquired in the first type of exposure step regarding all wafers to be processed in the second type of exposure step. The first correction information is read out from the main control system 1020 or the information server 1130 of the exposing apparatus that carried out the first type of exposure step. The first correction information that is read out is stored in a predetermined region within the internal memory of the main control system 1020.

Note that in step S3302, the first correction information may be further corrected by adding thereto overlay error information, evaluated at the overlay inspection apparatus 1120 following the first type of exposure step or following etching processing immediately following the first type of exposure step. In a case where the first correction information is corrected, this corrected first correction information is thereafter used as the first correction information. The error information from the overlay inspection apparatus 1120 is sent from the information server 1130 to the main control system 1020 of the exposing apparatus that will perform second exposure via the LAN 1160, under an instruction from the host computer 1150, and computation with the first correction information is performed at the main control system 1020. Alternatively, computation of the first correction information and error information from the overlay inspection apparatus 1120 may be performed in advance, and be sent in this state to the main control system 1020 of the exposing apparatus via the LAN 1160 under an instruction from the host computer 1150 in the information server 1130.

In step S3303, judgment is made regarding whether or not the count value k of the aforementioned counter is no less than a predetermined value (M+1). Accordingly, whether or not the wafer W on the wafer chuck 1025 is a wafer that is the No. (M+1)'th or subsequent wafer in the lot can be found. Here, the number of wafers in the processing lot is N=25, and the predetermined value M is set in advance to an optional integer that is at least 1 and not more than 24. Description will be made below with M=1 for the sake of convenience. In this case, the wafer W is the beginning wafer in the lot (first wafer), which is k=1 from the initial settings, and accordingly the judgment in step S3303 is negative and the processing advances to the next step S3304.

In step S3304, the wafer regarding which exposure processing has been completed, which is on the wafer chuck 1025, is exchanged with an unexposed wafer by a wafer loader that is omitted from illustration. Note however, in a case where k=1, there is no wafer on the wafer chuck 1025, and accordingly an unexposed wafer W is simply loaded on the wafer chuck 1025.

The sequence from step S3306 through step S3316 is basically the same as the sequence from S3204 through S3214 in the first type of exposing step described earlier. There is a difference therebetween in that the correction map (correction information) created in step S3314 is referred to as "second correction map" (second correction information) instead of "first correction map" (first correction information). Also, in step S3316, the second correction map (second correction information) is used for calculating overlay correction position instead of the first correction map (first correction information).

In the next step S3318, the count value of the counter described above is incremented (k←k+1). Here, k=1, and accordingly this becomes k=2. Thereafter, the processing returns to step S3303, and the processing of steps S3304 through S3316 is repeated until a positive determination is made in S3303.

Once a positive determination is made in step S3303, the processing advances to step S3320, while the processing advances to step S3304 when a negative determination is made. M=1 is assumed here, and accordingly, a positive determination is made when k=2, i.e., when the second wafer in the lot is the object of exposure.

In step S3320, a third correction map (third correction information) is created on the basis of the first correction map (first correction information) and the second correction map (second correction information) of the M wafers that are already exposed. The first correction map is acquired in step S3302 and is stored in internal memory of the main control system 1020. The second correction map is created in step S3314 and is stored in internal memory of the main control system 1020.

The second correction information and the first correction information are nonlinear correction maps regarding the same shot layout. Accordingly, the difference obtained by subtracting the first correction information from the second correction information for each wafer, for example, with regard to the shot arrangement positions represented by an X-Y two-dimensional coordinate system, can be understood to be the variation in nonlinear components occurring from the first exposure to the second exposure with regard to each wafer. For example, the variation of the second correction information as to the first correction information for each wafer is calculated from the first wafer to the M'th wafer, and a correction map obtained on the basis of the average value of variations regarding the M wafers is the third correction information. The third correction information is stored in the internal memory of the main control system 1020 of the exposing apparatus. The second type of exposing step is an exposing step with relatively small variance in nonlinear error components among wafers, as described earlier. Accordingly, there is little change (variation) in the third correction information among the wafers.

The third correction information may change depending on the method of computing processing for the first correction information and the second correction information. Although subtracting the first correction information from the second correction information and averaging by the number of wafers has been given as an example of the method of computing processing of the first correction information and the second correction information, other methods of computation may be performed. For example, the second correction information and the first correction information may each be multiplied by a certain coefficient and then subtraction thereof performed, and averaged by the number of wafers to obtain the third correction information. It is sufficient for this coefficient to be decided to be a numerical value reflecting the measurement results at the overlay inspection apparatus 1120, for example, a numeral value that expresses the amount of change in the results of overlaying between exposure and etching, in a case where there is a certain amount of change therebetween.

In step S3322, the wafer regarding which exposure processing has been completed, which is on the wafer chuck 1025, is exchanged with an unexposed wafer by the wafer loader that is omitted from illustration.

In step S3324, pre-alignment of the wafer W loaded onto the wafer chuck 1025 is performed.

In step S3326, positional coordinates measurement of alignment marks is performed with regard to a plurality of sample shots in the wafer. Statistical computation (AGA computation) using the method of least squares is performed, thereby calculating the error components of rotation, magnification, orthogonality, shift, and so forth, relating to the array of the shots on the wafer W. The positional coordinates (array coordinates) of all shots are calculated on the basis of the calculation results and the positional coordinates from shot design, and the positional coordinates of all shots on the wafer W are stored in a predetermined region in internal memory.

In step S3328, overlay exposure is performed on the basis of the array coordinates of all shots based on AGA measurement (step S3326), the first correction map of the wafer that is the object of exposure (k'th wafer), and the third correction map (step S3320). In the overlay exposure these three sets of data are used to calculate overlay correction positions where the positional deviation amount (linear components and nonlinear components) of each shot has been corrected. The linear components are primarily corrected by the array coordinates of all shots based on AGA measurement, and the nonlinear components are primarily corrected by the first correction map and the third correction map. The calculated data regarding overlay correction position is used to perform step-and-scan exposition operations. Thus, exposure processing of the wafer W that is the second (k=2) wafer from the beginning wafer in the lot ends here.

In step S3330, determination is made regarding whether or not exposure has ended for the planned number of wafers. In a case of a negative determination, the flow advances to step S3331, the counter k is incremented, and the processing returns to step S3322.

Following returning to step S3322, the processing and determination of the above step S3322 through step S3330 is repeated until exposure of all wafers in the lot ends. When exposure of all wafers in the lot ends and a positive determination is made in step S3330, the series of processing for the second type of exposure step ends.

(Application Example)

An example of applying the exposure method according to the present embodiment to electronic device (semiconductor device) manufacturing will be described. An example will be described here of a manufacturing process of a complementary metal-oxide semiconductor (CMOS) type backside illumination type image-capturing device, which is a device vigorously developed and produced in recent years. FIGS. 21A through 21D, 22A and 22B, and 23A schematically illustrates a manufacturing process flow, and FIG. 23B is a schematic cross-sectional view of a completed backside illumination type image-capturing device 3400 after the manufacturing steps are ended.

The backside illumination type image-capturing device 3400 is manufactured with a sensor wafer 3401 and a wafer 3402 bonded to each other. The face on the opposite side (back face) from the face of the sensor wafer 3401 where a wiring layer is provided is the light-receiving face. The sensor wafer 3401 has a semiconductor layer 3403a formed of silicon, and has a pixel region 3425 where a plurality of pixels 3423 are arrayed in a matrix, for example, on the semiconductor layer 3403a. The pixels 3423 that are arranged in the pixel region 3425 have photodiodes 3410 that serve as photo acceptance units having photoelectric conversion functions. The sensor wafer 3401 also has a wiring layer 3408a where a plurality of sets of wiring 3406a, for example, are stacked on one principal plane side of the semiconductor layer, with an interlayer insulating film 3405a interposed therebetween. Alignment marks 3411 are formed in the semiconductor layer 3403a of the sensor wafer 3401, by etching and embedding a silicon nitride film. On the other side of the semiconductor layer 3403a made of silicon from the side on which the wiring layer 3408a is provided, metal shielding portions 3414, in-layer lenses 3417, color filters 3419, and microlenses 3421 are formed. Thereafter, the sensor wafer 3401 and wafer 3402 are diced, thereby forming chips. A sensor chip in the image-capturing device 3400 is part of the sensor wafer 3401, and a circuit chip is part of the wafer 3402. A semiconductor layer of the sensor chip in the image-capturing device 3400 is part of the semiconductor layer 3403a of the sensor wafer 3401, and a semiconductor substrate of the circuit chip is part of a semiconductor substrate 3403b of the wafer 3402.

In the backside illumination type image-capturing device 3400, incident light from the microlenses 3421 side is received by the photodiodes 3410 of the pixels 3423 without passing through the wiring layer. Accordingly, a wider substantial photo acceptance area of the photodiodes 3410 can be secured, and sensitivity can be improved.

The manufacturing process of such backside illumination type image-capturing device 3400 includes the following steps.

First, the sensor wafer 3401 on which pixels have been formed (FIG. 21A), and the wafer 3402 to be bonded thereto (FIG. 21B) are prepared. The wafer 3402 may be a wafer serving as a supporting substrate to maintain planarity and mechanical strength of the sensor wafer 3401, or a wafer serving as a circuit substrate in which a logic circuit for controlling the image-capturing device formed in the sensor wafer 3401 is formed, for example. An example where a logic circuit is formed in the wafer 3402 will be described here. As illustrated in FIG. 21B, the wafer 3402 has the semiconductor substrate 3403b formed of silicon, metal-oxide semiconductor (MOS) transistors 3404b formed on the surface thereof, and a wiring layer 3408b provided with an interlayer insulating film 3405b interposed therebetween. The wiring layer 3408b has a plurality of sets of wiring 3406b stacked with the interlayer insulating film 3405b interposed therebetween. The interlayer insulating film 3405b is configured of a silicon oxide film, for example. The plurality of sets of wiring 3406b are formed of different metals, for example, and are connected to each other via plugs and the like formed between layers. Components that are the same are denoted by the same reference numerals, with those in the sensor wafer 3401 being indicated by a suffix "a", and those in the wafer 3402 by a suffix "b". For example, reference signs 3404a and 3404b both denote MOS transistors, with the former indicating MOS transistors formed in the sensor wafer 3401, and the latter indicating MOS transistors formed in the wafer 3402 side.

Next, the sensor wafer 3401 and the wafer 3402 are bonded to each other so that a metal bonding layer 3407a of the sensor wafer 3401 and a metal bonding layer 3407b of the wafer 3402 form a metallic bond (FIG. 21C). The bonding may be performed using an adhesive or using plasma. Heating and pressurizing of the wafers are performed in the wafer bonding step.

Following the bonding step, thinning processing is performed to reduce the thickness of the sensor wafer 3401, in order to obtain incident light from the back face side. Specifically, the thickness of the semiconductor layer 3403a formed of silicon is reduced by backside grinding and polishing, etching, or the like.

In the wafer bonding and thinning process, great distortion is usually generated in the sensor wafer 3401 due to residual stress and the like occurring at the time of heating and pressurizing of the wafers, or thinning of the sensor wafer. The tendency and magnitude of distortion often differs among wafers in the same lot. Although technology regarding bonding and thinning of silicon wafers is rapidly advancing as of recent, making the tendency and magnitude of distortion among wafers to be generally the same still remains difficult. Distortion of the sensor wafer 3401 from bonding and thinning affects the subsequent exposure step, in which pattern formation is performed optical structure elements, to effectively take in incident light at the photodiodes 3410 in the pixel region 3425. Specifically, this greatly affects alignment in particular, in the exposure step where pattern formation of the metal shielding portion 3414, the in-layer lenses 3417, the color filters 3419, and the microlenses 3421, illustrated in FIG. 23B, is performed.

Figures 22A, 22B:
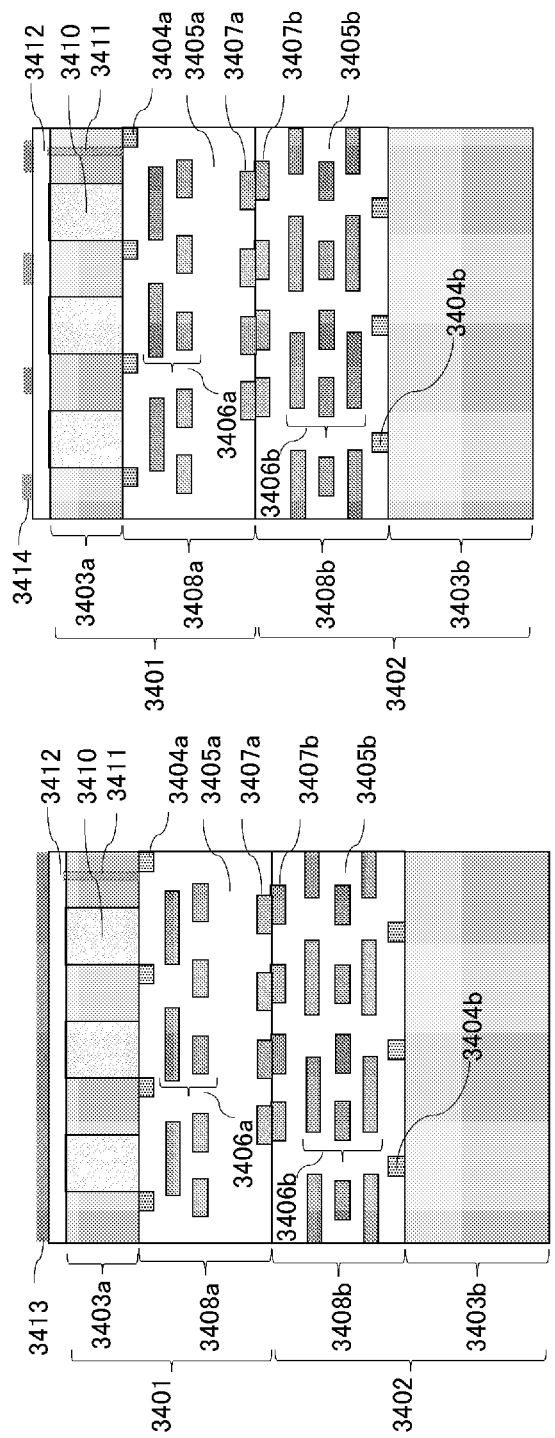
FIGS. 22A and 22B are diagrams for describing an example of applying the third embodiment to semiconductor device manufacturing.

Following thinning of the sensor wafer 3401, a laminated film 3412 configured of a fixed-charge film, an anti-reflection film, a silicon oxide film, and so forth, is formed, and a metal shielding film 3413 is deposited by CVD or sputtering, as illustrated in FIG. 22A. There is a need to perform metal shielding portion patterning by exposure and processing by etching, in order to remove the metal shielding film over the photodiodes, as illustrated in FIG. 22B.

If the exposure process where metal shielding portion patterning is performed on the metal shielding film is the first exposing step following the bonding and thinning of the sensor wafer 3401, the sensor wafer 3401 has distortion, and the tendency and magnitude of this distortion also differs among the wafers, as described earlier. This distortion is manifested as nonlinear components in shot array error within the wafer, and accordingly this metal shielding portion patterning corresponds to the first type of exposure step according to the present embodiment. Accordingly, all-shot alignment coordinates detection is performed for all wafers in the lot, and a correction map representing nonlinear components of shot array for each wafer is stored in the internal memory of the main control system 1020 of the exposing apparatus or in the information server 1130, as first correction information. Alignment coordinates detection is performed by detecting alignment marks at at least four positions within a shot (e.g., alignment marks (XY8, XY4 marks, etc.) regarding which the X-directional and Y-directional position can be measured at the same time). Alignment measurement for metal shielding portion patterning is performed using the alignment marks 3411 formed in the semiconductor layer 3403a that is made of the silicon of the sensor wafer 3401.

After the metal shielding portion 3414 is formed as illustrated in FIG. 22B, an interlayer insulating film 3415 of a silicon oxide film or the like is deposited, and planarization is performed by CMP or the like as necessary. A silicon nitride film layer 3416 to serve as the base material for the in-layer lenses 3417 is deposited thereupon by a single-wafer CVD apparatus. Thereafter, a resist pattern is formed directly above the photodiodes by a known photolithography technology, so as to perform masking thereof, and a resist pattern for forming the in-layer lenses 3417 by thermal processing such as reflow or the like is formed. The lens-shaped resist pattern is used as a mask to perform etching processing, thereby forming the in-layer lenses 3417 in the silicon nitride film layer 3416.

The present inventor has found through study that when the film thickness of the silicon nitride film deposited in the electronic device manufacturing step increases, generally, stress within the silicon nitride film increases, and the overlay precision as to patterns formed in layers lower than the silicon nitride film deteriorates in accordance therewith. The primary cause thereof is nonlinear components in shot array error. However, it is known that the nonlinearity caused by deposition of the silicon nitride film is relatively smaller than the nonlinearity caused by bonding and thinning to begin with, and that the variance in tendency and magnitude of nonlinearity among wafers in the lot is also relatively small. Accordingly, the exposure step to form in-layer lens pattern corresponds to the second type of exposure step according to the present embodiment.

Accordingly, all-shot alignment coordinates detection is performed for M wafers from the beginning of the lot made up of N wafers, for example, in the same way as in the first type of exposure step, and a correction map representing nonlinear components of the shot array is obtained for each wafer. The obtained correction map is stored in the internal memory of the main control system 1020 of the exposing apparatus performing this second type of exposure step or the like, as second correction information. Regarding the M wafers, the main control system 1020 of the apparatus or the like computes the difference and so forth of the second correction information as to the first correction information, and averages the difference among the M wafers, thereby creating third correction information. Regarding the M wafers from the beginning of the lot in the second type of exposure step, variance among wafers regarding difference of the second correction information as to the first correction information is smaller than the variance among wafers in the first correction information regarding the M wafers corresponding to the first type of exposure step.

With regard to the remaining (N−M) wafers in the second type of exposure step, the nonlinear correction components of shot array are calculated from the first correction information regarding each of the wafers, and the third correction information calculated from the M wafers from the beginning of the lot, and are applied to exposure. Note that the same alignment marks 3411 preferably are measured in the metal shielding portion pattern exposure that is the first type of exposure step, and the in-layer lens pattern exposure that is the second type of exposure step. That is to say, preferably, the same alignment marks 3411 are measured and the first correction information and the second correction information are created, and the third correction information is created from subtraction and averaging thereof.

(Advantageous Effects)

According to the exposure method of the present embodiment, when consecutively or intermittently exposing each of a plurality of exposure objects, total exposure processing time in manufacturing electronic devices can be reduced while performing nonlinear correction of shot array within an exposure object with high precision.

(Modifications)

Description has been made in the example above that alignment measurement is performed for all wafers within the lot in the first type of exposure step, but alignment measurement may be performed for only a part of the wafers. That is to say, the above natural number N may be smaller than the total number of wafers in the lot. In this case, the nonlinear component of positional deviation amount in the first type of exposure step is preferably calculated using an appropriate interpolation function.

The exposure processing in the above description may be single-batch exposure processing or may be connecting exposure processing. The manufacturing method according to the present embodiment may be carried out by single-batch exposure processing alone, or by connecting exposure processing alone, or by a combination of single-batch exposure processing and connecting exposure processing. Combining single-batch exposure processing and connecting exposure processing is described in the second embodiment. In the second embodiment, the correction method of nonlinear components of positional deviation may be switched in accordance with whether each exposure processing is a first type of exposure processing or a second type of exposure processing, as in the present embodiment.

Fourth Embodiment

In a case of arranging circuit wiring above a light-receiving region in an image-capturing device, the wiring pattern needs to be arranged so as not to interfere incident light collected by the top lens. In a case of forming the wiring pattern using connecting exposure, deterioration in matching precision of wiring patterns formed by performing exposure a plurality of times may lead to part of the wiring pattern interfering with incident light, and as a result, sensitivity variance at the connecting regions is greater. This sensitivity variance becomes marked in pixels that are finer and use multilayer wiring, and accordingly raising fineness and functionality is difficult with image-capturing devices using connecting exposure.

The present embodiment relates to a manufacturing method for an image-capturing device that is able to improve connecting precision of wiring patterns formed by performing exposure a plurality of times, and to suppress sensitivity variance at connecting regions.

(Overview of Manufacturing Method)

Before describing details of exposure processing according to the present embodiment, an overview of the structure and manufacturing method for the image-capturing device will be described with reference to FIGS. 24A through 24H. FIGS. 24A through 24H are diagrams for describing manufacturing steps, with FIG. 24H illustrating the final structure of the image-capturing device.

An image-capturing device 4100 has a substrate 4101. The substrate 4101 may be part of semiconductor material of members making up the image-capturing device 4100. For example, the substrate 4101 includes articles in which semiconductor regions such as wells and so forth are formed in a semiconductor wafer by known semiconductor manufacturing processes. Examples of semiconductor materials that can be used include silicon, gallium arsenide, and so forth. An interface between the semiconductor material and another material is a principal plane 4102 of the substrate 4101. An example of the other material is silicon oxide 4101 disposed on the substrate 4101 in contact with the substrate 4101, or the like. Note that the substrate 4101 is part of a wafer during the manufacturing steps. In a post-step of the manufacturing steps, the wafer is diced into chips. The substrate 4101 in the image-capturing device 4100 is part of a chip.

A known semiconductor substrate can be used for the substrate 4101, with silicon being used in the present embodiment. A p-type semiconductor region and an n-type semiconductor region may be disposed in the substrate 4101. In the present embodiment, the principal plane 4102 may be an interface between the substrate 4101 and silicon oxide (omitted from illustration) laminated on the substrate 4101. The substrate 4101 includes an image-capturing region 4103 where a plurality of photoelectric conversion units 4105 are disposed, and a peripheral region 4104 where signal processing circuits for processing signals output from the plurality of photoelectric conversion units 4105 are disposed. The image-capturing region 4103 and the peripheral region 4104 will be described later. In the present embodiment, a "lateral plane" is a plane parallel to the principal plane 4102. For example, the principal plane 4102 in a region where the later-described photoelectric conversion units 4105 are disposed, or the principal plane 4102 at channels of MOS transistors, may be used as a reference. Also, a "cross-section" is a plane orthogonal to the lateral plane.

Figure 24A:
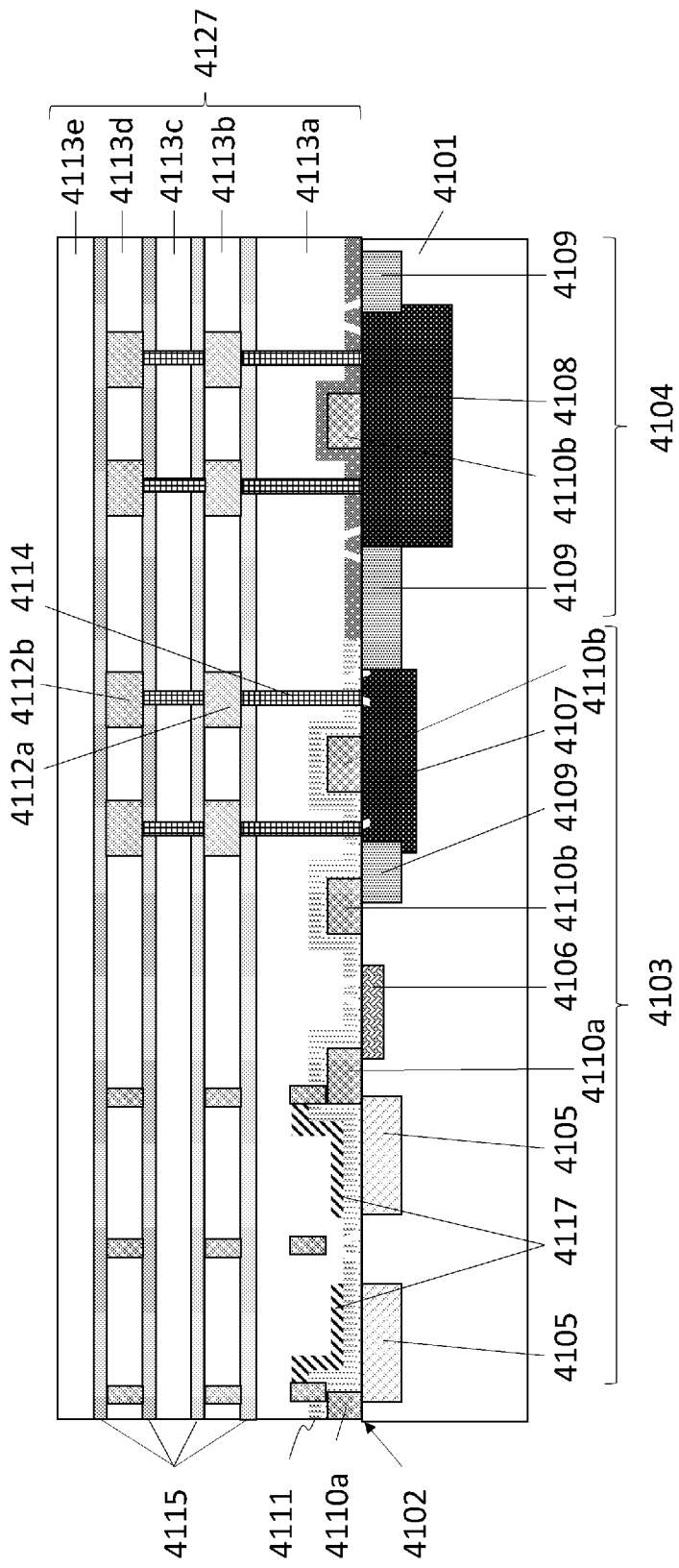
FIGS. 24A through 24H are explanatory diagrams regarding a structure and a manufacturing method for a semiconductor device according to a fourth embodiment.

In the steps illustrated in FIG. 24A, various semiconductor regions are formed in the substrate 4101, structures 4127 including gate electrodes, multilayer wiring patterns, and interlayer insulating films between the wiring patterns, are formed on the substrate 4101, and so forth. The photoelectric conversion units 4105, a floating diffusion (FD) portion 4106, a well 4107 for a pixel transistor, source and drain regions within the well 4107, and so forth, are formed in the image-capturing region 4103 of the substrate 4101. The photoelectric conversion units 4105 may be photodiodes, for example. The photoelectric conversion units 4105 include n-type semiconductor regions disposed in p-type semiconductor regions of the substrate 4101, configuring p-n junctions, for example. Charges generated by photoelectric conversion in accordance with the incident light are stored in the n-type semiconductor regions of the photoelectric conversion units 4105. The FD portion 4106 is an n-type semiconductor region disposed in the p-type semiconductor region of the substrate 4101. The conductivity type of each semiconductor region may be the opposite conductivity type. Charges generated at the photoelectric conversion units 4105 are transferred to the FD portion 4106 and are converted into voltage. The FD portion 4106 may be electrically connected to an input node of an amplifying unit. The FD portions 4106 may also be electrically connected to signal output lines. In the present embodiment, the FD portions 4106 are each electrically connected to a gate electrode 4110b of an amplifying transistor of the amplifying unit via a contact plug 4114. Source and drain regions of the amplifying transistors for amplifying signals, reset transistors for resetting the input nodes of the amplifying transistors, and so forth are formed in the wells 4107 for pixel transistors. Wells 4108 for transistors for peripheral circuits are formed in the peripheral region 4104 of the substrate 4101. Source and drain regions of transistor making up signal processing circuits for processing signals output from the photoelectric conversion units are formed in the wells 4108. Isolation portions 4109 may also be formed in the substrate 4101. The isolation portions 4109 electrically isolate elements from each other in the image-capturing region 4103 and the peripheral region 4104. The isolation portions 4109 are formed using isolation methods such as shallow trench isolation (STI), LOCal Oxidation of Silicon (LOCOS), or the like. In the steps illustrated in FIG. 24A, a transfer gate electrode 4110a, and the gate electrode 4110b of the transistors, are formed on the substrate 4101. The transfer gate electrode 4110a and the gate electrode 4110b are disposed on the substrate 4101 with a gate insulating film (omitted from illustration) disposed therebetween. Silicon oxide or the like, obtained by thermally oxidizing the substrate 4101, may be used for the gate insulating film, for example. The transfer gate electrode 4110a controls transfer of charges between the photoelectric conversion units 4105 and the FD portion 4106. The gate electrode 4110b controls the channel region of the pixel transistor and transistors for the peripheral circuits. The image-capturing region 4103 in which the photoelectric conversion units 4105 are disposed, and the peripheral region 4104 for processing signals output from the photoelectric conversion units 4105, are formed including these above-described steps. Following formation of the transfer gate electrodes 4110a and the gate electrodes 4110b, an insulator layer 4111 is formed on the substrate 4101 to serve as a protective layer. Silicon nitride, for example, may be used as the insulator layer 4111 serving as a protective layer. Alternatively, the insulator layer 4111 serving as a protective layer may be configured of a plurality of layers including silicon nitride and silicon oxide. The insulator layer 4111 serving as a protective layer may have a function of reducing damage inflicted on the photoelectric conversion units 4105 in later steps. Also, the insulator layer 4111 serving as a protective layer may have functions of preventing dispersion of metals in a silicide step for forming electrodes and so forth to make electrical connection with the gate electrode 4110b and the source and drain regions. Following formation of the insulator layer 4111 serving as a protective layer, an etch-stop portion 4117 is formed on the insulator layer 4111 serving as a protective layer disposed on the photoelectric conversion units 4105. The etch-stop portion 4117 may be formed larger than the bottom of holes 4116 formed to dispose optical waveguides in a later step, in orthogonal projection as to the principal plane 4102 of the substrate 4101. The insulator layer 4111 serving as a protective layer and the etch-stop portion 4117 do not necessarily have to be formed.

Next, structures 4127 are formed on the image-capturing region 4103 and the peripheral region 4104. The structures 4127 include interlayer insulating films 4113a through 4113e, and a plurality of wiring patterns 4112a and 4112b disposed between the interlayer insulating films 4113a through 4113e. The structures 4127 may also include, as components, the above-described insulator layer 4111 serving as a protective layer and the etch-stop portion 4117. The interlayer insulating films 4113a through 4113e electrically insulate the elements disposed on the substrate 4101 and the wiring patterns 4112a and 4112b. In the present embodiment, the wiring patterns 4112a and 4112b are formed by Damascening.

First, the interlayer insulating film 4113a is formed on the image-capturing region 4103 and the peripheral region 4104. Steps formed on the upper face of the interlayer insulating film 4113a may be planarized using CMP or the like as necessary. In the present embodiment, "upper face" means the faces of the members configuring the image-capturing device 4100 to the opposite side from the substrate 4101. A through hole is formed in the interlayer insulating film 4113a. The contact plug 4114 for electrical connection of the wiring pattern 4112a to be formed next, semiconductor regions formed in the substrate 4101, the transfer gate electrode 4110a, the gate electrode 4110b, and so forth, is disposed in the through hole. The contact plug 4114 is formed of an electroconductive material, with tungsten being used, for example.

Next, the interlayer insulating film 4113b is formed on the upper face of the interlayer insulating film 4113a, and portions of the interlayer insulating film 4113b corresponding to a region where the wiring pattern 4112a will be disposed is removed by etching. Thereafter, an electroconductive film of metal or the like serving as the material for the wiring pattern 4112a is formed on the image-capturing region 4103 and the peripheral region 4104. The formed electroconductive film is polished using CMP or the like, so as to be removed until the upper face of the interlayer insulating film 4113b is exposed. According to such procedures, the wiring pattern 4112a is formed according to a predetermined pattern.

Next, the interlayer insulating films 4113c and 4113d are formed on the image-capturing region 4103 and the peripheral region 4104. Portions of the formed interlayer insulating film 4113d that correspond to the region where the wiring pattern 4112b is disposed are removed by etching. Next, portions of the interlayer insulating film 4113c corresponding to a region where a contact plug for electrical connection between the wiring pattern 4112a and the wiring pattern 4112b is to be disposed are removed by etching. Thereafter, an electroconductive film of metal or the like serving as the material for the wiring pattern 4112b and contact plug is formed on the image-capturing region 4103 and the peripheral region 4104. The formed electroconductive film is polished by CMP or the like, so as to remove the electroconductive film until the upper face of the interlayer insulating film 4113d is exposed. According to such procedures, the wiring pattern 4112b and the contact plug are formed according to a predetermined pattern. Now, following formation of the interlayer insulating films 4113c and 4113d, portions of the interlayer insulating films 4113c and 4113d corresponding to the region where the contact plug for electrical connection between the two wiring patterns 4112a and 4112b is to be disposed may be removed first by etching. In this case, portions of the interlayer insulating film 4113d corresponding to the region where the wiring pattern 4112b is to be disposed are removed by etching next.

Next, the interlayer insulating film 4113e is formed on the image-capturing region 4103 and the peripheral region 4104. The upper face of the interlayer insulating film 4113e may be planarized using CMP or the like, as necessary. The wiring patterns 4112a and 4112b may be made using techniques other than Damascening. An example of a technique other than Damascening will be described. Following formation of the interlayer insulating film 4113a, an electroconductive film serving as the material for the wiring pattern 4112a is formed on the image-capturing region 4103 and the peripheral region 4104. Next, portions of the electroconductive film other than the regions where the wiring pattern 4112a is to be disposed are removed by etching. This yields the wiring pattern 4112a. Thereafter, the interlayer insulating films 4113b and 4113c are formed, and the wiring pattern 4112b is formed using the same technique as with the wiring pattern 4112a. Following forming the wiring pattern 4112b, the interlayer insulating films 4113d and 4113e are formed. The upper face of the interlayer insulating films 4113c and 4113e may be planarized as necessary. The wiring patterns 4112a and 4112b are disposed at different heights from each other with the principal plane 4102 of the substrate 4101 as a reference. Although copper is used for the wiring patterns 4112a and 4112b in the present embodiment, materials other than copper may be used for the electroconductive members, as long as an electroconductive material. The wiring patterns 4112a and 4112b are insulated from each other by the interlayer insulating film 4113c, other than the portions electrically connected by the contact plug. Although a two-layer configuration is illustrated for the wiring patterns in the present embodiment, a single-layer configuration may be used, or at least three layers may be used. Also, an etch-stop film, a film to prevent dispersion of metal from the wiring patterns 4112, or a film having functions of both etch-stop and metal dispersion prevention, may be disposed between each of the interlayer insulating films 4113 at the time of forming the wiring patterns 4112. In the present embodiment, silicon oxide is used as the material making up the interlayer insulating films 4113a through 4113e. Accordingly, a dispersion prevention film 4115 provided with functions of etch-stop and prevention of dispersion of metal is disposed in the present embodiment. Silicon nitride, for example, may be used as the dispersion prevention film 4115. The above-described structures 4127 may include the dispersion prevention film 4115. Depending on the configuration of wiring layers and insulating films of the structures 4127, the dispersion prevention film 4115 does not necessarily have to be disposed. As described above, a wafer including the substrate 4101 and the structures 4127 upon the substrate 4101 is prepared. Note that the wiring layers are electroconductive layers made of electroconductive material such as aluminum, copper, or the like, and accordingly the various types of wiring layers can also be referred to as electroconductive layers.

Figure 24B:
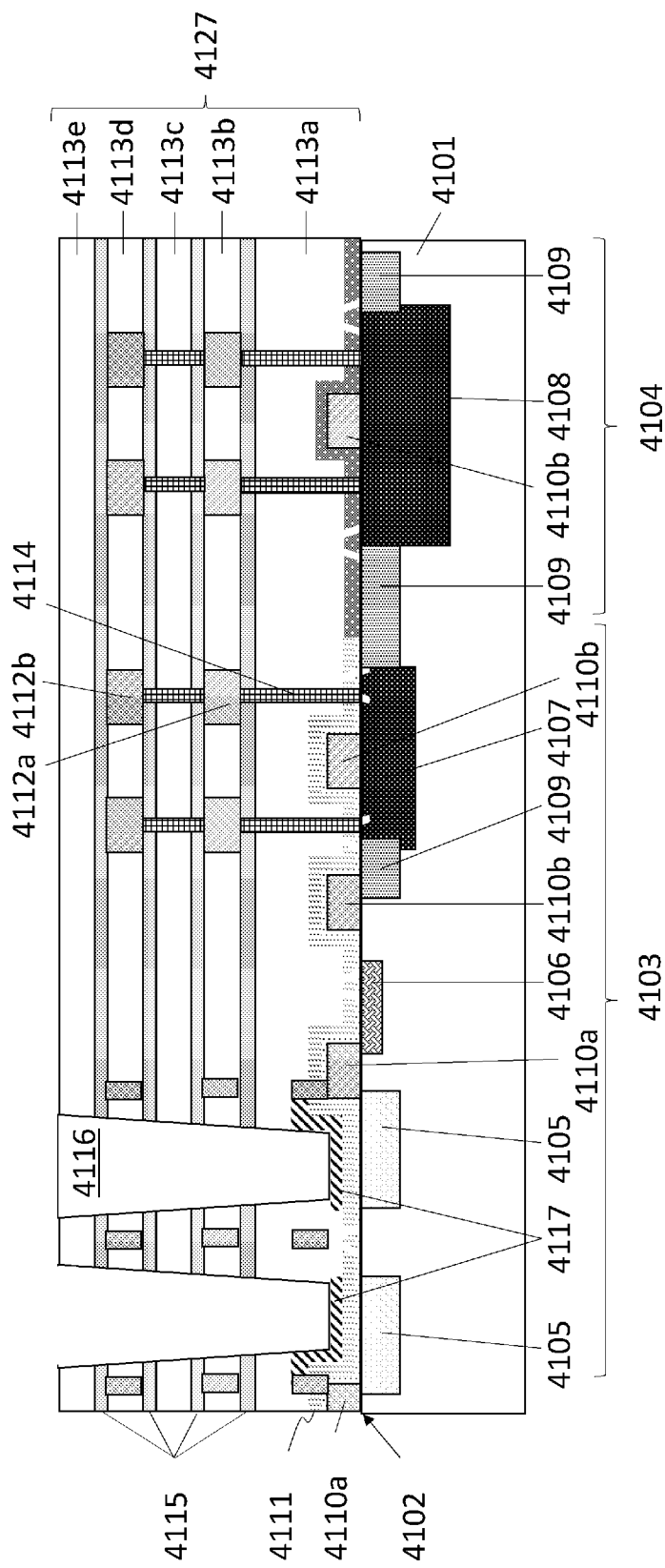

Next, the holes 4116 are formed in portions of the interlayer insulating films 4113a through 4113e above the photoelectric conversion units 4105, as illustrated in FIG. 24B. In a case where the dispersion prevention film 4115 is provided as in the present embodiment, the holes 4116 are formed in a region where the interlayer insulating films 4113a through 4113e and the dispersion prevention film 4115 overlap the photoelectric conversion units 4105 in orthogonal projection as to the principal plane 4102. It is sufficient for the holes 4116 to be disposed with at least part thereof overlapping the photoelectric conversion units 4105 in orthogonal projection as to the principal plane 4102.

At the beginning of formation of the holes 4116, a resist mask (omitted from illustration) for etching is formed on the upper face of the interlayer insulating film 4113e. The resist mask for etching has openings in the regions where the holes 4116 are to be disposed. The resist mask for etching may be a photoresist patterned by photolithography, for example. Next, the interlayer insulating films 4113a through 4113e and the dispersion prevention film 4115 are etched using the resist mask for etching as a mask. Thus, the holes 4116 are formed. The step of etching to form the holes 4116 may be continuous etching under a single condition, or etching may be performed a plurality of times under different conditions. The resist mask for etching may be removed after the holes 4116 are formed.

The structures 4127 are formed on the image-capturing region 4103 and the peripheral region 4104 by the steps illustrated in FIGS. 24A and 24B. The structures 4127 include the interlayer insulating films 4113 having the plurality of holes 4116 each disposed above the plurality of photoelectric conversion units 4105, and the wiring patterns 4112 disposed in the interlayer insulating films.

In a case where the etch-stop portion 4117 is disposed as in the configuration illustrated in FIG. 24B, the etching for forming the holes 4116 may be performed until the etch-stop portion 4117 is exposed. A material that has a smaller etching rate than the interlayer insulating films 4113a through 4113e under the etching conditions of etching the interlayer insulating films 4113a through 4113e may be used for the etch-stop portion 4117. Silicon nitride or silicon oxynitride may be used as the material for the etch-stop portion 4117 in a case of using silicon oxide for the interlayer insulating films 4113a through 4113e. The step of etching to form the holes 4116 and to expose the etch-stop portion 4117 may be continuous etching under a single condition, or etching may be performed a plurality of times under different conditions. The holes 4116 do not necessarily have to penetrate all of the interlayer insulating films 4113a through 4113e. Recesses that the interlayer insulating films 4113a through 4113e have may be the holes 4116. The planar shape of the holes 4116 is a closed outline, where the boundaries of the holes 4116 are circular, square, or the like. Also, the planar shape of the holes 4116 may be a shape like a trench extending over a plurality of photoelectric conversion units 4105. That is, it can be said in the present embodiment that in a case where a region of a certain lateral plane in which the interlayer insulating film 4113e is not disposed is surrounded by a region in which the interlayer insulating film 4113e is disposed, or is interposed between such regions, where the interlayer insulating film 4113e is disposed, has the holes 4116. In the present embodiment, the holes 4116 are formed at positions overlapping the photoelectric conversion units 4105, and no holes 4116 are formed on the peripheral region 4104, in orthogonal projection as to the principal plane 4102. However, holes 4116 may be formed in the peripheral region 4104. In this case, the density of the holes 4116 formed in the image-capturing region 4103 may be higher than the density of the holes 4116 formed in the peripheral region 4104. The density of the holes 4116 may be decided by the number of the holes 4116 disposed per unit area. Also, the density of the holes 4116 may be decided by the percentage of area that the holes 4116 occupy.

Figure 24C:
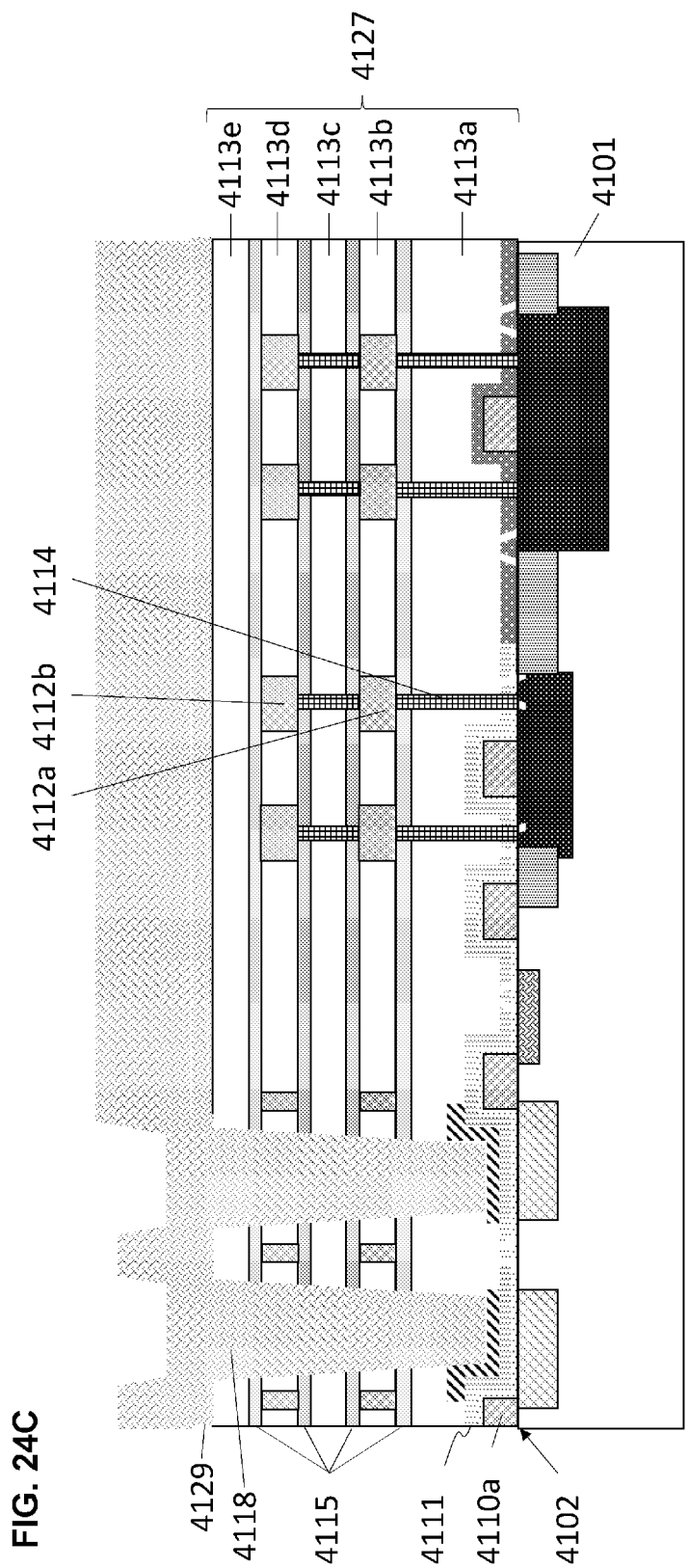
Figure 24D:
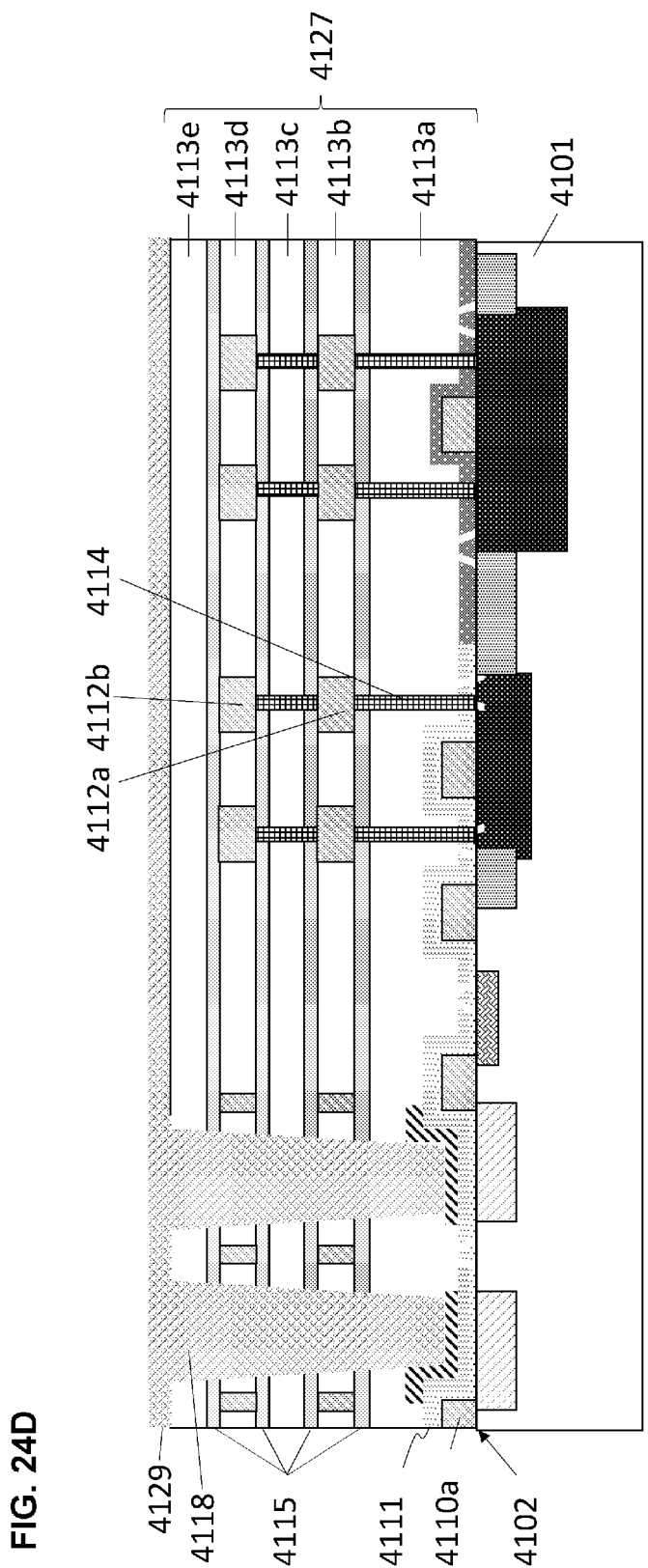

Next, as illustrated in FIG. 24C, a dielectric material film 4129 using a material making up optical waveguides is formed, covering the structures 4127 disposed on the image-capturing region 4103 and the peripheral region 4104, while filling in the plurality of holes 4116. The dielectric material film 4129 is formed using, for example, CVD, sputtering, or the like. FIG. 24D illustrates a state after planarization processing of the dielectric material film 4129. The dielectric material film 4129 has portions that fill in the holes 4116 and function as optical waveguide core portions, and portions disposed above the image-capturing region 4103 and the peripheral region 4104 other than the holes 4116, as illustrated in FIG. 24D. Hereinafter, portions within the holes 4116 that function as optical waveguide core portions will also be referred to as "dielectric member 4118". Formation of the dielectric material film 4129 may be continuous under a single condition, or formation may be performed using a plurality of steps under different conditions. For example, in a first step, part of the dielectric material film 4129 may be formed using conditions under which adhesiveness to the base interlayer insulating films 4113a through 4113e is high, and in the following step, the remainder of the dielectric material film 4129 may be formed using conditions under which filling characteristics of the holes 4116 are high. Also, the dielectric material film 4129 may be formed by sequentially forming a plurality of different materials. In a case where the interlayer insulating films 4113a through 4113e are etched so that the etch-stop portion 4117 is exposed in the step in FIG. 24B, the portions of the dielectric material film 4129 functioning as the optical waveguides are disposed coming into contact with the etch-stop portion 4117. Also, the dielectric material film 4129 may completely fill the holes 4116, as illustrated in FIG. 24C. Alternately, the dielectric material film 4129 may have partial space not filled by the dielectric material.

A material that has a higher refractive index than the refractive index of the interlayer insulating films 4113a through 4113e may be used as the material of the dielectric material film 4129. In a case where the interlayer insulating films 4113a through 4113e are formed of silicon oxide, the material of the dielectric material film 4129 may be silicon nitride. While silicon oxide has a refractive index of approximately 1.45, silicon nitride has a refractive index of approximately 2.00. Accordingly, light reflects at the interface between the optical waveguides and the interlayer insulating films 4113a through 4113e configured at the positions where the holes 4116 have been filled in with the dielectric material film 4129, in accordance with Snell's law. Accordingly, incident light above the photoelectric conversion units 4105 can be trapped within the optical waveguides. Also, in a case of using silicon nitride as the material for the dielectric material film 4129, the amount of hydrogen contained in the silicon nitride can be increased at the time of formation, and dangling bonds of the substrate 4101 can be effectively terminated by this hydrogen. This enables noise such as white flaws to be reduced. The material of the dielectric material film 4129 can be selected as appropriate, taking into consideration balancing optical characteristics such as difference in refractive index as to the interlayer insulating films 4113a through 4113e, and favorable characteristics in manufacturing steps.

The positional relation between the interlayer insulating films 4113a through 4113e and the core portions of the optical waveguides disposed in the plurality of holes 4116 will be described. In a certain lateral plane, regions where the core portions of the optical waveguides are disposed are surrounded by a region, or is interposed between regions, where the interlayer insulating films 4113a through 4113e are disposed. In other words, the core portions of the optical waveguides disposed in the holes 4116 are arrayed in a direction orthogonal to the direction in which the photoelectric conversion units 4105 and the core portions of the optical waveguides disposed in the holes 4116 face each other. The direction orthogonal to the direction in which the photoelectric conversion units 4105 and the core portions of the optical waveguides disposed in the holes 4116 face each other is a direction parallel to the principal plane 4102 of the substrate 4101, for example.

In orthogonal projection as to the principal plane 4102, the core portions of the optical waveguides disposed in the holes 4116 are disposed at positions overlapping the photoelectric conversion units 4105 in the substrate 4101. In the present embodiment, refractive index of the dielectric material film 4129 configuring the core portions of the optical waveguides using silicon nitride is higher than the refractive index of the interlayer insulating films 4113a through 4113e using silicon oxide. Due to this relation of refractive indices, the amount of stray light entering the interlayer insulating films 4113a through 4113e out of the incident light to the core portions of the optical waveguides above the photoelectric conversion units 4105 can be reduced. Accordingly, the amount of light incident to the photoelectric conversion units 4105 can be increased if at least part of the core portions of the optical waveguides disposed in the holes 4116 overlap the photoelectric conversion units 4105 in orthogonal projection as to the principal plane 4102.

The refractive index of the dielectric material film 4129 configuring the optical waveguides does not necessarily have to be higher than the refractive index of the interlayer insulating films 4113a through 4113e. For example, the core portions of the optical waveguides will function as optical waveguides if the configuration is such that light incident thereto does not stray into the surrounding interlayer insulating films 4113a through 4113e. For example, reflecting material such as metal or the like that reflect light may be disposed on the side walls of the holes 4116, and the material configuring the core portions of the optical waveguides may be filled in the other portions of the holes 4116. Also, an air gap may be formed between the core portions of the optical waveguides disposed in the holes 4116 and the interlayer insulating films 4113a through 4113e, for example. The air gap may be a vacuum, or may be filled with a gas. In such cases, the relation in magnitude of refractive indices between the refractive index of the material of the members configuring the core portions of the optical waveguides and the refractive index of the material of the interlayer insulating films 4113a through 4113e is irrelevant.

FIG. 24C illustrates a state in which silicon nitride serving as the material for forming the core portions of the optical waveguides is deposited in the holes 4116 illustrated in FIG. 24B, thereby forming the dielectric material film 4129. The film thickness of the dielectric material film 4129 formed differs depending on the depth of the holes 4116 at the time of forming the core portions of the optical waveguides. For example, when the depth of the holes 4116 is deep, the height of the core portions of the optical waveguides to be formed becomes high, and the dielectric material film 4129 needs to be formed thicker. It is known that the thicker films formed by CVD, sputtering, or the like is, the greater the stress is. Accordingly, when forming the dielectric material film 4129, deposited matter that has adhered to the inner walls of the processing chamber of the manufacturing device may peel off from the wall portions and fall down more readily as the film becomes thicker. In a case where deposited matter peels off and falls from the inner walls of the processing chamber while forming the dielectric material film 4129, the deposited matter that has peeled off may become incorporated in the dielectric material film 4129 as foreign matter 4130.

Cleansing processing is also performed at the time of forming the dielectric material film 4129, to remove foreign matter that is generated. Formation of the dielectric material film 4129 may be performed over a plurality of times, in which case cleansing processing is performed following each film formation. The cleansing method is cleansing using a liquid, an example of which is two-fluid cleansing using nanospray.

Next, planarization processing is performed to resolve steps formed in the upper face of the dielectric material film 4129. FIG. 24D illustrates a planarization step of forming the dielectric material film 4129 having an upper face including a planarized planar face on the image-capturing region 4103 and the peripheral region 4104. This planarization may be performed with a known method other than CMP. For example, planarization may be performed by polishing or the like. In this planarization step, the planar face that has been subjected to planarization in the upper face of the dielectric material film 4129 does not need to be completely planar, as illustrated in FIG. 24D. It is sufficient for the step on the upper face of the dielectric material film 4129 prior to performing planarization to be reduced by the planarization step. Also, portions of the dielectric material film 4129 disposed at positions other than the holes 4116, i.e., portions in contact with the upper face of the interlayer insulating film 4113e that is the topmost of the structures 4127, may have a thickness of around at least 50 nm and not more than 350 nm.

In the present embodiment, the interlayer insulating film 4113e disposed on the top of the wiring pattern 4112b is formed of silicon oxide, as described above. However, out of the interlayer insulating films 4113a through 4113e, the material of the interlayer insulating film 4113e that comes into contact with the dielectric material film 4129 at portions other than the holes 4116 is not limited to silicon oxide. For example, an arrangement may be made where silicon carbide is used as the interlayer insulating film 4113e, and silicon nitride is deposited there upon as the dielectric member 4118 (dielectric material film 4129). It is sufficient for the material of the interlayer insulating film 4113e to be a material that has high resistivity and functions as an insulator, as compared to the electroconductive member of the wiring pattern 4112b. The silicon carbide has higher resistivity than the electroconductive member of the wiring pattern 4112b, and accordingly can function as an insulator.

Figure 24E:
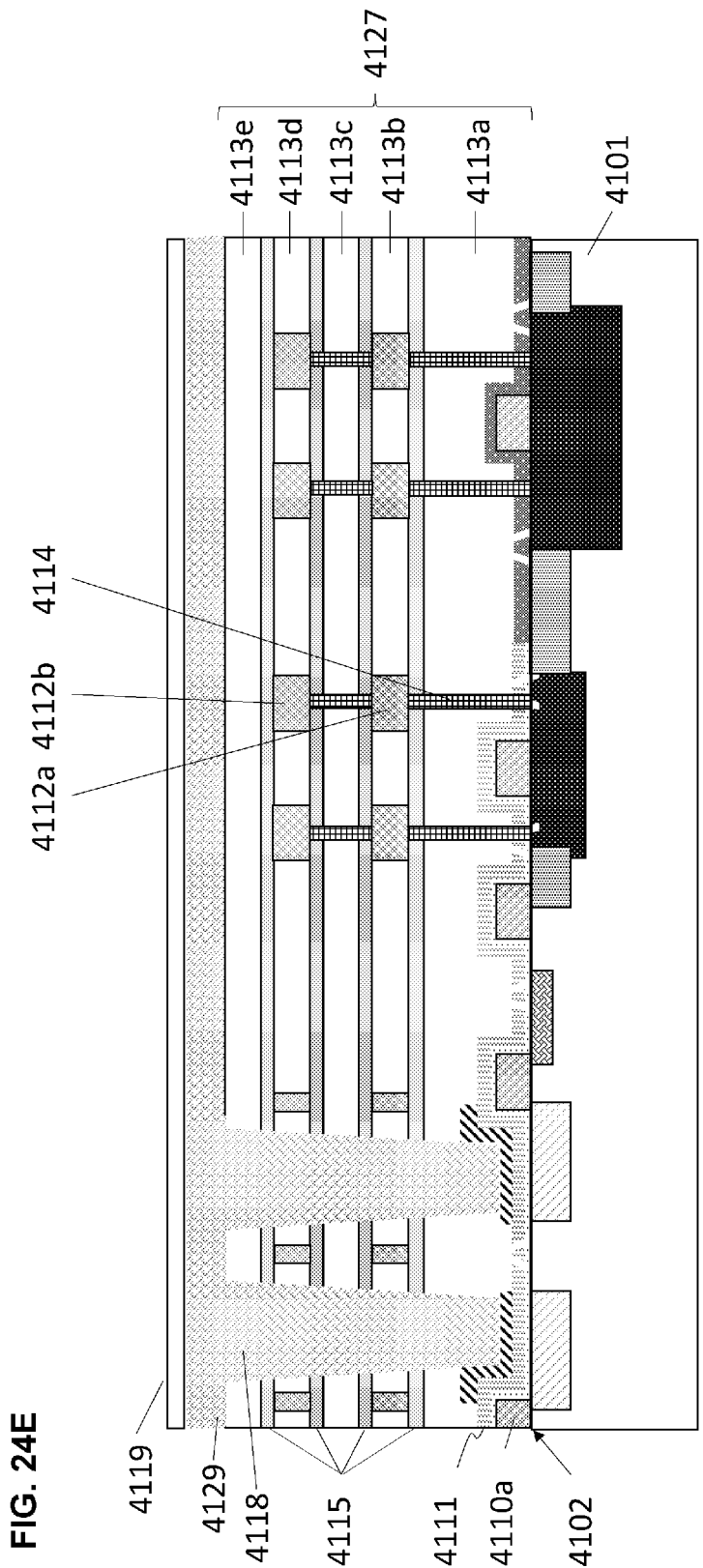

Next, a low-refractive-index film 4119 is formed on the image-capturing region 4103 and the peripheral region 4104 so as to cover the dielectric material film 4129. The low-refractive-index film 4119 may be an insulating film. A state in which the low-refractive-index film 4119 is formed is illustrated in FIG. 24E. The refractive index of the low-refractive-index film 4119 is lower than the refractive index of member that is disposed on substrate 4101 side of the low-refractive-index film 4119 and that is in contact with the low-refractive-index film 4119. A member that is disposed on substrate 4101 side of the low-refractive-index film 4119 and that is in contact with the low-refractive-index film 4119 is a member that is exposed prior to formation of the low-refractive-index film 4119. In the present embodiment, the dielectric member 4118 corresponds to this member. Accordingly, in the present embodiment, the refractive index of the low-refractive-index film 4119 is a lower refractive index than the refractive index of the dielectric member 4118. In the present embodiment, the low-refractive-index film 4119 is formed using silicon oxynitride. The refractive index of silicon oxynitride is approximately 1.72. The low-refractive-index film 4119 does not necessarily have to be provided. In a case of not providing the low-refractive-index film 4119, the step illustrated in FIG. 24E can be omitted.

Figure 24F:
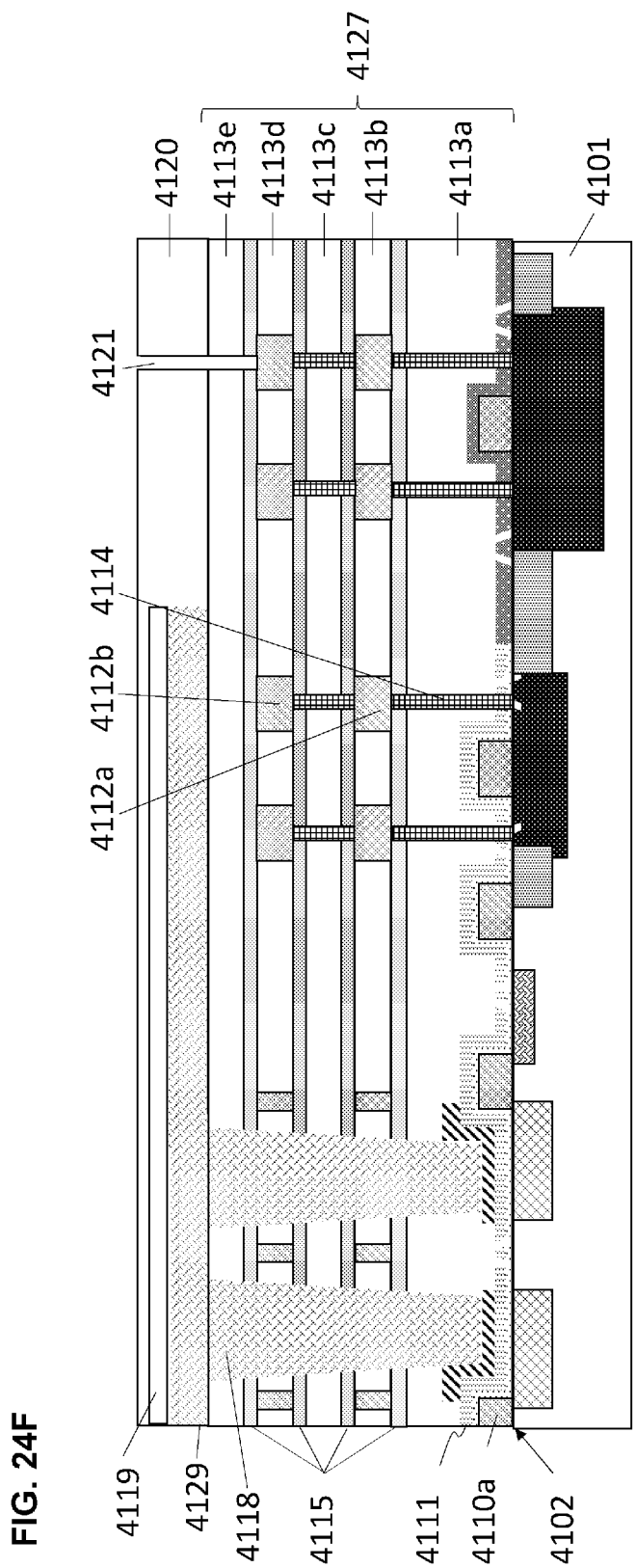

Next, as illustrated in FIG. 24F, a removal step of removing the region of the dielectric material film 4129 formed on the peripheral region 4104 is performed. In this removal step, out of the dielectric material film 4129 disposed on the peripheral region 4104, the portion disposed on at least part of the wiring pattern 4112b is removed so that the interlayer insulating film 4113e is exposed. A contact plug for electrically connecting between the wiring pattern 4112b and a member outside from the structures 4127 is disposed in this portion by a later-described step. The dielectric material film 4129 formed on the peripheral region 4104 may be completely removed, as illustrated in FIG. 24E. Also, in a case where the low-refractive-index film 4119 is disposed on the dielectric material film 4129 as in the configuration illustrated in FIG. 24E, a part of the low-refractive-index film 4119 corresponding to the same part of the dielectric material film 4129 is also removed. Known methods can be used for the removal. In the present embodiment, regions of the dielectric material film 4129 and the low-refractive-index film 4119 disposed on the peripheral region 4104 is removed by etching. Also, part of the dielectric material film 4129 disposed on the image-capturing region 4103 may be removed by this removal step. The amount of incident light to the photoelectric conversion units 4105 can be increased by a part of the dielectric material film 4129 formed to configure the core portions of the optical waveguides being left remaining disposed on at least the holes 4116.

Following removing the portion of the low-refractive-index film 4119 formed on the peripheral region 4104 by etching, stripping processing is performed to remove the residue. Thereafter, an interlayer insulating film 4120 is formed covering the dielectric material film 4129, the low-refractive-index film 4119, and the interlayer insulating film 4113e, as illustrated in FIG. 24F. The interlayer insulating film 4120 is formed on the image-capturing region 4103 and the peripheral region 4104. The interlayer insulating film 4120 may be formed of the same material as the interlayer insulating film 4113e. The upper face of the interlayer insulating film 4120 may be planarized as necessary.

Following forming the interlayer insulating film 4120, a through hole 4121 is formed in the interlayer insulating film 4120 at a position overlaying a predetermined portion of the wiring pattern 4112b, as illustrated in FIG. 24F. The through hole 4121 can be formed by etching the interlayer insulating film 4120 and the interlayer insulating film 4113e, for example.

Figure 24G:
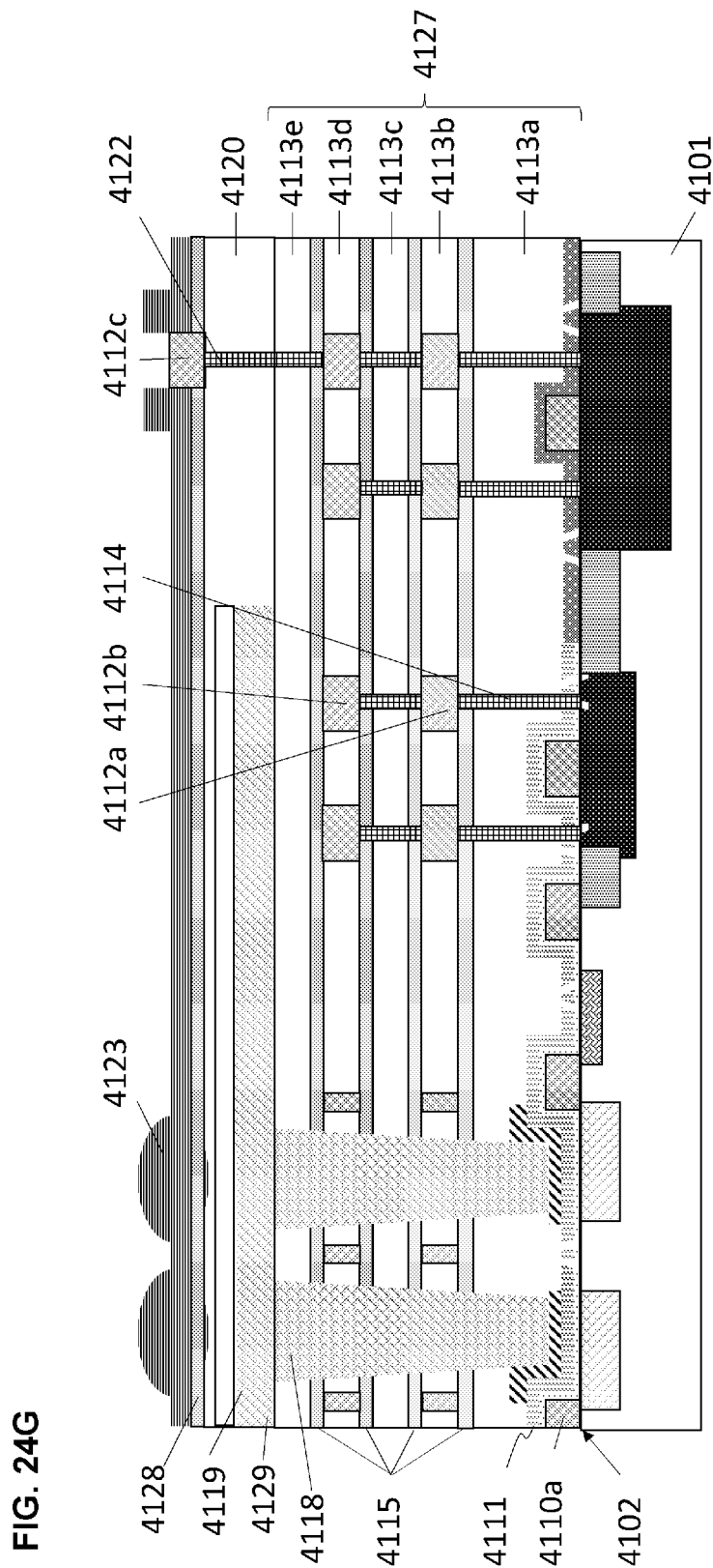
Figure 24H:
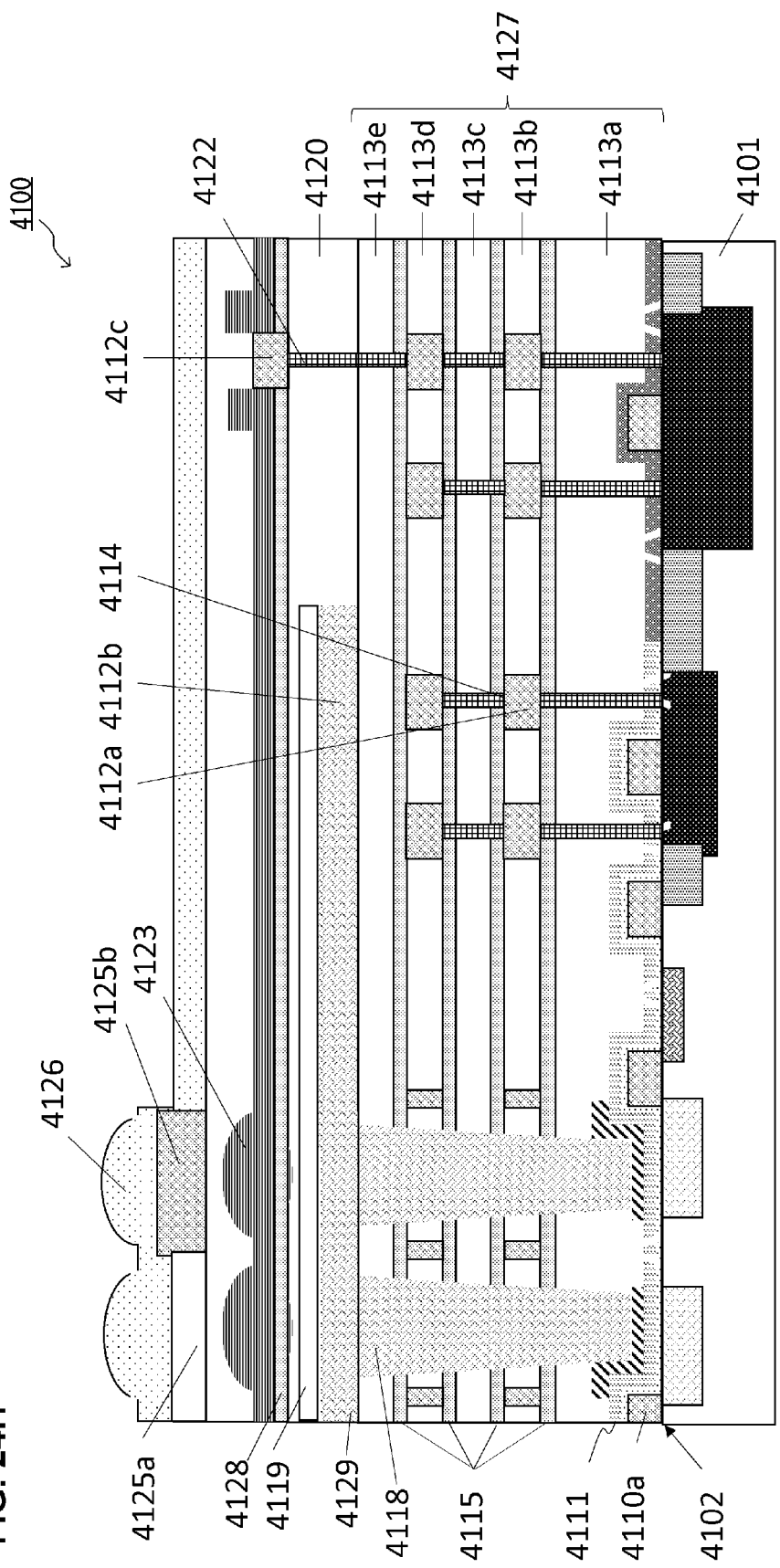

Next, in the step illustrated in FIG. 24G, a wiring pattern 4112c and in-layer lenses 4123 are formed. First, a contact plug 4122 is formed in the through hole 4121. The contact plug 4122 electrically connects a predetermined portion of the wiring pattern 4112b and a predetermined portion of the wiring pattern 4112c that is disposed outside of the structures 4127 following formation of the contact plug 4122. Tungsten, for example, is used for the contact plug 4122. It is sufficient for the material making up the contact plug 4122 to be an electroconductive material, and the material is not limited to tungsten.

Next, the wiring pattern 4112c is formed. In the present embodiment, aluminum is used for the wiring pattern 4112c. As for the method of forming the wiring pattern 4112c, the method described above in the steps of forming the wiring patterns 4112a and 4112b is used as appropriate. It is sufficient for the wiring pattern 4112c to be formed of an electroconductive material, and the material is not limited to aluminum. Also, a plurality of the in-layer lenses 4123 are formed in this step. Each of the in-layer lenses 4123 is disposed corresponding to each of the plurality of photoelectric conversion units 4105. The in-layer lenses 4123 are formed of silicon nitride, for example. A known method can be used to form the in-layer lenses 4123.

In the configuration illustrated in FIG. 24G, the material forming the in-layer lenses 4123 is disposed in the peripheral region 4104 as well. However, the material forming the in-layer lenses 4123 may be disposed in the image-capturing region 4103 alone. Also, an intermediate film 4128 that has an intermediate refractive index between that of the in-layer lenses 4123 and the interlayer insulating film 4120 may be disposed therebetween. In the present embodiment, the intermediate film 4128 formed using silicon oxynitride is disposed between the in-layer lenses 4123 and the interlayer insulating film 4120. The silicon nitride film used for the in-layer lenses 4123 has a refractive index of approximately 2.00, the silicon oxynitride used for the intermediate film 4128 has a refractive index of approximately 1.72, and the silicon oxide used for the interlayer insulating film 4120 has a refractive index of approximately 1.45. The refractive index can be lowered by having such a configuration.

The effects of the intermediate film 4128 will be described in brief. Generally, when light advances from a medium with a refractive index of n1 to a medium with a refractive index of n2, the greater the difference between n1 and n2 is, the greater the reflectance is. By disposing the intermediate film 4128 that has an intermediate refractive index of the two between the in-layer lenses 4123 and the interlayer insulating film 4120, the difference in refractive index at the interface is reduced. As a result, the reflectance in a case of incident light entering the interlayer insulating film 4120 from the in-layer lenses 4123 can be reduced as compared to a case of the in-layer lenses 4123 and the interlayer insulating film 4120 being disposed in contact with each other. In the same way, disposing the low-refractive-index film 4119 that has an intermediate refractive index of the interlayer insulating film 4120 and the dielectric member 4118 between the two reduces the difference in refractive index at the interface. As a result, the reflectance in a case of incident light from the interlayer insulating film 4120 to the core portions of the optical waveguides configured of the dielectric member 4118 can be reduced.

The degree of reduction of reflectance due to the intermediate film 4128 having been disposed changes depending on the relation between the thickness d and refractive index N of the intermediate film 4128, and the wavelength p of incident light. This is because multi-reflection light from a plurality of interfaces cancel each other out. Logically, in a case of the conditions in the following Expression (1), reflectance is maximally reduced, $$d = \frac{p}{4N}(2k+1) \tag{1}$$

where k is an optional integer of at least 0.

That is to say, in a case where the thickness of the intermediate film 4128 is an odd multiple of p/4N, theoretically, the reflectance is maximally reduced. Accordingly, the film thickness of the intermediate film 4128 can be set on the basis of the above Expression (1). In particular, the film thickness of the intermediate film 4128 preferably satisfies the following Expression (2). Even more preferably, k=0 in the Expression (2).

$$\frac{p}{4N}(2k+0.5) < d < \frac{p}{4N}(2k+1.5) \tag{2}$$

For example, a case will be considered where the refractive index of the interlayer insulating film 4120 is 1.45, the refractive index of the intermediate film 4128 is 1.72, the refractive index of the in-layer lenses 4123 is 2.00, and the wavelength of light incident to the image-capturing device 4100 is 550 nm. In this case, with the film thickness of the intermediate film 4128 as 80 nm, the transmittance of light transmitted from the in-layer lenses 4123 to the interlayer insulating film 4120 is approximately 1.00. In contrast to this, in a case where the in-layer lenses 4123 and the interlayer insulating film 4120 are disposed in contact with each other, the transmittance is approximately 0.97.

Following forming the in-layer lenses 4123, color filters 4125a and 4125b, and microlenses 4126 are formed by steps illustrated in FIG. 24H. First, an interlayer insulating film 4124 is formed on the in-layer lenses 4123. The interlayer insulating film 4124 is an insulating film formed of an organic material, for example. The upper face of the interlayer insulating film 4124 is planarized as necessary. For example, the interlayer insulating film 4124 with a planarized upper face can be formed by coating with the organic material from which the interlayer insulating film 4124 is made.

Next, the color filters 4125a and 4125b are formed. The color filters 4125a and 4125b are each disposed corresponding to the photoelectric conversion units 4105. The wavelength of light transmitted through the color filter 4125a and the wavelength of light transmitted through the color filter 4125b may differ from each other. Following this, the microlenses 4126 are formed above the color filters 4125a and 4125b. A known method can be used for the method to form the microlenses 4126. Optical members such as the color filters 4125a and 4125b, the microlenses 4126, and so forth, are preferably formed by single-batch exposure.

The image-capturing device is manufactured by the above-described steps.

(Exposure Processing)

Exposure processing in the above manufacturing steps will be described.

Figure 25:
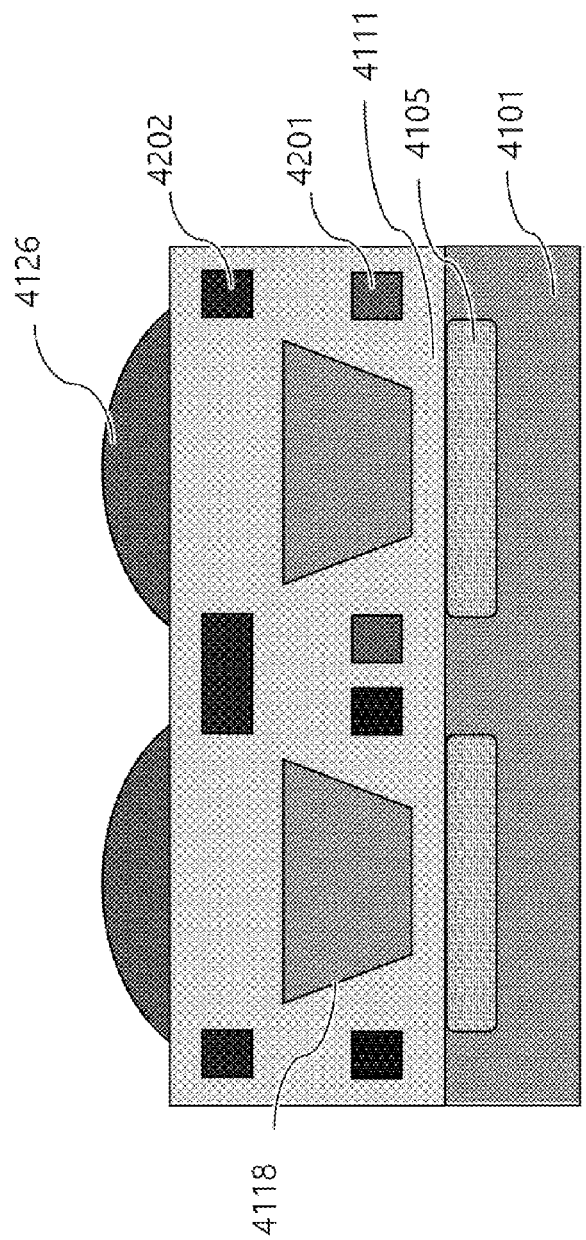
FIG. 25 is a diagram for describing exposure processing according to the fourth embodiment.

FIG. 25 is a diagram illustrating the structure of the image-capturing device in a simplified manner. Members that are the same as in the above description are denoted by the same reference signs. The photoelectric conversion units (light-receiving regions) 4105 are formed in the substrate 4101. The insulator layer 4111 is formed in on the light-incident side of the photoelectric conversion units 4105. Wiring patterns 4201 and 4202, and the dielectric member 4118 are formed in the insulator layer 4111. Note that here, no distinction is made between the insulator layer on the substrate 4101 and the interlayer insulating film between wiring layers, and these are collectively referred to as the insulator layer 4111. The microlenses 4126 are formed upon a structure including the insulator layer, wiring patterns, and waveguides.

In the present embodiment, the wiring pattern 4201 is formed on a wafer including the insulator layer 4111 disposed on the substrate 4101, by a plurality of times of exposure processing in which a plurality of partial patterns are connected (connecting exposure, split exposure). Although the wiring pattern 4201 is illustrated in FIG. 25 as being singular, the wiring pattern 4201 may be a plurality of layers, as illustrated in FIGS. 24A through 24H and so forth.

The patterning of the dielectric member 4118 is formed by single-batch exposure. That is to say, formation of the holes for the waveguides is performed by single-batch exposure. Formation of these holes corresponds to processing the insulator layer following formation of wiring. The dielectric member 4118 is formed by filling (disposing) the dielectric material in the holes following formation thereof.

Note that formation of the opening for a through electrode in the above-described manufacturing step also corresponds to processing the insulator layer following formation of wiring. Part or all of such patterning may be performed by single-batch exposure.

In the present embodiment, the wiring pattern 4202 may be formed on the upper layer of the dielectric member 4118 by single-batch exposure. The wiring pattern 4202 has openings corresponding to the dielectric member 4118. The wiring pattern 4202 may also be a plurality of layers.

The microlenses 4126 are formed on the insulator layer 4111 by single-batch exposure. Optical members other than the microlenses 4126 may be formed on the insulator layer 4111 by single-batch exposure.

Thus, the wiring pattern 4202 and the microlenses 4126 are both formed by single-batch exposure in the present embodiment, and accordingly the alignment deviation between the openings that the pattern of the wiring pattern 4202 has and the microlenses 4126 can be minimized. Accordingly, the effects of mechanical vignetting of incident light due to the wiring pattern 4202 can be reduced. Further, the dielectric member 4118 and the microlenses 4126 are both formed by single-batch exposure so alignment precision therebetween can be sufficiently secured, and incident light can be guided to the photoelectric conversion units 4105 more efficiently. Improved sensitivity of the image-capturing device according to the manufacturing method of the present embodiment can be anticipated due to these factors.

Although an example of forming the wiring pattern 4201 that is the lower layer by connecting exposure and forming the wiring pattern 4202 that is the upper layer by single-batch exposure has been given here, both may be formed by connecting exposure. This is also true in a case where there are at least three wiring layers. Also, an arrangement may be made where a wiring layer is not formed between the dielectric member 4118 and the microlenses 4126 as illustrated in FIGS. 24A through 24H. In this case as well, the advantages of improved sensor sensitivity due to improved alignment precision can be obtained by forming both the dielectric member 4118 and the microlenses 4126 by single-batch exposure.

Patterning of the dielectric member 4118 may also be performed by connecting exposure. In this case, sufficient alignment precision can be secured as to the wiring pattern 4201 patterned by a plurality of times of exposure in the same way. The risk of breakage of metal wiring due to interference with the metal wiring at the time of patterning the dielectric member 4118 is resolved, and improved yield of the wiring can be anticipated. In a case of performing patterning of the dielectric member 4118 by connecting exposure, it is not necessarily required to embed material with a higher refractive index than the insulator layer in the dielectric member 4118 to yield the effects of improved wiring yield.

Fifth Embodiment

The present embodiment provides a manufacturing method that suppresses dissolution of metal wiring due to inclusion of foreign matter during the manufacturing process of a semiconductor device.

The present inventor has found that there is the following problem in the waveguide formation process of the image-capturing device. That is to say, the present inventor has found that foreign matter incorporated during film formation generates cracks that expose the metal wiring, and dissolution of the metal wiring occurs in subsequent steps, causing quality defects. More specifically, quality defects occur due to the following phenomenon.

There are cases where foreign matter is generated at the time of film formation of the material for the optical waveguides, and becomes incorporated in the material film as foreign matter. There are cases where effects thereof cause cracks, which are generated starting from the foreign matter and reaching the metal wiring disposed in the interlayer insulating films, and the metal wiring patterns disposed in the interlayer insulating films become exposed, for example. In a case of performing chemical solution treatment, such as, for example, cleansing processing to remove foreign matter generated during film formation, processing of stripping resist, and so forth, in a state with the metal wiring exposed, there is a possibility that the chemical solution will penetrate through the cracks that have occurred and reach the metal wiring, thereby dissolving the metal wiring and causing quality defects. Following passing through the above steps, a film for protecting the device is formed, and accordingly defects, including cracks, are covered. Accordingly, the steps that require measures against quality defects are the steps following formation of the optical waveguides up to covering defects with the protective film.

The present embodiment provides technology that suppresses defects occurring due to dissolution of metal wiring in an image-capturing device having optical waveguides.

(Overview)

The manufacturing method for the image-capturing device (semiconductor device) according to the present embodiment is basically the same as the manufacturing method described in the fourth embodiment with reference to FIGS. 24A through 24H. Characteristic steps of the present embodiment will be described below. Also, FIGS. 26A through 26D are diagrams describing defects that can be suppressed by the present embodiment. Note that the substrate 4101 is omitted from illustration in FIGS. 26A through 26D.

The manufacturing steps of the image-capturing device have been described in the fourth embodiment, and accordingly steps that have particular bearing on the present embodiment will be briefly described. First, the step of processing the insulator layers to form the holes 4116 (FIG. 24B), the step of forming the dielectric material film 4129 to fill the holes with the dielectric members 4118 (FIG. 24C), and the cleansing step and planarizing step of the dielectric material film 4129 (FIG. 24D) are performed in this order. Thereafter, the step of removing part of the dielectric material film 4129, the step of forming the insulating film 4120, and the step of forming the through hole 4121 in the insulating film 4120 so that the wiring layer (electroconductive layer) is exposed (FIG. 24F) are included.

As described above, there is a possibility of cracks where the metal wiring is exposed occurring due to foreign matter generated during film formation of the dielectric member (dielectric material film). Accordingly, in the present embodiment, the wafer is treated with a liquid (chemical solution) including a corrosion inhibitor (anti-corrosion agent) at a point following formation of the dielectric material film (following filling the holes with the dielectric member), and prior to a step of processing the insulating films so that metal wiring is exposed, such as formation of the hole for the through electrode (via). Examples include coating the dielectric member with a chemical solution containing a corrosion inhibitor, cleansing the wafer with a chemical solution containing a corrosion inhibitor, and performing CMP processing of the wafer using a slurry containing a corrosion inhibitor. More specifically, in the present embodiment, the dielectric member 4118 is coated with a chemical solution containing a wiring corrosion inhibitor following the step of filling the holes 4116 for the waveguides with the dielectric member 4118. This coating of the dielectric member 4118 with the chemical solution containing a wiring corrosion inhibitor is performed prior to the step of forming the through hole 4121 for the contact plug 4122, in which the wiring pattern 4112 is exposed. In yet other words, the present embodiment includes a step of coating the dielectric member with a chemical solution containing a corrosion inhibitor following a step in which there is a possibility that metal wiring will be exposed by a crack due to inclusion of foreign matter even though exposing the metal wiring is not intended, and prior to a step in which exposing the metal wiring is intended.

According to the present embodiment, including such a coating step can suppress dissolution of metal wiring in subsequent steps even if a crack where metal wiring is exposed occurs. To this end, the coating step of a chemical solution containing a corrosion inhibitor according to the present embodiment is performed prior to chemical solution treatment of the dielectric material in which there is a possibility of a crack having occurred by a chemical solution containing a component that would dissolve the metal wiring.

The corrosion inhibitor used in the present embodiment is a mixture where a volatile corrosion inhibitor is adjusted to a predetermined concentration. Types of volatile corrosion inhibitors include benzotriazole, tolyltriazole, monoethanolamine benzoate, and so forth. Adjustment may be performed with water as the solvent, and with the concentration in a range of 0.01% by weight to 2.0% by weight.

Example 5-1

The manufacturing method for an image-capturing device (semiconductor device) according to the present embodiment will be described, primarily regarding points of difference as compared to the manufacturing method for the reference example described in the fourth embodiment with reference to FIGS. 24A through 24H.

In the present example, coating of the dielectric material film 4129 with a chemical solution containing a corrosion inhibitor is performed following formation of the dielectric material film 4129 (following the processing of filling the holes) illustrated in FIG. 24C, and prior to the cleansing step for removing foreign matter generated during formation of the dielectric material film 4129. In a case of dividing the formation of the dielectric material film 4129 into a plurality of times and performing cleansing processing each time, the coating is performed prior to each and every cleansing processing. In the present example, benzotriazole adjusted to a concentration of 0.05% by weight by a water solvent is used as the chemical solution, for example.

Figure 26A:
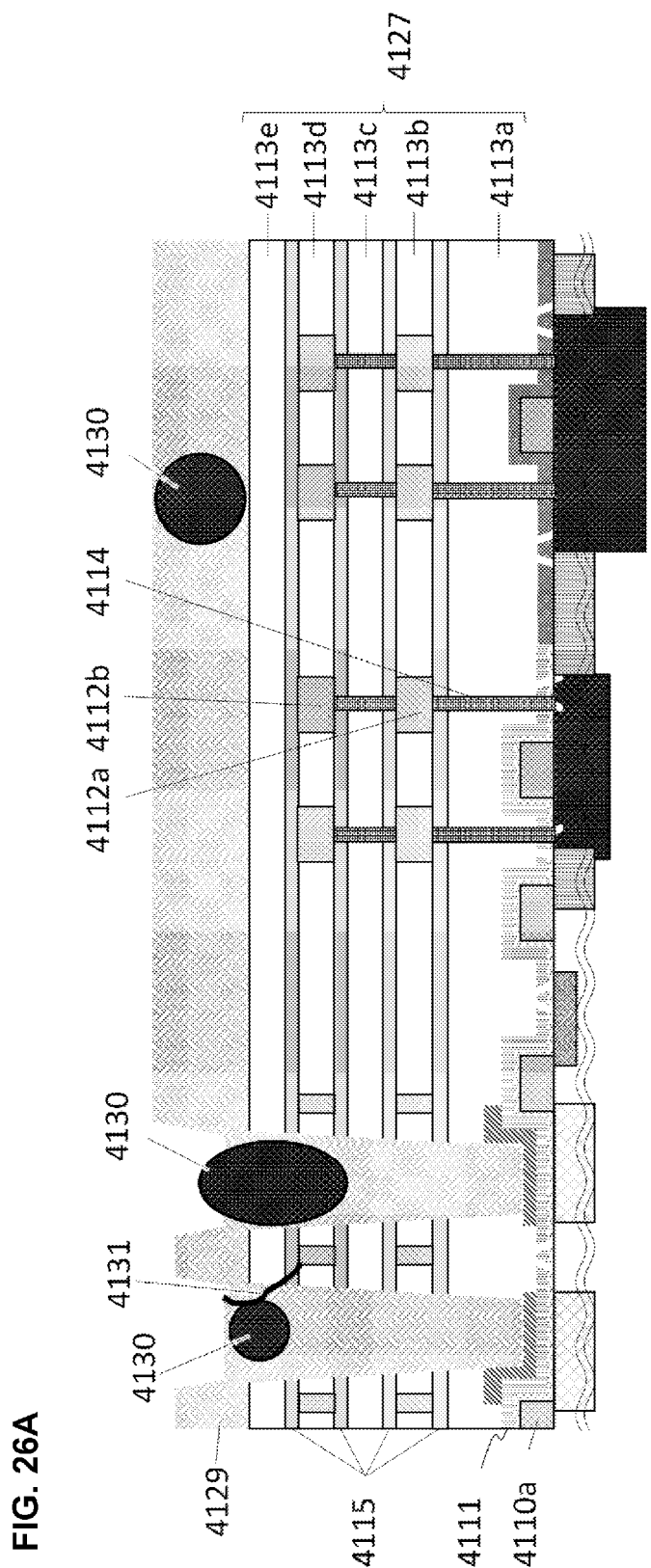
FIGS. 26A through 26D are diagrams for describing issues in a fifth embodiment.
Figure 26B:
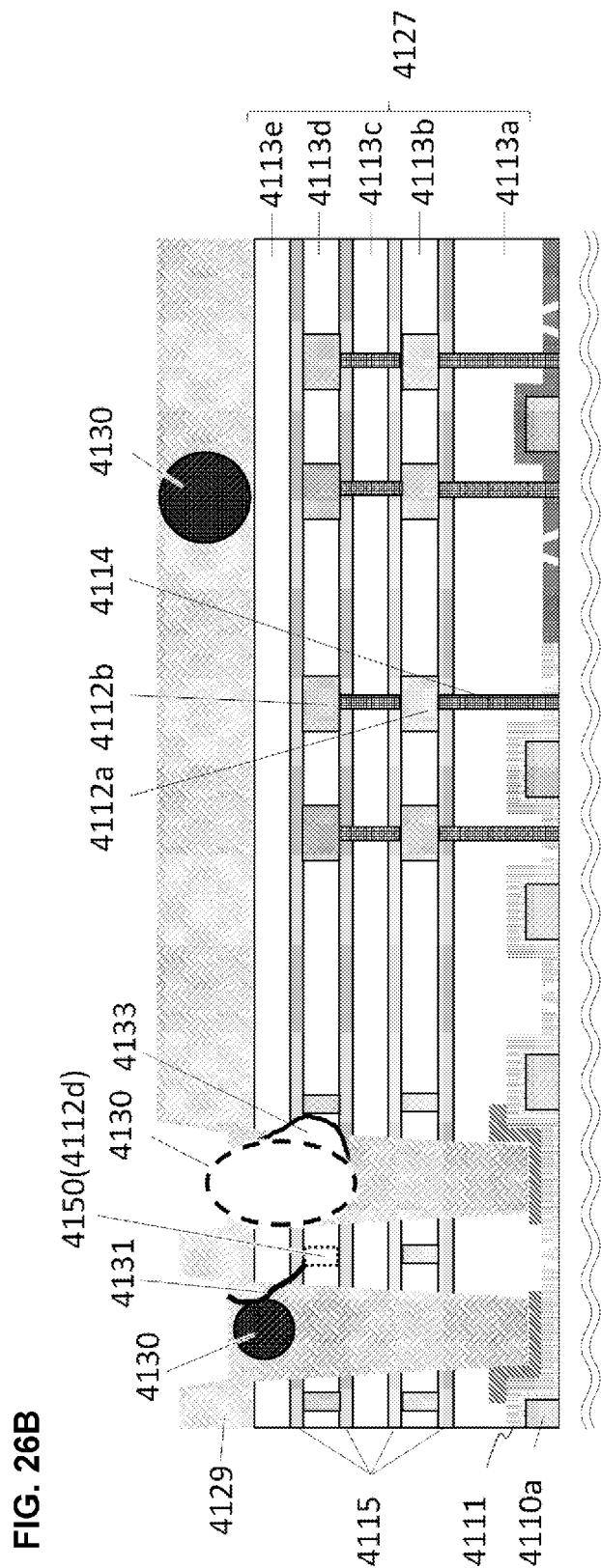

In a case where foreign matter has been incorporated into the dielectric material film 4129 during formation thereof, there are cases where stress changes due to effects of the incorporated foreign matter, and a crack is formed starting from the foreign matter, as described above. There is a possibility in some cases for the crack to reach wiring in a lower layer, and the wiring becoming exposed. FIG. 26A illustrates the dielectric material film 4129 containing foreign matter 4130. A crack 4131 is occurring starting at the foreign matter 4130. In a case where the wiring pattern 4112*d* is exposed by the crack 4131, a cleansing chemical solution will permeate through the crack 4131 and reach the wiring pattern 4112*d* at the time of cleansing processing described earlier. There is a possibility then that dissolution of the wiring pattern 4112*d* will occur and conduction defects or increased current density will occur. FIG. 26B illustrates a state where part of the wiring pattern 4112*d* has been lost by the cleansing processing. A dotted line region 4150 illustrates where the wiring pattern 4112*d* has been lost by the cleansing processing.

In a case where a crack occurs in the present example, there is a possibility that wiring will be exposed through the crack, but the exposed wiring surface is protected by coating the wiring with the corrosion inhibitor thereafter. Accordingly, even in a case where the cleansing chemical solution permeates through the crack and reaches the wiring in the cleansing processing, dissolution of the wiring can be suppressed.

Example 5-2

In the present example, coating the dielectric material film 4129 with the chemical solution containing the corrosion inhibitor is performed following the formation processing of the dielectric material film 4129 and cleansing processing, and prior to the planarization step of the dielectric material film 4129, illustrated in FIG. 24C. The chemical solution to be used is the same as in Example 5-1.

Figure 26C:
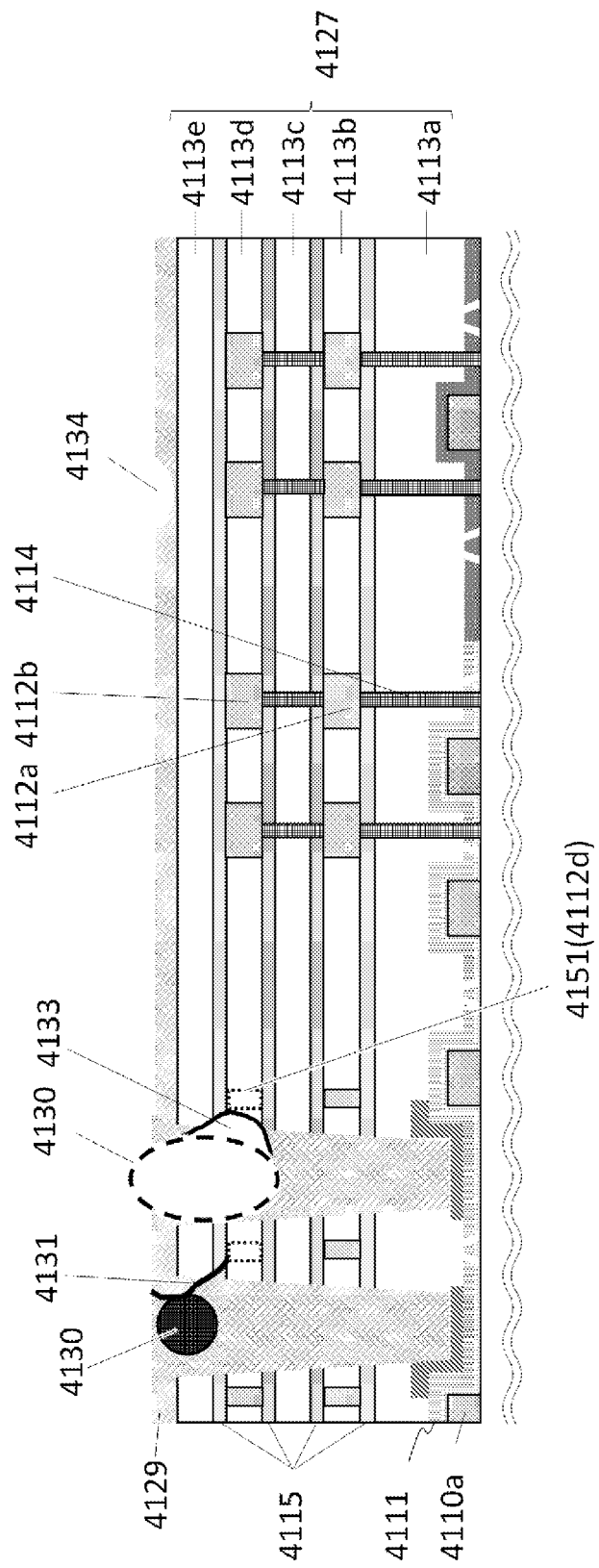

As described above, there are cases where foreign matter generated during formation of the dielectric material film 4129 remains incorporated in the dielectric material film 4129. There is a possibility that at the time of this foreign matter coming loose in the cleansing processing following formation of the film, the foreign matter will destroy the side wall of the waveguide as illustrated in FIG. 26B, and leave the metal wiring in the lower layer exposed. FIG. 26C illustrates a void 4133 created by the foreign matter 4130 coming loose. The void 4133 can also be understood to be a destruction mark created by the foreign matter 4130 destroying the side wall of the waveguide when coming loose.

In a case of performing planarization processing (e.g., CMP processing) in a state with the metal wiring exposed, there is a possibility that the chemical solution used at that time will reach the exposed metal wiring, resulting in dissolution of the metal wiring and conduction defects. FIG. 26C illustrates a state where part of the metal wiring pattern 4112*d* has been lost by planarization processing. A dotted line region 4151 indicates the wiring pattern 4112*d* that has been lost by this planarization processing.

In the present example, there is a possibility that metal wiring may become exposed by foreign matter coming loose, but the exposed metal wiring surface is protected by coating the metal wiring thereafter with the corrosion inhibitor. Accordingly, even in a case where the chemical solution permeates and reaches the wiring in the planarization processing, dissolution of the metal wiring can be suppressed.

Example 5-3

In the present example, coating the dielectric material film 4129 with the chemical solution containing the corrosion inhibitor is performed following removal processing in which the region of the dielectric member 4118 formed on the peripheral region 4104 is removed, and prior to the stripping processing to remove the residue, illustrated in FIG. 24E. The chemical solution to be used is the same as in Example 5-1.

As described above, there are cases where foreign matter generated during formation of the dielectric material film 4129 remains incorporated in the dielectric material film 4129. Performing planarization processing in a state where the foreign matter remains causes the foreign matter to come loose, which forms a recessed defect following planarization. FIG. 26C illustrates a recessed defect 4134 created in the dielectric material film 4129 in the peripheral region 4104.

Figure 26D:
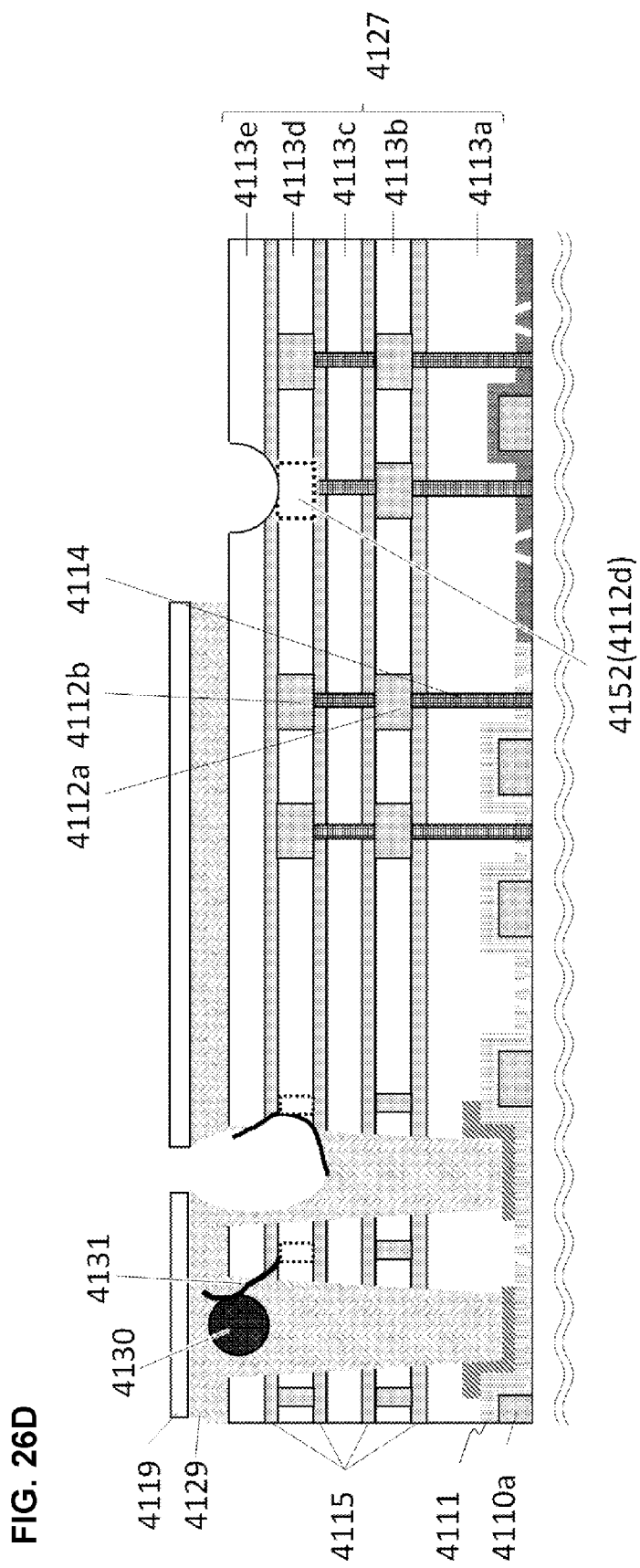

Thereafter, the low-refractive-index film 4119 is formed on the dielectric material film 4129, and removal of the dielectric member 4118 and the low-refractive-index film 4119 formed on the peripheral region 4104 is performed. Specifically, after a resist pattern is disposed in regions other than the peripheral region 4104 on the wafer, the dielectric member 4118 and the low-refractive-index film 4119 are removed by etching. The thickness of the dielectric material film 4129 is substantially thinner due to the recessed defect 4134. Accordingly, the etching advances to not only the dielectric material film 4129 and the low-refractive-index film 4119 at this portion, but further to the interlayer insulating film 4113e and the dispersion prevention film 4115 in lower layers, and there is a possibility that wiring patterns in lower layers will become exposed. Thereafter, peeling (removal) processing of the resist pattern is performed, and there is a possibility at this time that dissolution of the wiring pattern will occur due to the chemical solution used, and conduction defects will occur. FIG. 26D illustrates a state where part of the metal (e.g., copper) wiring pattern 4112d has been lost by the cleansing processing. A dotted line region 4152 indicates the wiring pattern 4112d that has been lost by this cleansing processing.

In the present example, there is a possibility that a wiring pattern (electroconductive layer) may become exposed by advancing etching, but the metal wiring is coated with the corrosion inhibitor thereafter, thereby protecting the exposed metal wiring surface. Accordingly, even in a case where the cleansing chemical solution comes into contact with the exposed surface of the metal wiring in subsequent peeling processing, dissolution of the metal wiring can be suppressed.

(Advantageous Effects)

Table 1 shows a compilation of dissolution defect counts of wiring for each of the above examples. The dissolution defect counts of metal wiring are obtained by extracting and calculating dissolution defects of metal wiring out of defective images detected by a bright-field inspection system (KLA2367) manufactured by KLA-Tencor. The dissolution defects of the metal wiring are calculated separately for those occurring in the image-capturing region 4103 and those occurring in the peripheral region 4104. Note that the reference example is a manufacturing method that does not have the corrosion inhibitor coating step.

TABLE 1

| | Count of metal wiring dissolution defects (per wafer) | |
|---|---|---|
| | Image-capturing region | Peripheral region |
| Reference example | 23 | 32 |
| Example 5-1 | 3 | 28 |
| Example 5-2 | 10 | 35 |
| Example 5-3 | 20 | 2 |

Measurement by the bright-field inspection system was performed under measurement conditions in which only defects of a relatively large size were extracted. Specifically, only defects having a size of at least 1 $\mu m^2$ in area as to a pixel size of 0.62 μm were extracted. It can be seen from Table 1 that the techniques in Examples 5-1 and 5-2 are effective in suppressing dissolution defects in metal wiring in the image-capturing region 4103, while Example 5-3 is effective in suppressing dissolution defects in metal wiring in the peripheral region 4104.

The above Examples 5-1, 5-2, 5-3 can be carried out combined as appropriate. Also, the present embodiment is applicable to manufacturing methods that differ from the manufacturing method according to the fourth embodiment (FIGS. 24A through 24H). The present embodiment can be carried out combined with other embodiments. Note that in the fourth and fifth embodiments, description has been made regarding an arrangement where a dielectric material is embedded in a hole to dispose a dielectric member in the hole, by way of an example of an image-capturing device, an electroconductive material may be embedded in a hole to dispose an electroconductive member in the hole. Japanese Patent Application Publication No. 2015-2193 discloses both of an arrangement of embedding a dielectric material in a hole and an arrangement of embedding an electroconductive material, and can be referenced.

Sixth Embodiment

The present embodiment relates to a manufacturing method of a semiconductor apparatus, and in particular relates to an exposure method and a reticle used in a photolithography step.

Manufacturing steps of a semiconductor device include a photolithography step of coating resist on the surface of a wafer by spin coating or the like, and transferring a desired pattern onto the resist using an exposing apparatus. A technique called "connecting exposure" is used with regard to photolithography here, in which an object region is split into a plurality of regions, and each region is exposed using a reticle of a pattern corresponding thereto.

In this connecting exposure, regions where exposure shots are connected (connecting regions) are generally scribe regions among chips. However, there is an issue in that scribe regions are overlaid to perform connecting exposure, and accordingly there is a limit in the layout of accessories in the scribe region. Also, the number of reticles and the number of exposure shots increases when performing connecting exposure, and accordingly there is an issue of lower throughput of the exposing apparatus.

(Overview)

The present embodiment relates to a manufacturing method for a semiconductor device, in which a plurality of chips are manufactured from a wafer. The manufacturing method according to the present embodiment includes an exposing step of exposing photoresist on a wafer, and a developing step of developing the photoresist. Connecting exposure is used in at least part of the exposing step.

In the present embodiment, at least one reticle pattern used in connecting exposure has patterns including partial patterns of two adjacent chips, and scribe region patterns of chip boundaries. These patterns are used in the present embodiment to expose two chips at the same time. That is to say, a first partial pattern of a first chip, a second partial pattern of a second chip and a scribe region pattern of the region between the two chips, are exposed on the photoresist by one exposure shot (first exposure shot). In other words, at least part of a chip boundary (scribe region) parallel to at least one direction is formed by a single-time exposure in the present embodiment, and not by connecting exposure. Also, a third partial pattern is exposed on the photoresist at another region of the chip, by a separate exposure shot (second exposure shot) that is at least one time.

Exposing patterns on the photoresist using such reticle patterns enables the number of reticles and the number of exposure shots to be suppressed, and throughput of the exposing apparatus can be improved. Also, advantages of improved freedom in accessory layout to the scribe region are also obtained.

Example 6-1

FIG. 27A illustrates a wafer that is to be exposed in the present example, and an enlarged view of the middle portion of the wafer. A wafer 6007 is a wafer of silicon or the like, and a plurality of chips 6008 are included in the wafer 6007. A region including a chip boundary 6004 that is the outermost periphery of each chip is a scribe region 6002, to which a blade is applied when dicing the wafer into individual chips. The inner side of the scribe region 6002 is an active region 6005, and elements, wiring layers, and so forth, that make up the semiconductor device, are fabricated in this portion. A connecting region 6003 is a region where adjacent shots are exposed overlaid. Overlaying of shots is performed so that there are no regions created which cannot be exposed due to alignment deviation and so forth at the end portions of the shots. An accessory 6006 is an alignment mark to serve as an overlay reference when exposing, or a measurement mark for alignment, line width, and so forth, for process management of the quality of the manufactured semiconductor device. A shot 6001 is a region exposed by one exposure by the exposing apparatus. The scribe region 6002 is arranged within the shot 6001, and the end of the shot is within the active region 6005 of the chip.

FIG. 27B illustrates an example of a reticle pattern used in an exposure method according to a reference example, and FIG. 27C illustrates an example of a reticle pattern used in the exposure method according to the present example. In FIGS. 27B and 27C, the upper illustrations depict layouts of resist patterns formed on the wafers 6007 through an exposure step and a developing step, and the lower illustrations depict layouts of reticles fabricated for forming the patterns on the wafers 6007.

In the exposure method according to the reference example illustrated in FIG. 27B, a single reticle pattern 6101 is used. The reticle pattern 6101 includes the circuit pattern of the entire active region 6005 of one chip, and the pattern of the surrounding scribe region 6002. The circuit pattern of the active region 6005 of one chip is exposed by one shot, and the shots are overlaid at the scribe region 6002 of the chip boundaries.

A single reticle pattern 6102 is used in the exposure method according to the present example illustrated in FIG. 27C. This arrangement differs from the reference example with regard to the point that the reticle pattern 6102 includes a partial pattern 6102R that corresponds to a right-side region 6005R of a left-side chip, a partial pattern 6102L that corresponds to a left-side region 6005L of a right-side chip, and the scribe region 6002 therebetween. That is to say, the reticle pattern 6102 includes a partial pattern (first partial pattern) included in a right-side region (first region) of a left-side chip (first chip), and a partial pattern (second partial pattern) included in a left-side region (second region) of a right-side chip (second chip). The reticle pattern 6102 also includes the scribe region pattern of the chip boundary.

In the present example, partial patterns are exposed at the same time in photoresist of partial regions of two chips, across the scribe region 6002, in a single exposure shot (first exposure shot). That is to say, the partial pattern of the right-side region of the first chip (first partial pattern), the partial pattern of the left-side region of the second chip (second partial pattern), and the scribe region pattern therebetween, are exposed at the same time on the photoresist in the first exposure shot. Following the first exposure shot, a second exposure shot is further performed using the same reticle. Here, a partial pattern included in a right-side region of the second chip (third partial pattern), a partial pattern included in a left-side region of a third chip (a chip further to the right side of the second chip) (fourth partial pattern), and the scribe region pattern between the two chips, are exposed at the same time. The pattern for one chip is thus formed by connecting exposure of the reticle pattern 6102 in the present example. Specifically, connecting is performed at the middle of the active region 6005, and exposing of the entire active region 6005 of one chip is performed by two shots. Also, although the pattern of the scribe region parallel to the X direction is formed by connecting exposure in the present embodiment, the pattern of the scribe region parallel to the Y direction (excluding the portions of the four corners of the chip) is formed by a single exposure, and not by connecting exposure.

The accessories 6006 within the reticle pattern do not contribute to the performance of the semiconductor device itself, and accordingly are generally arranged in the scribe region 6002 that is outside of the active region. At this time, if an accessory is arranged only in one of the reticle patterns to be exposed overlaid in the reference example, the accessory cannot be arranged at a position corresponding to that of the adjacent reticle pattern, creating limitations on arrangement. Conversely, there are no limitations in arrangement in the present example, and accessories can be arranged for large-area patterns and patterns with complicated shapes, with few limitations, for example. The degree of freedom regarding the shapes of the accessories themselves is also improved, and accordingly further optimized accessory patterns can be arranged and used, and process management such as alignment, measurement, and so forth, can be performed appropriately in manufacturing of the semiconductor device.

Example 6-2

Although only shots including chip boundary portions within the patterns are exposed in Example 6-1, the present embodiment is not limited to this. FIG. 28A illustrates a method in which an exposure shot where a chip boundary portion is not arranged within the pattern is added. In the lateral direction in FIG. 28A, the scribe region 6002 is arranged within the shot 6001 in the same way as in Example 6-1, and the end of the shot is within the active region 6005 of the chip. Conversely, in a shot 6010 where the chip boundary portion is not arranged within the pattern, the scribe region is only arranged at the end portion of the shot (top and bottom ends), and is not arranged within the shot.

FIG. 28B illustrates an example of a reticle pattern of an exposure method according to a reference example. In the reference example, a reticle is used that has the three patterns of a reticle pattern 6201L corresponding to the left-end region of the chip, a reticle pattern 6201C corresponding to the middle region of the chip, and a reticle pattern 6201R corresponding to the right-end region of the chip. The reticle patterns 6201L and 6201R at both ends also include scribe region patterns. In the reference example, these three patterns are used to form the pattern of one chip by performing exposure three times.

FIG. 28C illustrates an example of a reticle pattern according to the exposure method of the present example. In the present example, a reticle having two reticle patterns of a pattern 6202RL corresponding to the right-end region, the left-end region, and the scribe region, and a pattern 6202C corresponding to the middle region of the chip, is used. Although the pattern 6202RL includes a scribe region pattern parallel to the Y direction, the pattern 6202C does not include a scribe region pattern parallel to the Y direction.

In the present example, partial patterns are exposed at the same time in photoresist of the right-end region and the left-end region of two chips across the chip boundary, by a single exposure shot (first exposure shot) using the pattern 6202RL. That is to say, a partial pattern of the right-end region of the left-side chip (first partial pattern) and a partial pattern of the left-end region of the right-side chip (second partial pattern) are exposed in photoresist at the same time by the first exposure shot. The scribe region pattern therebetween is also exposed at the same time by the first exposure shot.

Following the first exposure shot using the pattern 6202RL, a separate exposure shot using another pattern 6202C (third exposure shot) is performed. In the third exposure shot, a partial pattern (fifth partial pattern) included in the middle region of the right-side chip (second chip) is exposed on the resist.

Thereafter, an exposure shot using the same pattern 6202RL as the first exposure shot (second exposure shot) is performed. Here, a partial pattern included in the right-end region of the right-side chip (third partial pattern), and further, a partial pattern included in the left-end region of the right-side chip (third chip) (fourth partial pattern), and the scribe region pattern between the two chips, are exposed at the same time.

Thus, patterns corresponding to the chips within the wafer are formed by connecting exposure shots using the pattern 6202RL and exposure shots using the pattern 6202C.

According to the reference example, three exposure shots are necessary per chip, while only two exposure shots on average per chip are necessary in the present example, and accordingly the number of total shots can be reduced. Also, the time of switching reticles in the apparatus performing the exposure is reduced, whereby the throughput of the exposing apparatus can be improved.

In the present embodiment, description has been made that the third exposure shot using the pattern 6202C is performed only once per chip, but the third exposure shot may be performed a plurality of times to connect the partial patterns.

Example 6-3

Figure 29:
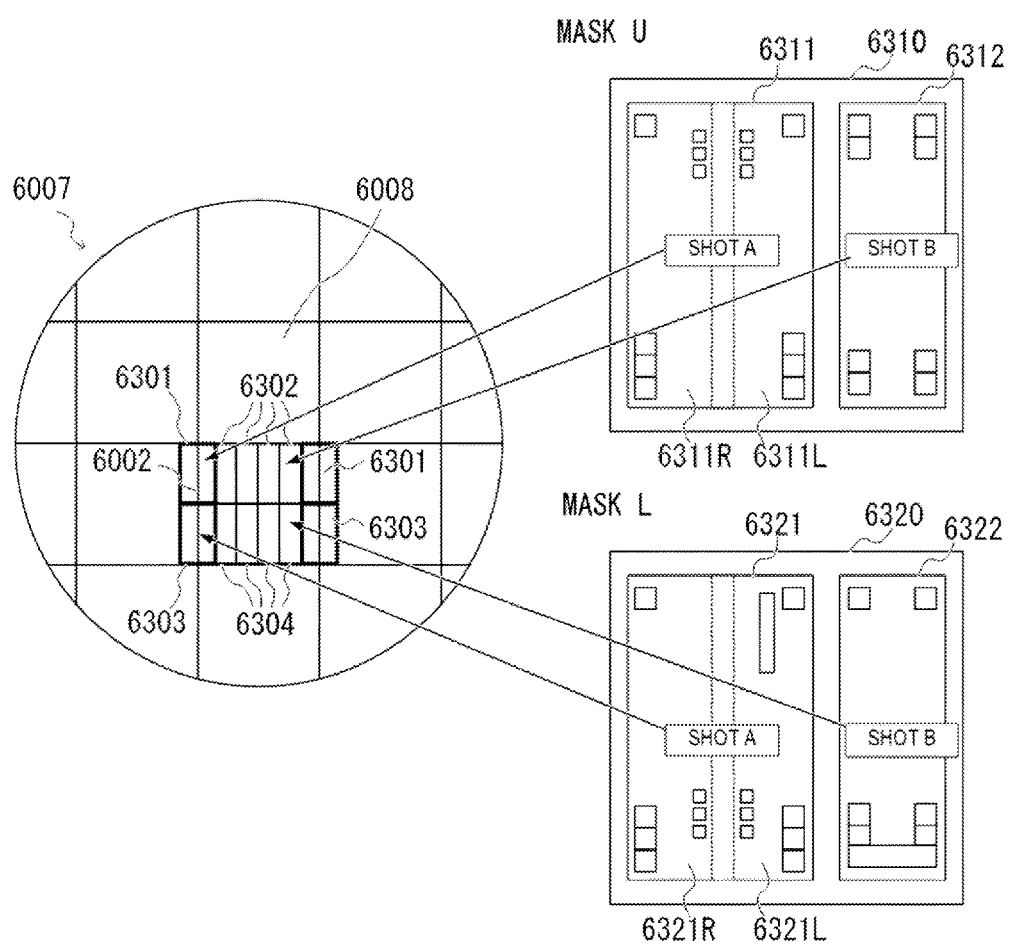
FIG. 29 is a diagram illustrating exposure shots and reticle patterns according to the sixth embodiment.

FIG. 29 is a diagram for describing an exposure pattern according to the present example. The chips 6008 on the wafer 6007 are exposed by a plurality of shots 6301, 6302, 6303, and 6304, whereby patterns are formed. The shots 6301 and 6302 expose an upper side U of the chip 6008, and the shots 6303 and 6304 expose a lower side L of the chip 6008. The scribe regions 6002 are arranged within the shots 6301 and 6303 in the same way as in Example 6-2, and the left end L and right end R of chips adjacent to the left and right are exposed at the same time. Also, the shots 6302 and 6304 do not include chip boundary portions within the patterns (except for pattern perimeter portions). The scribe regions of the shots 6302 and 6304 are only arranged at the end portions of the shots (upper end of the pattern 6102 formed by the exposure shot and lower end of the pattern 6202 formed by the exposure shot), and are not arranged within the shots.

The upper side U of the chip is exposed using a reticle 6310. The reticle 6310 has a reticle pattern 6311 corresponding to the shot 6301, and a reticle pattern 6312 corresponding to the shot 6302. The pattern 6311 includes a circuit pattern 6311R of the right-end region of the chip, a circuit pattern 6311L of the left-end region of the chip, and a scribe region pattern therebetween. A scribe region pattern parallel to the Y direction is included within the reticle pattern 6311, but no scribe region pattern parallel to the Y direction is included within the reticle pattern 6312.

In the same way, the lower side L of the chip is exposed using a reticle 6320. The reticle 6320 has a reticle pattern 6321 corresponding to the shot 6303, and a reticle pattern 6322 corresponding to the shot 6304. The pattern 6321 includes a circuit pattern 6321R of the right-end region of the chip, a circuit pattern 6321L of the left-end region of the chip, and a scribe region pattern therebetween. A scribe region pattern parallel to the Y direction is included within the reticle pattern 6321, but no scribe region pattern parallel to the Y direction is included within the reticle pattern 6322.

Note that in the present embodiment, the pattern of the scribe region parallel to the Y direction is formed by connecting exposure (a plurality of times of exposure) at portions where the exposure shots 6301 and 6303 are overlaid, but is formed by a single exposure at other portions.

Looking at the upper side U of the chip, the exposure step includes the following three exposure shots. The first exposure shot is exposure of the first chip and the second chip at the same time, using the pattern 6311 of the reticle 6310. The second exposure shot is exposure of the second chip and the third chip at the same time, using the same pattern 6311. The third exposure shot is exposure of a partial pattern (fifth partial pattern) included in the middle region of the second chip, using the reticle pattern 6312. The third exposure shot is performed a plurality of times, four times in the example in FIG. 29.

Looking at the lower side L of the chip, the exposure step includes three exposure shots, in the same way. That is to say, these are an exposure shot of the first chip and the second chip using the pattern 6321 of the reticle 6320, an exposure shot of the second chip and the third chip using the same pattern 6321, and an exposure shot of the second chip using the pattern 6322. In these exposure shots (fourth exposure shot), a partial pattern exposed on the second chip (sixth partial pattern) is arrayed in the Y direction with the partial pattern of the upper side U of the chip. For example, the pattern exposed by the circuit pattern 6321L of the reticle pattern 6321 is arrayed in the Y direction with the pattern exposed by the circuit pattern 6311L of the reticle pattern 6311 (second partial pattern). Also, the pattern exposed by the circuit pattern 6321R of the reticle pattern 6321 is arrayed in the Y direction with the pattern exposed by the circuit pattern 6311R of the reticle pattern 6311 (third partial pattern). Also, the pattern exposed by the reticle pattern 6322 is arrayed in the Y direction with the pattern exposed by the reticle pattern 6312 (fifth partial pattern).

According to the present example as well, advantages of reduced number of total shots and improved throughput of the exposing apparatus due to reduced reticle switching time are obtained.

Other Examples

Although three examples have been described above, the arrangement of reticle patterns is not limited to these. In the above examples, chip region boundaries are each arranged within the patterns only regarding the lateral direction in the figures. However, the chip region boundaries may be arranged within the patterns in both the up-down and lateral directions.

The shape of the chips is not limited to rectangular either, as long as exposure is carried out according to the above-described method, and may have a parallelogram shape, for example. Also, in Examples 6-2 and 6-3, the shot C that does not have chip boundary portions arranged within the pattern is not limited to being the only such shot, nor to being exposed at one time, and an arrangement may be made where a plurality of patterns are exposed.

Other Embodiments

Although the present invention has been exemplified above using preferred embodiments of the present invention, the present is not to be interpreted limited to the embodiments. It should be understood that the scope of the present invention should only be interpreted from the Claims. It will be appreciated from the specific preferred embodiments of the present invention that one skilled in the art will be able to carry out an equivalent scope on the basis of the description of the present invention and common technical knowledge.

Semiconductor devices to which the above-described embodiments can be applied are not limited to photoelectric converting devices and image-capturing devices. For example, semiconductor devices to which the above-described embodiments can be applied are display devices having organic electroluminescent (EL) elements or liquid crystal elements, storage devices having dynamic RAM (DRAM) or flash memory cells, processing devices (computing devices) such as CPUs, GPUs, and so forth, and control devices such as ASICs and so forth. Also, devices to which semiconductor devices according to the above-described embodiments can be applied is not limited to image-capturing devices such as cameras and the like. Examples of devices to which such semiconductor devices can be applied include display devices such as television sets and so forth, electronic devices such as mobile terminals and so forth, medical equipment such as endoscopes, computed tomography (CT) equipment, and so forth, office equipment such as printers, scanners, photocopiers, and so forth, industrial equipment such as robots, and manufacturing devices, inspection devices, and so forth, and transportation equipment such as vehicles, ships, aircrafts, and so forth. Equipment including semiconductor devices may also include peripheral devices connected to the semiconductor devices, in addition to the semiconductor devices. There are various peripheral devices, such as photoelectric converting devices, image-capturing devices, display devices, storage devices, processing devices (computing devices), control devices, and so forth.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-238518, filed on Dec. 27, 2019, which is hereby incorporated by reference herein in its entirety.

What is claimed is:

1. An inspection apparatus inspecting a wafer on which a plurality of patterns are formed by a plurality of exposure shots, the inspection apparatus comprising:
   an acquisition unit configured to acquire first information representing a positional relation between an inspection mark included in a pattern formed by a first exposure shot and an inspection mark included in a pattern formed by a second exposure shot, and second information representing a positional relation between the inspection mark included in the pattern formed by the second exposure shot and an inspection mark included in a pattern formed by a third exposure shot; and
   a derivation unit configured to derive a linear component of an error caused by at least one of a first reticle and a second reticle, and a linear component of an error caused by a position of a wafer, on the basis of the first information and the second information,
   wherein the first reticle is used in the first exposure shot and the third exposure shot, and
   wherein the second reticle is used in the second exposure shot.

2. The inspection apparatus according to claim 1, wherein the third exposure shot is performed after the first exposure shot, and the second exposure shot is performed after the third exposure shot.

3. The inspection apparatus according to claim 1, wherein the derivation unit is configured to derive the linear component of an error caused by the at least one of a first reticle and a second reticle, and the linear component of an error caused by the position of the wafer by regression analysis using a method for least squares.

4. The inspection apparatus according to claim 1, wherein the derivation unit is configured to derive the linear component of an error caused by the at least one of a first reticle and a second reticle, and the linear component of an error caused by the position of the wafer using a trained model by machine learning.

5. The inspection apparatus according to claim 1, wherein the derivation unit is configured to:

tentatively derive the linear component of an error caused by the at least one of the first reticle and the second reticle on the basis of the first information and the second information;

derive the linear component of an error caused by the position of the wafer on the basis of a value obtained by subtracting a value, which corresponds to the tentatively-derived linear component, from a value which corresponds to the first information and the second information; and derive the linear component of an error caused by the at least one of the first reticle and the second reticle on the basis of a value obtained by subtracting a value, which corresponds to the linear component of an error caused by the wafer, from a value which corresponds to the first information and the second information.

6. An inspection apparatus inspecting a wafer on which a plurality of patterns are formed by a plurality of exposure shots, the inspection apparatus comprising:

an acquisition unit configured to acquire first information representing a positional relation between an inspection mark included in a pattern formed by a first exposure shot and an inspection mark included in a pattern formed by a second exposure shot, and second information representing a positional relation between the inspection mark included in the pattern formed by the second exposure shot and an inspection mark included in a pattern formed by a third exposure shot; and a derivation unit configured to derive a linear component of an error caused by a reticle, and a linear component of an error caused by a position of a wafer, on the basis of the first information and the second information, wherein the derivation unit is configured to:

tentatively derive the linear component of an error caused by the reticle on the basis of the first information and the second information;

derive the linear component of an error caused by the position of the wafer on the basis of a value obtained by subtracting a value, which corresponds to the tentatively-derived linear component, from a value which corresponds to the first information and the second information; and derive the linear component of an error caused by the reticle on the basis of a value obtained by subtracting a value, which corresponds to the linear component of an error caused by the wafer, from a value which corresponds to the first information and the second information.

7. The inspection apparatus according to claim 6, wherein the third exposure shot is performed after the first exposure shot, and the second exposure shot is performed after the third exposure shot.

8. The inspection apparatus according to claim 6, wherein a first reticle is used in the first exposure shot and the third exposure shot, and a second reticle is used in the second exposure shot.

9. The inspection apparatus according to claim 6, wherein the derivation unit is configured to derive the linear component of an error caused by the reticle, and the linear component of an error caused by the position of the wafer by regression analysis using a method for least squares.

10. The inspection apparatus according to claim 6, wherein the derivation unit is configured to derive the linear component of an error caused by the reticle, and the linear component of an error caused by the position of the wafer using a trained model by machine learning.

* * * * *